US009664342B2

(12) United States Patent
Kaiser et al.

(10) Patent No.: US 9,664,342 B2
(45) Date of Patent: May 30, 2017

(54) OPTOELECTRONIC COMPONENT DEVICE, METHOD OF PRODUCING AN OPTOELECTRONIC COMPONENT DEVICE, AND METHOD OF OPERATING AN OPTOELECTRONIC COMPONENT DEVICE, METHOD OF OPERATING AN OPTOELECTRONIC DEVICE HAVING IMPROVED EMISSION CHARACTERISTICS

(71) Applicant: OSRAM Opto Semiconductors GmbH, Regensburg (DE)

(72) Inventors: Stephan Kaiser, Regensburg (DE); Tony Albrecht, Bad Abbach (DE); Michael Bestele, Lappersdorf (DE); Jan Marfeld, Regensburg (DE); Albert Schneider, Thalmassing (DE); Markus Kirsch, Brunn (DE)

(73) Assignee: OSRAM Opto Semiconductors GmbH (DE)

( * ) Notice: Subject to any disclaimer, the term of this patent is extended or adjusted under 35 U.S.C. 154(b) by 49 days.

(21) Appl. No.: 14/432,007

(22) PCT Filed: Sep. 24, 2013

(86) PCT No.: PCT/EP2013/069783
§ 371 (c)(1),
(2) Date: Mar. 27, 2015

(87) PCT Pub. No.: WO2014/048896
PCT Pub. Date: Apr. 3, 2014

(65) Prior Publication Data
US 2015/0233534 A1 Aug. 20, 2015

(30) Foreign Application Priority Data
Sep. 27, 2012 (DE) .................. 10 2012 109 131

(51) Int. Cl.
*H01L 31/0232* (2014.01)
*F21K 99/00* (2016.01)
(Continued)

(52) U.S. Cl.
CPC .................. *F21K 9/50* (2013.01); *F21K 9/56* (2013.01); *F21V 7/0066* (2013.01); *F21V 14/04* (2013.01);
(Continued)

(58) Field of Classification Search
CPC ......... H01L 33/60; H01L 25/10; H01L 25/13; H01L 51/5271; H01L 31/0232;
(Continued)

(56) References Cited

U.S. PATENT DOCUMENTS 5,946,083 A * 8/1999 Melendez ............ G01N 21/553
356/317
6,798,521 B2 * 9/2004 Elkind ................. G01N 21/553
356/445
(Continued)

FOREIGN PATENT DOCUMENTS

DE 20 2005 002 787 6/2005
DE 10 2006 019 240 10/2007
(Continued)

OTHER PUBLICATIONS

Office Action dated Jan. 9, 2013, from the corresponding DE Application No. 10 2012 109 131.5.

*Primary Examiner* — Que T Le
(74) *Attorney, Agent, or Firm* — DLA Piper LLP (US)

(57) ABSTRACT

An optoelectronic component device includes a plurality of optoelectronic components that provide and/or absorb electromagnetic radiation; a reflector arranged in a beam path of the electromagnetic radiation of the plurality of optoelectronic components and which has a surface that is at least (Continued)

partly reflective with respect to the provided electromagnetic radiation; wherein the plurality of optoelectronic components at least partly surround the reflector or are at least partly surrounded by the reflector; and the reflector reflects a provided electromagnetic radiation such that a predefined field distribution of the reflected electromagnetic radiation is formed in the image plane of the optoelectronic component device.

17 Claims, 42 Drawing Sheets

(51) Int. Cl.
*G01J 1/04* (2006.01)
*G01J 1/42* (2006.01)
*H01L 25/13* (2006.01)
*H01L 25/10* (2006.01)
*F21V 7/00* (2006.01)
*F21V 14/04* (2006.01)
*F21Y 105/00* (2016.01)

(52) U.S. Cl.
CPC ............... *G01J 1/0414* (2013.01); *G01J 1/42* (2013.01); *G01J 1/4228* (2013.01); *H01L 25/10* (2013.01); *H01L 25/13* (2013.01); *F21Y 2105/001* (2013.01)

(58) Field of Classification Search
CPC . H01L 21/563; H01L 33/486; H01L 25/0753; H01L 33/58; H01L 25/167; F21V 7/0066; F21V 7/04; F21K 9/50; G01J 1/42
USPC ..... 250/551, 239, 216, 208.1; 356/445, 446, 356/318, 317
See application file for complete search history.

(56) References Cited

U.S. PATENT DOCUMENTS

2007/0171676 A1 7/2007 Chang
2008/0136337 A1 6/2008 Rogojevic et al.

FOREIGN PATENT DOCUMENTS

| DE | 20 2011 003 261 | 4/2011 |
| DE | 10 2010 046 255 | 3/2012 |
| EP | 1 826 474 | 8/2007 |
| EP | 2 375 133 | 10/2011 |
| EP | 2 481 971 | 8/2012 |
| EP | 2 492 585 | 8/2012 |

\* cited by examiner

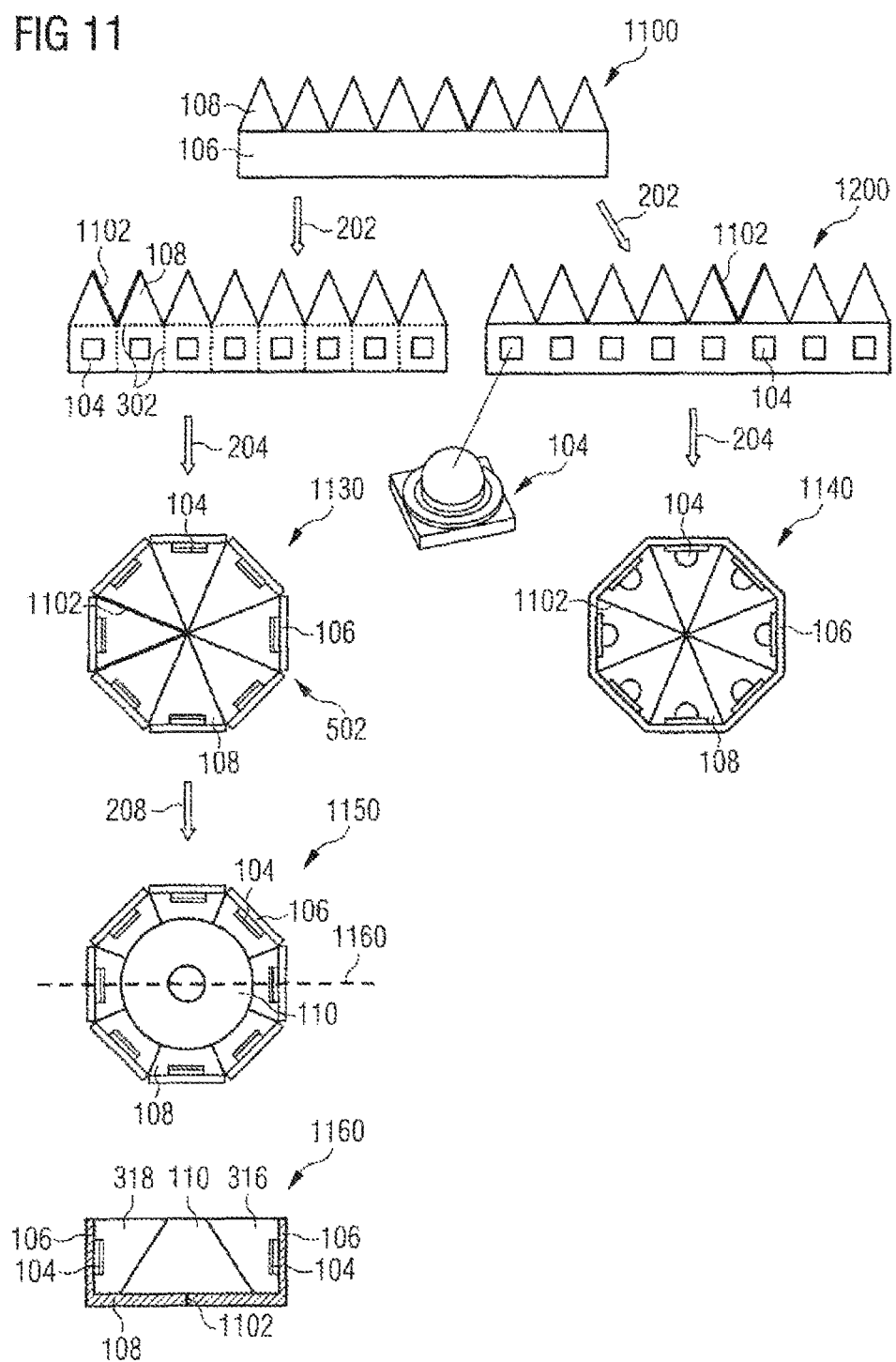

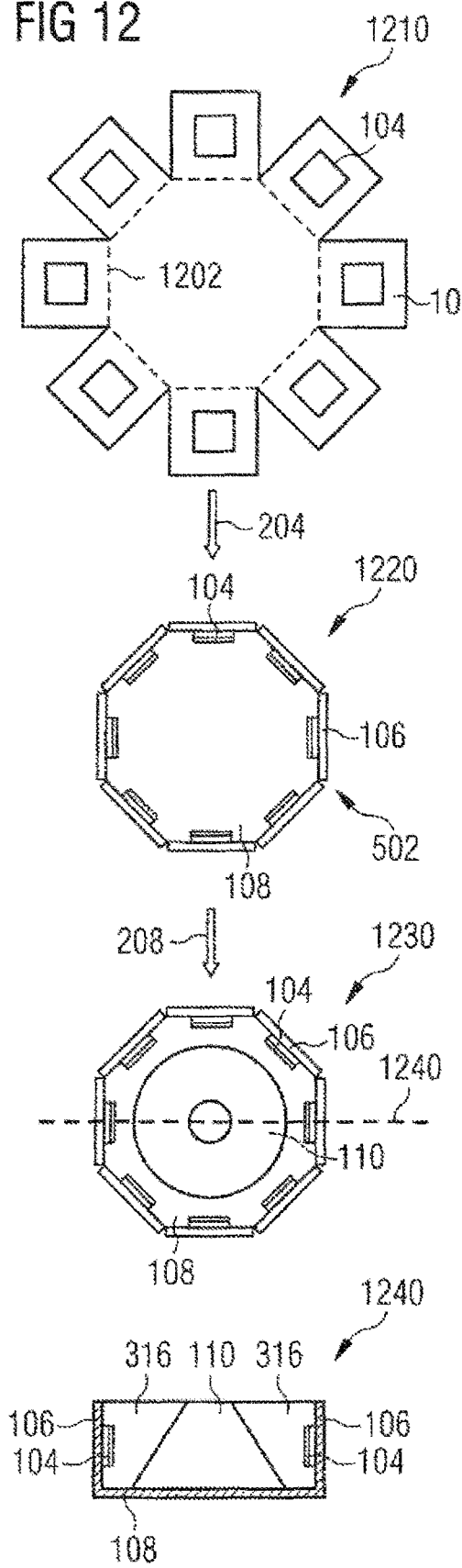

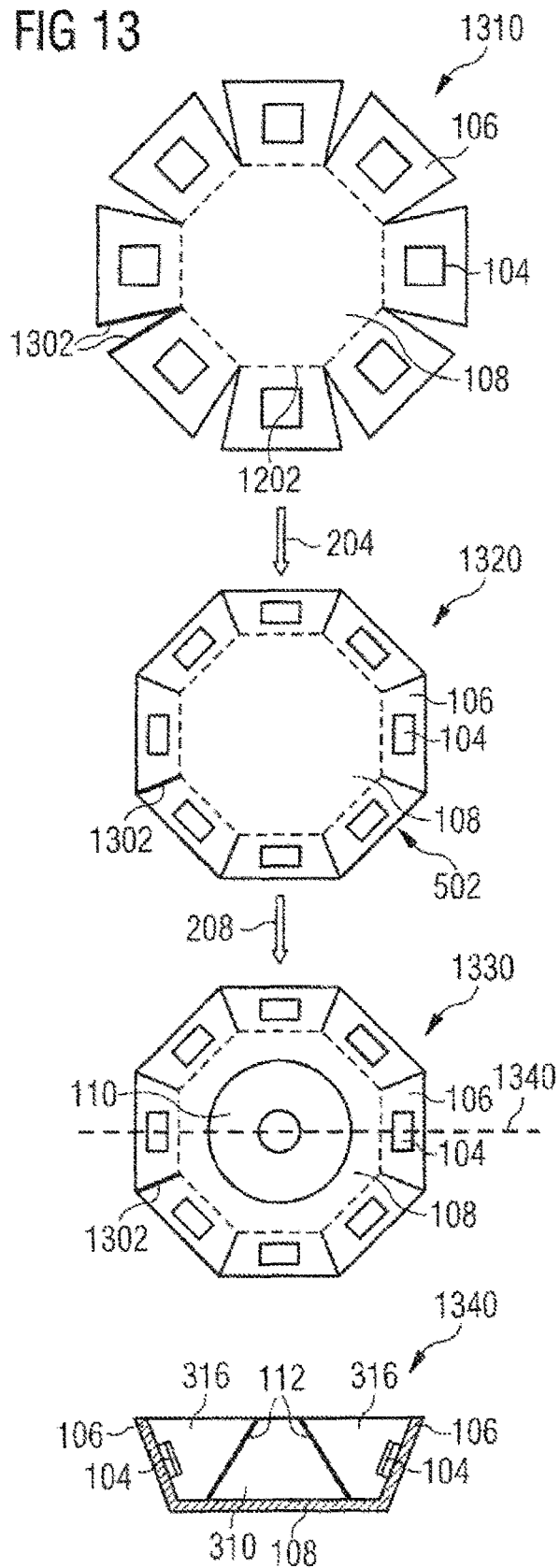

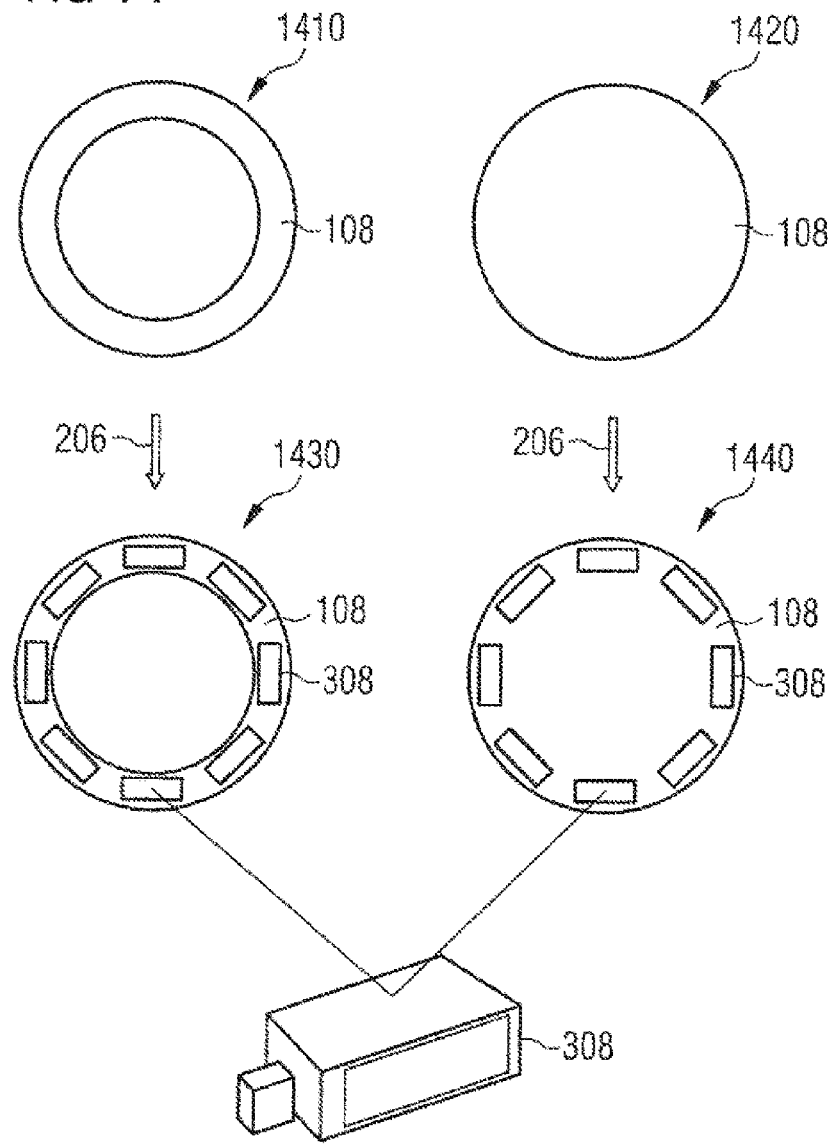

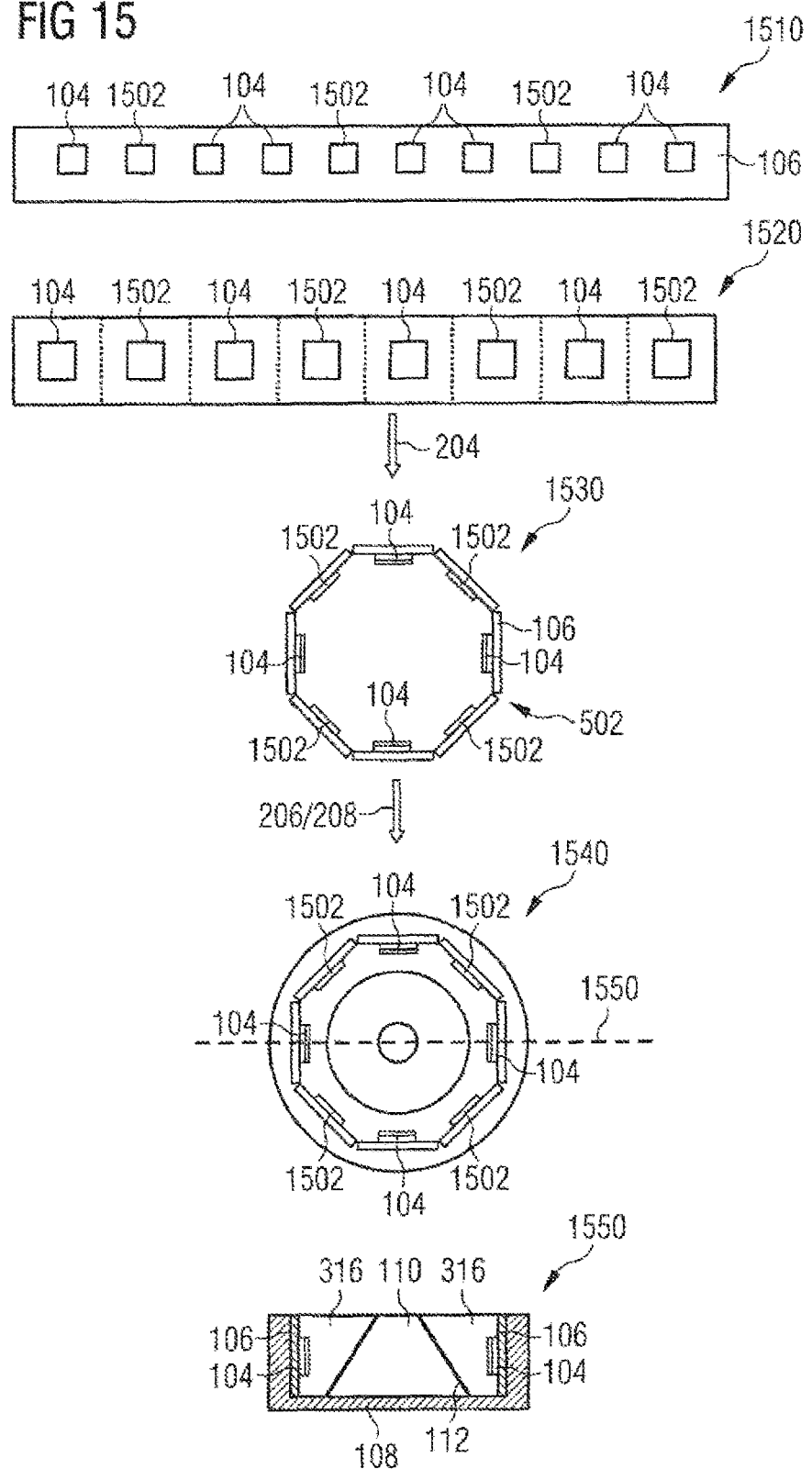

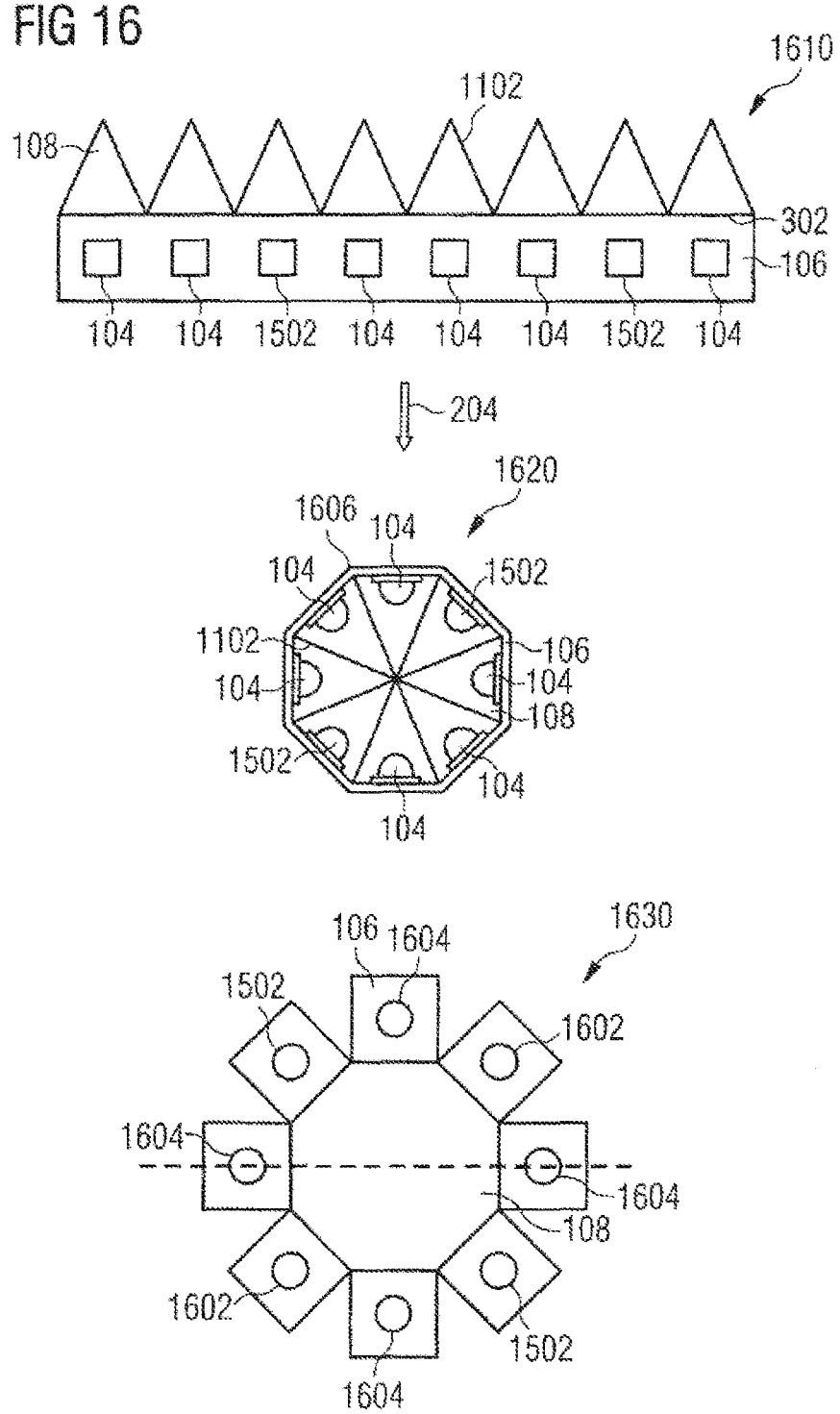

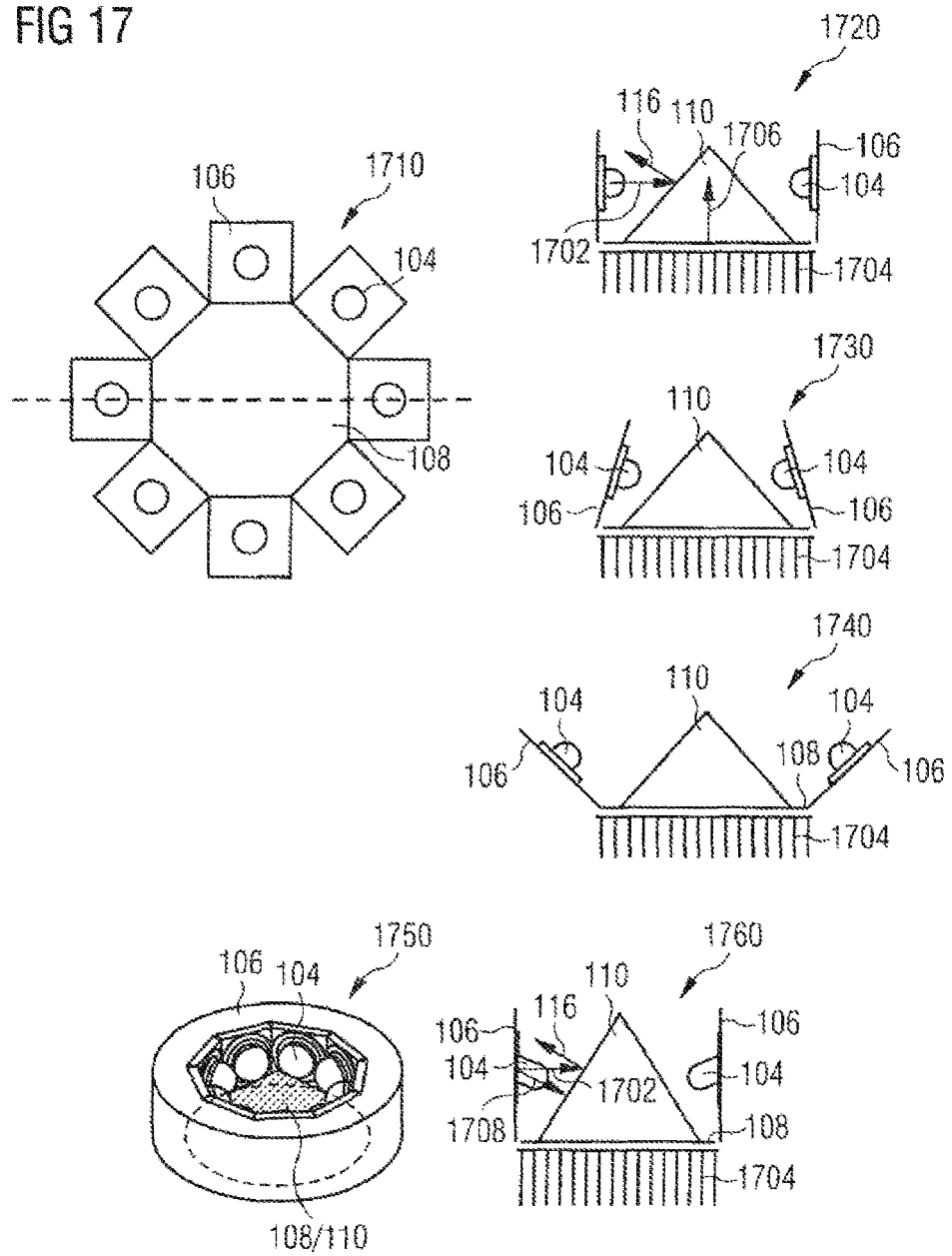

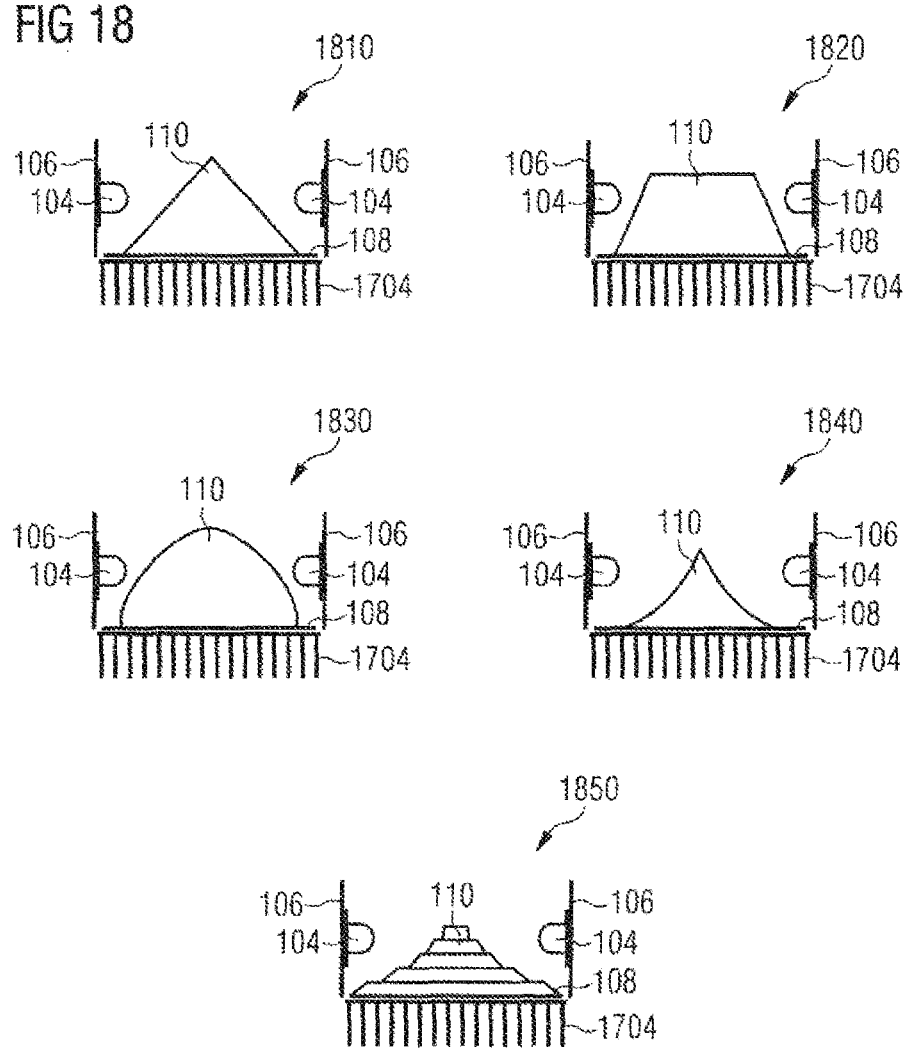

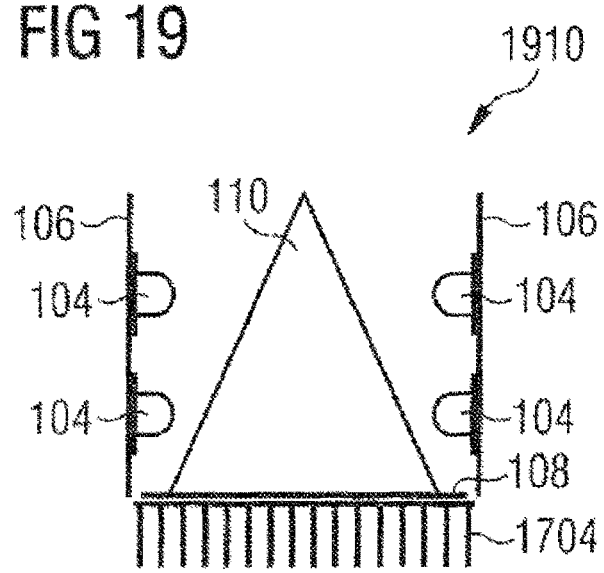
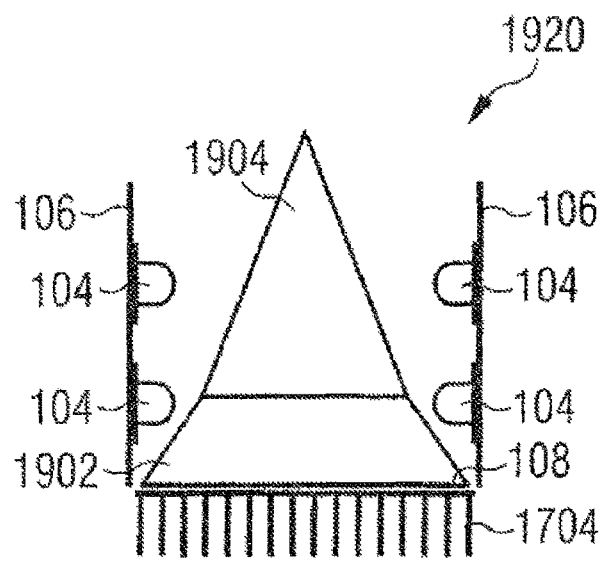

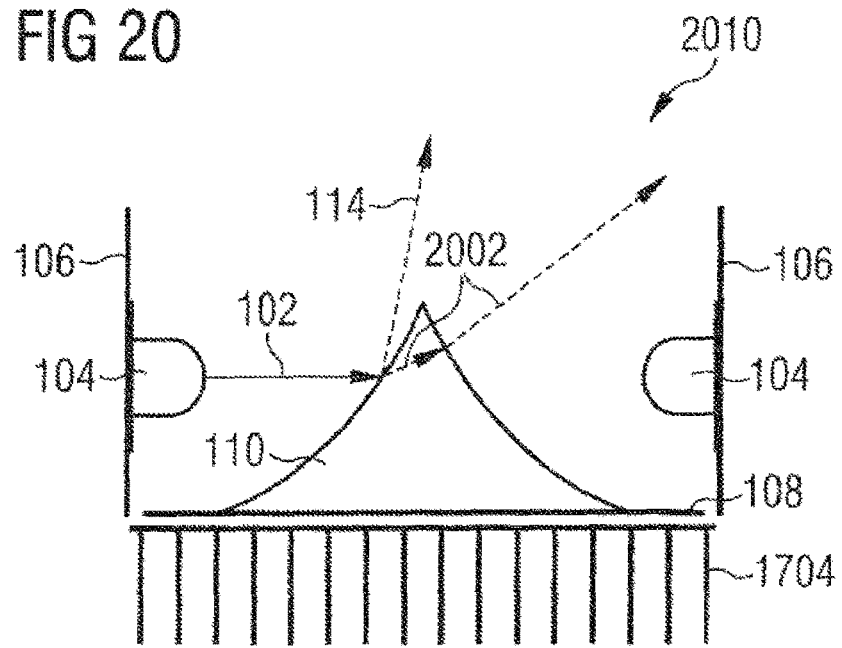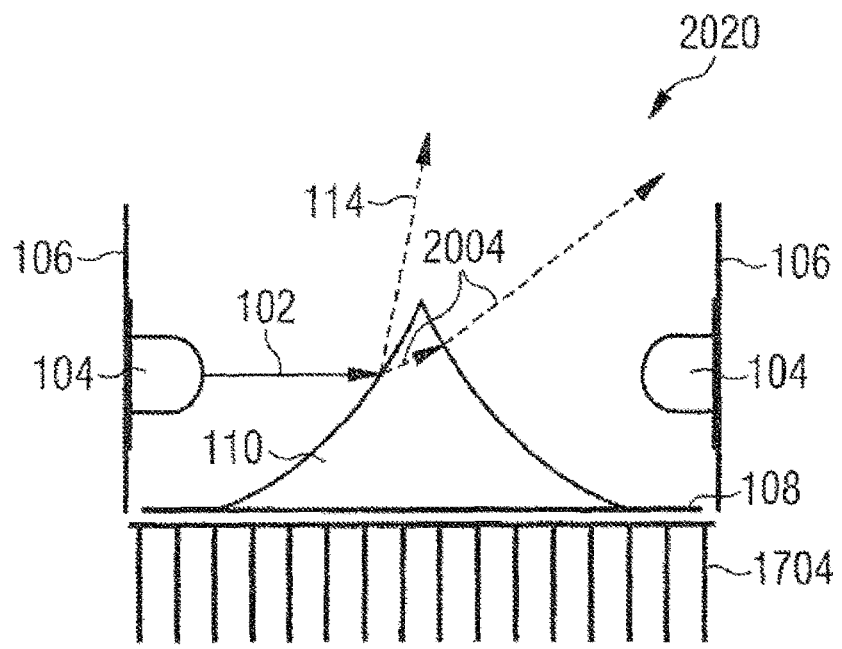

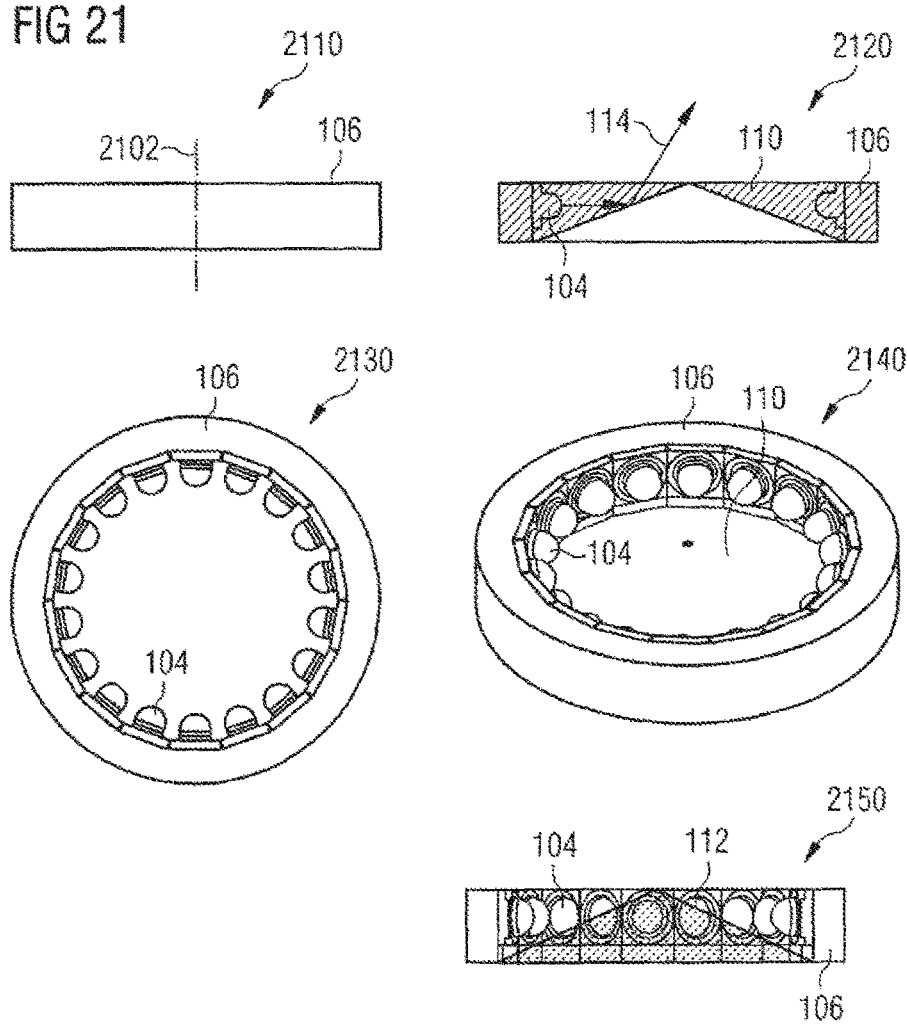

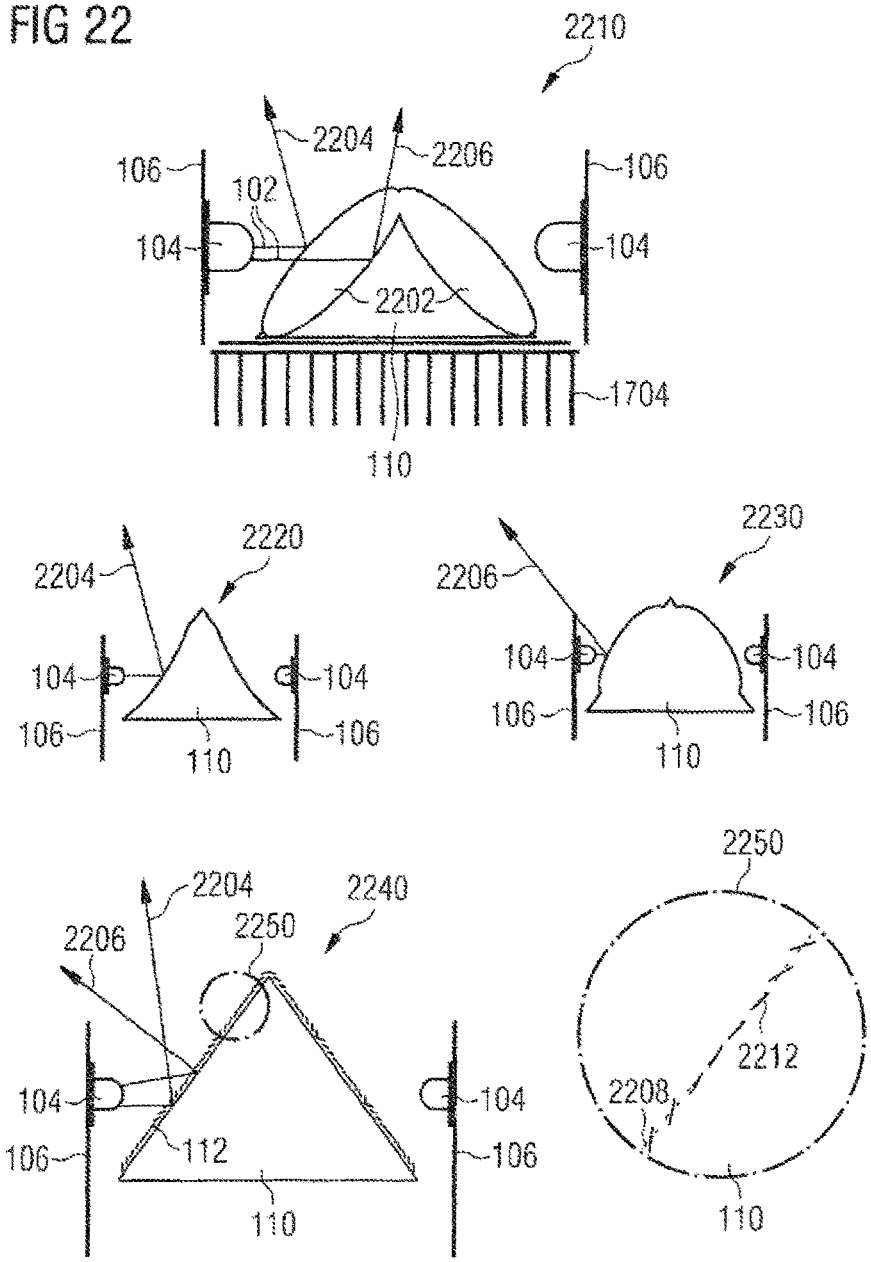

FIG 27
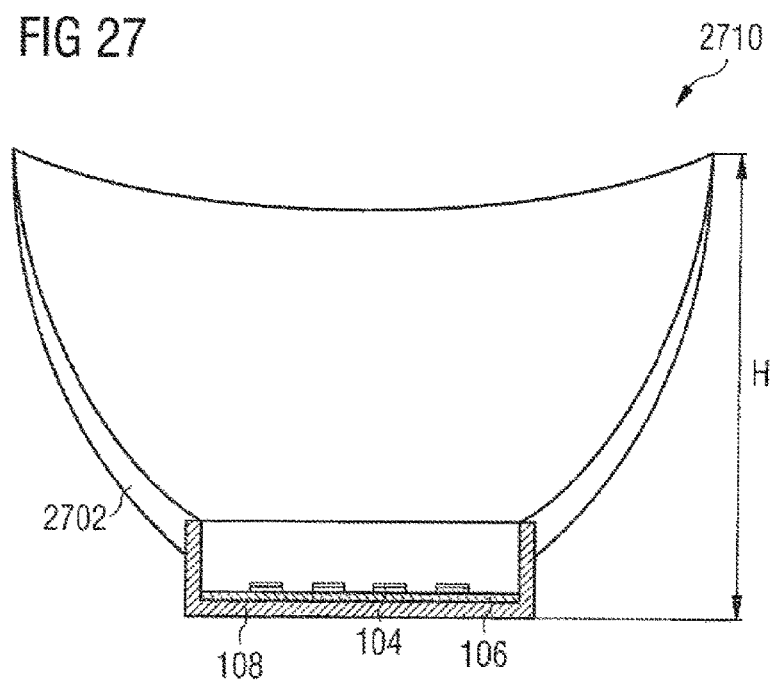
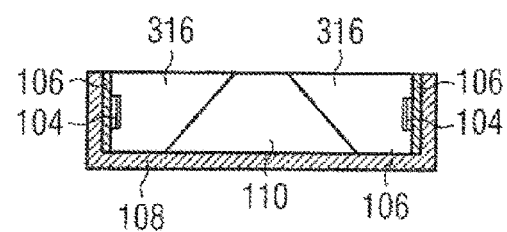

FIG 30
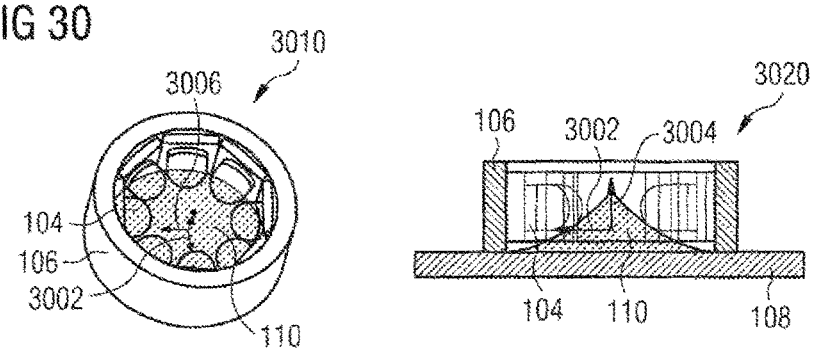
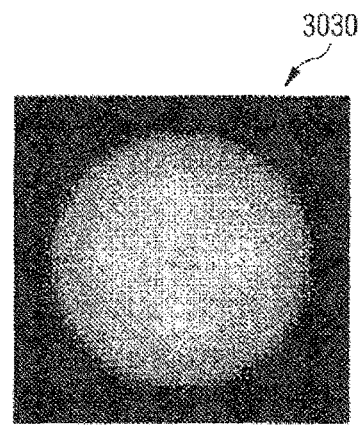
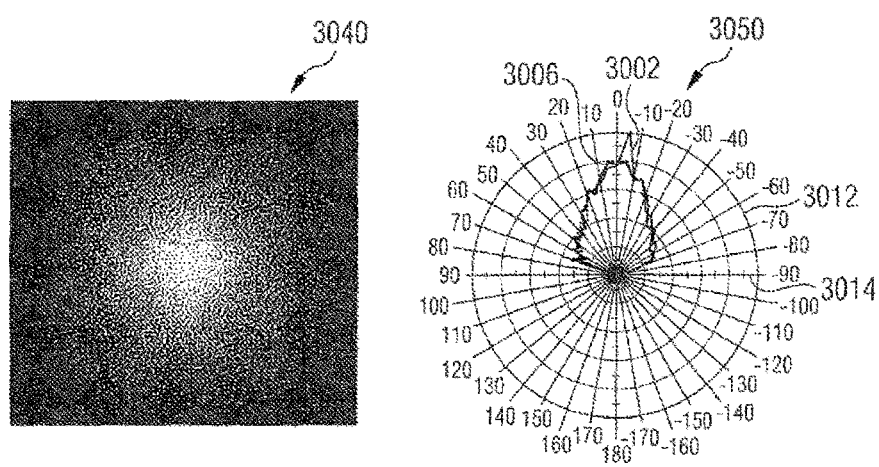

FIG 35
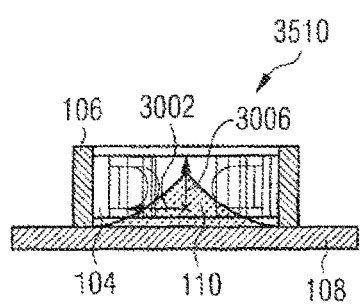
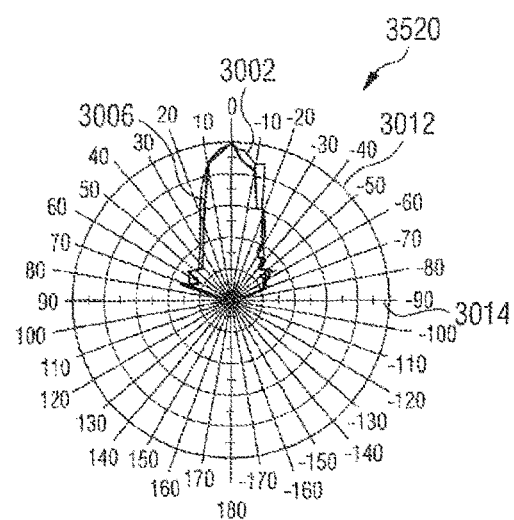
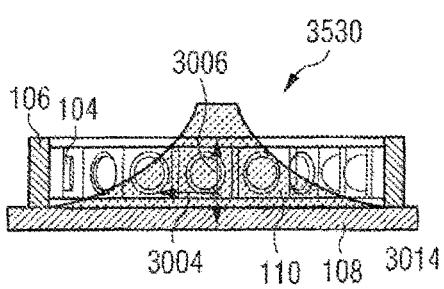
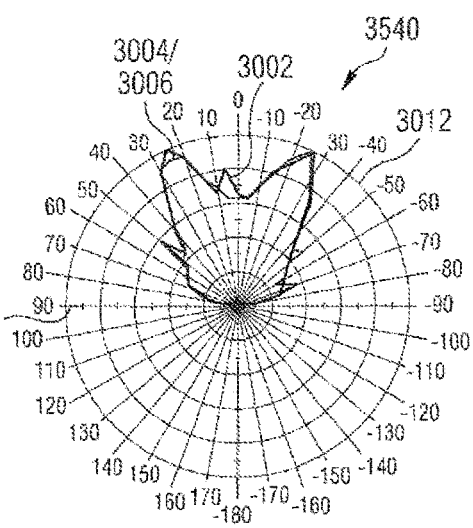

FIG 38
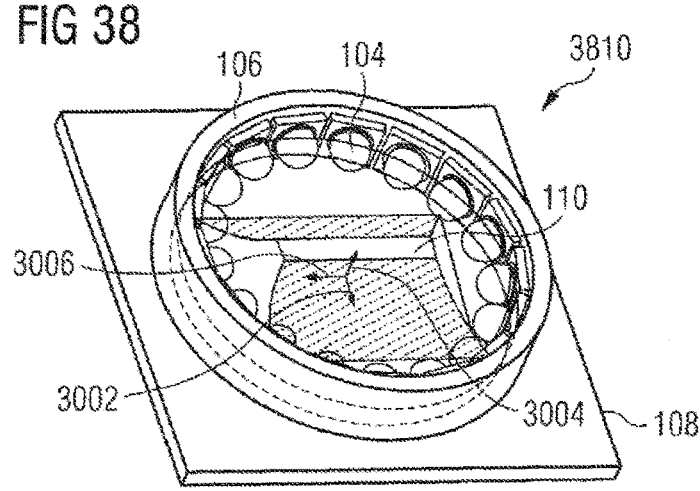
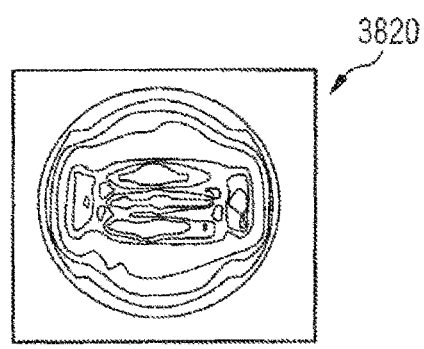
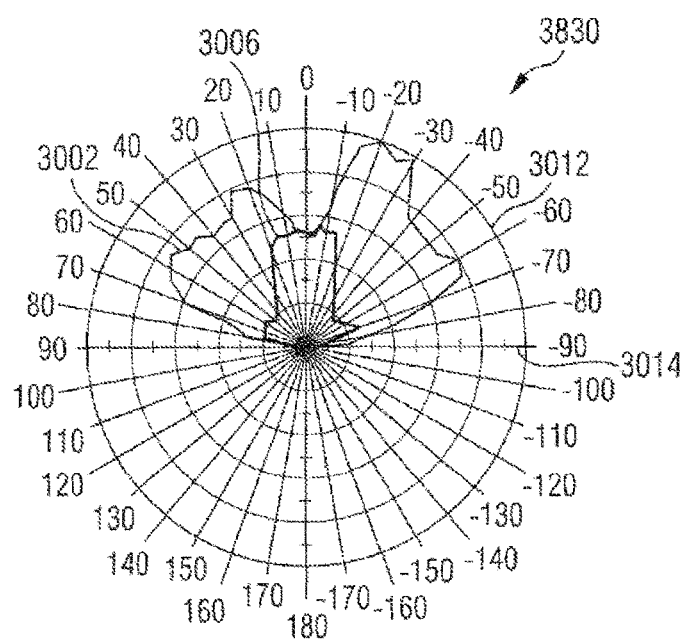

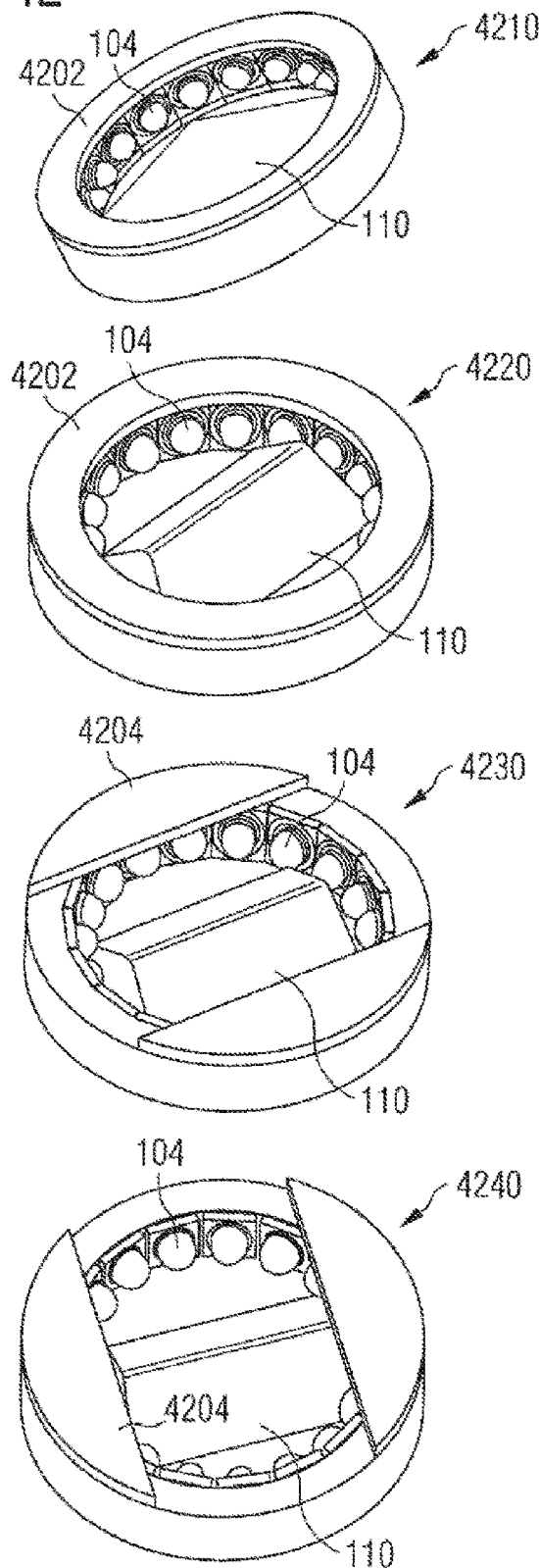

OPTOELECTRONIC COMPONENT DEVICE, METHOD OF PRODUCING AN OPTOELECTRONIC COMPONENT DEVICE, AND METHOD OF OPERATING AN OPTOELECTRONIC COMPONENT DEVICE, METHOD OF OPERATING AN OPTOELECTRONIC DEVICE HAVING IMPROVED EMISSION CHARACTERISTICS

TECHNICAL FIELD

This disclosure relates to optoelectronic component devices, a method of producing optoelectronic component devices, and a method of operating an optoelectronic component device.

BACKGROUND

In an optoelectronic component device, electromagnetic radiation can be provided and/or absorbed by an optoelectronic component.

An optoelectronic component that provides electromagnetic radiation can be a light emitting diode (LED), for example.

An optoelectronic component that absorbs electromagnetic radiation can be a photodetector, for example.

In one conventional method of increasing the electromagnetic radiation that can be provided and/or absorbed in an optoelectronic component device, the dimensioning of an individual optoelectronic component is scaled.

However, scaling individual optoelectronic components, for example, individual LEDs, is technically expedient only to a specific extent. By way of example, if there is a desire to increase the intensity of provided electromagnetic radiation, i.e. to further increase the light power, a plurality of optoelectronic components can be bundled in an optoelectronic component device, for example, an LED module.

Such an optoelectronic component device can be realized more compactly and more cost-effectively, for example, if the optoelectronic components, for example, light emitting semiconductor chips, i.e. the optoelectronic components that provide electromagnetic radiation, are formed directly on a common substrate (chip-on-board).

To obtain a homogeneous light distribution (brightness and color of the light spot) with a plurality of optoelectronic components, a high technical outlay is conventionally necessary, for example, by use of secondary optical units in the light path of the optoelectronic components, for example, lenses, for example, batwing lenses and/or reflectors, for example, mirrors, for example, on each individual light emitting diode.

Attempts have been made hitherto to scatter the light of individual optoelectronic components such that a homogeneous appearance arises. For this purpose, a diffuser material is introduced into the light path of the optoelectronic component device.

The diffusor material can, for example, be admixed with the potting of the optoelectronic components or applied as diffusor plates to the optoelectronic components, that is to say in the beam path of the electromagnetic radiation of the optoelectronic components.

Multiple scattering of the electromagnetic radiation in the diffusor material can result in a loss of efficiency in the optoelectronic component device.

By backscattering electromagnetic radiation onto the optoelectronic components, efficiency of the optoelectronic component device can become dependent on reflectivity of the optoelectronic components.

The emission characteristic of the optoelectronic components can be widened by the use of diffusor materials. At the same time, the directional effect of the electromagnetic radiation provided by an optoelectronic component can be significantly reduced.

In conventional optoelectronic component devices, attempts are made in some instances in a technically complex fashion, for example, by reflectors to reestablish the directional effect, for example, as a result of which further losses of efficiency can occur. By way of example, by customized, refractive components (secondary optical units), the light mixing of optoelectronic components arranged in a planar fashion can be improved, for example, by a shell mixer. By the additional optical component, production of the optoelectronic component device becomes more costly and efficiency is reduced by Fresnel reflections. Furthermore, the esthetic configurational freedom (design freedom) of the optoelectronic component device can be restricted.

A further conventional method of beam shaping or the generation of a specific illumination pattern, for example, of an image projection or in low beam/high beam is direct imaging of the optoelectronic component by an imaging optical unit, for example, a parabolic mirror. In that case, too, intermixing can take place only on the illuminated object.

SUMMARY

We provide an optoelectronic component device including a plurality of optoelectronic components that provide and/or absorb electromagnetic radiation; a reflector arranged in a beam path of the electromagnetic radiation of the plurality of optoelectronic components and which has a surface that is at least partly reflective with respect to the provided electromagnetic radiation; wherein the plurality of optoelectronic components at least partly surround the reflector or are at least partly surrounded by the reflector; and the reflector reflects a provided electromagnetic radiation such that a predefined field distribution of the reflected electromagnetic radiation is formed in the image plane of the optoelectronic component device.

We further provide an optoelectronic component device including at least one optoelectronic component that provides and/or takes up electromagnetic radiation; a reflector arranged in a beam path of the electromagnetic radiation of the at least one optoelectronic component and has a surface that is at least partly reflective with respect to the provided electromagnetic radiation; wherein the reflector has a reflective surface formed in a locally variable fashion.

We yet further provide a method of producing an optoelectronic component device including forming an arrangement comprising a plurality of optoelectronic components and a reflector such that the optoelectronic components at least partly surround the reflector; wherein the plurality of optoelectronic components provide and/or take up electromagnetic radiation; the reflector is arranged in the beam path of the electromagnetic radiation of the optoelectronic components, the reflector has a surface at least partly reflective with respect to the provided electromagnetic radiation; and the reflector and/or the optoelectronic components are/is arranged for indirect illumination of the image plane of the optoelectronic component device.

We still further provide a method of operating an optoelectronic component device including providing a field distribution of electromagnetic radiation in an image plane of an optoelectronic component device, wherein the field distribution of electromagnetic radiation is provided and/or absorbed by a plurality of optoelectronic components of the optoelectronic component device, and changing the field distribution of the electromagnetic radiation in the image plane of the optoelectronic component device, wherein a reflector having a variable shape is formed in the component device in the beam path of the electromagnetic radiation of the optoelectronic component, changing the field distribution comprises altering the angle of incidence of the provided electromagnetic radiation on the reflective surface of the reflector, and changing the angle of incidence is formed by changing the shape of the reflective surface of the reflector.

BRIEF DESCRIPTION OF THE DRAWINGS

FIG. 11 shows different optoelectronic component devices in accordance with various configurations.

FIG. 12 shows an optoelectronic component device in accordance with various configurations.

FIG. 13 shows an optoelectronic component device in accordance with various configurations.

FIG. 14 shows an optoelectronic component device in the method of producing an optoelectronic component device in accordance with various configurations.

FIG. 15 shows an optoelectronic component device in accordance with various configurations.

FIG. 16 shows schematic illustrations of optoelectronic component devices in the method of producing an optoelectronic component device in accordance with various configurations.

FIG. 17 shows an optoelectronic component device in the method of producing an optoelectronic component device in accordance with various configurations.

FIG. 18 shows different optoelectronic component devices with different reflectors in accordance with various configurations.

FIG. 19 shows an optoelectronic component device with different reflectors in accordance with various configurations.

FIG. 20 shows different optoelectronic component devices with different reflectors in accordance with various configurations.

FIG. 21 shows an optoelectronic component device with a totally reflecting reflector in accordance with various configurations.

FIG. 22 shows an optoelectronic component device in accordance with various configurations.

FIG. 27 shows an illustration of reducing the dimensioning of an optoelectronic component device in accordance with various configurations.

FIG. 30 shows an optoelectronic component device in accordance with various configurations.

FIG. 35 shows optoelectronic component devices in accordance with various configurations.

FIG. 38 shows an optoelectronic component device in accordance with various configurations.

FIG. 42 shows optoelectronic component devices in accordance with various configurations.

DETAILED DESCRIPTION

Figure 1:
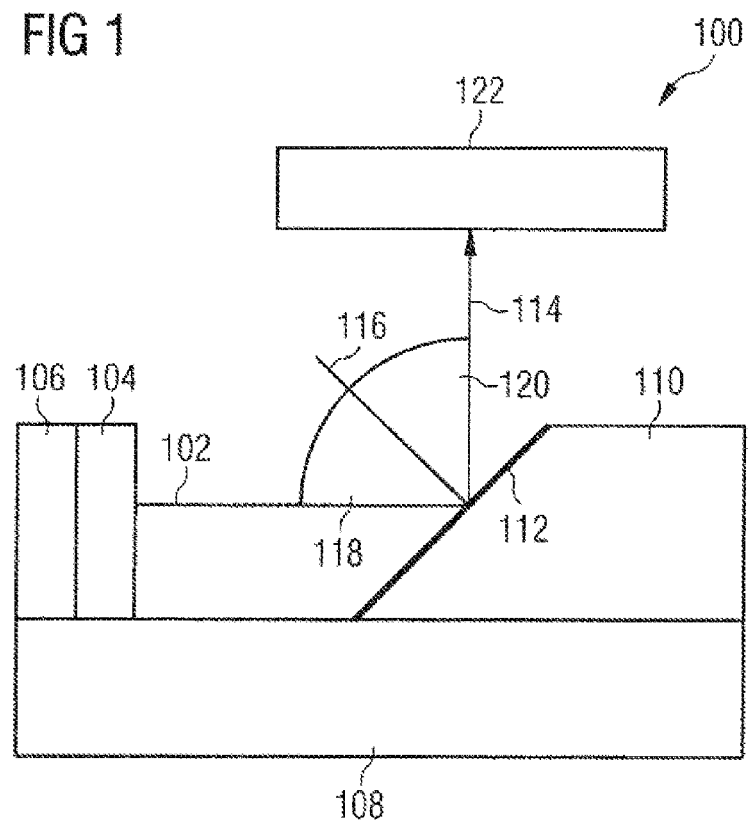
FIG. 1 shows a schematic cross-sectional view of the beam path in an optoelectronic component device in accordance with various configurations.

We provide optoelectronic component devices, a method of producing optoelectronic component devices and a method of operating an optoelectronic component device which make it possible to form and operate a compact optoelectronic component device which is scalable in a simple manner. With an optoelectronic component device, by deflecting an optoelectronic component and/or a reflector, it is possible to implement a flexible form of a homogeneous field distribution of the provided electromagnetic radiation in the image plane of the optoelectronic component device.

Furthermore, with the optoelectronic component device, it is possible to achieve good color mixing in conjunction with little loss of efficiency, wherein the location of providing the electromagnetic radiation and the location of mixing the electromagnetic radiation can be spatially separated from one another.

A compact design of the optoelectronic component device in accordance with various configurations, for example, of a lighting device, can be understood as a small geometrical dimensioning of the optoelectronic component device for a predefined luminous flux to be provided.

Furthermore, a compact design means a lighting device which achieves a high luminous flux and a high efficiency for a given dimensioning of the device.

An organic substance means a carbon compound which, regardless of the respective state of matter, is present in chemically uniform form and characterized by characteristic physical and chemical properties. Furthermore, an inorganic substance means a compound which, regardless of the respective state of matter, is present in chemically uniform form and characterized by characteristic physical and chemical properties, without carbon or a simple carbon compound. An organic-inorganic substance (hybrid substance) means a compound which, regardless of the respective state of matter, is present in chemically uniform form and is characterized by characteristic physical and chemical properties, comprising compound portions which contain carbon and are free of carbon. The term "substance" encompasses all abovementioned substances, for example, an organic substance, an inorganic substance, and/or a hybrid substance. Furthermore, a substance mixture means something which has constituents consisting of two or more different substances, the constituents of which are very finely dispersed, for example. A substance class means a substance or a substance mixture comprising one or more organic substance(s), one or more inorganic substance(s) or one or more hybrid substance(s). The term "material" can be used synonymously with the term "substance".

A luminophore means a substance which converts electromagnetic radiation of one wavelength into electromagnetic radiation of a different (longer) wavelength with losses, for example, by phosphorescence or fluorescence. The energy difference between absorbed electromagnetic radiation and emitted electromagnetic radiation can be converted into phonons, i.e. heat, and/or by emission of electromagnetic radiation with a wavelength proportional to the energy difference.

A luminophore can comprise or be formed from, for example, $Ce^{3+}$ doped granates such as YAG:Ce and LuAG, for example, $(Y, Lu)_3(Al,Ga)_5O_{12}:Ce^{3+}$; $Eu^{2+}$ doped nitrides, for example, $CaAlSiN_3:Eu^{2+}$, $(Ba,Sr)_2Si_5N_8:Eu^{2+}$; $Eu^{2+}$ doped sulfides, SIONs, SiAlON, orthosilicates, for example, $(Ba,Sr)_2SiO_4:Eu^{2+}$; chlorosilicates, chlorophosphates, BAM (barium magnesium aluminate:Eu) and/or SCAP, halophosphate.

Connection of a first body to a second body can be in a positively locking manner, in a force-locking manner and/or in a cohesive manner. The connections can be releasable, i.e. as reversible, for example, a screw connection, a hook and loop fastener. However, the connections can also be non-releasable, i.e. as irreversible, for example, a riveted connection, an adhesive connection. A non-releasable connection can be separated only by destroying the connection means.

In a positively locking connection, the movement of the first body can be restricted by a surface of the second body, wherein the first body moves perpendicularly, i.e. normally, in the direction of the restricting surface of the second body. A pin (first body) in a blind hole (second body) can be restricted in terms of movement, for example, in five of the six spatial directions.

In a force-locking connection, in addition to the normal force of the first body on the second body, i.e. a physical contact of the two bodies under pressure, a static friction can restrict a movement of the first body parallel to the second body. One example of a force-locking connection may be, for example, the self-locking of a screw in a complementarily shaped thread. In this case, self-locking means a resistance by friction.

In a cohesive connection, the first body can connect to the second body by atomic and/or molecular forces. Cohesive connections can often be non-releasable connections.

An optoelectronic component which provides electromagnetic radiation can be designed as a wired light emitting diode, surface mounted light emitting diode (surface mounted device—SMD) or chip-on-board light emitting diode (die).

A semiconductor chip which can provide electromagnetic radiation can be understood as an LED chip.

An optoelectronic component can comprise, for example, a semiconductor chip which provides electromagnetic radiation (wired LED, SMD) or can be designed as a semiconductor chip which provides electromagnetic radiation (chip-on-board).

The optoelectronic component can connect to a substrate, for example, a carrier, for example, a metal-core printed circuit board or a housing closely, for example, cohesively in a positively locking manner and/or in a force-locking manner.

A package or a housing can be applied and/or formed on or above the semiconductor chip. The package can be formed, for example, as an encapsulation, optical lens and/or as a converter component.

A wired light emitting diode can comprise a semiconductor chip which can provide electromagnetic radiation, for example, an LED chip. The semiconductor chip can be encapsulated with a plastic cap, for example.

The plastic cap can protect the LED chip against external, harmful influences, for example, oxygen and/or water during manufacture and during operation.

A surface mounted light emitting diode (SMD) can comprise an LED chip in a housing. The housing can be closely fixed to a substrate.

A chip-on-board light emitting diode can comprise an LED chip fixed on a substrate, wherein the LED chip may have neither a housing nor contact pads.

The individual semiconductor chips can be applied or formed, for example, on a substrate, for example, a printed circuit board.

The semiconductor chips can be wired to the printed circuit board by contact pads (wire bonding). The wiring can be effected by gold wires, for example.

An optoelectronic component device may be provided, the optoelectronic component device comprising: a plurality of optoelectronic components, designed to provide and/or take up electromagnetic radiation; a reflector arranged in the beam path of the electromagnetic radiation of the plurality of optoelectronic components and which has a surface that is at least partly reflective with respect to the provided electromagnetic radiation; wherein the plurality of optoelectronic components at least partly surround the reflector or are at least partly surrounded by the reflector; and wherein the reflector is designed such that it reflects a provided electromagnetic radiation such that a predefined field distribution of the reflected electromagnetic radiation is formed in the image plane of the optoelectronic component device.

The optoelectronic component device can furthermore comprise a substrate; wherein a plurality of optoelectronic components are arranged or applied alongside one another on a planar surface of the substrate.

The substrate can have a plurality of optoelectronic components, wherein the plurality of optoelectronic components are arranged alongside one another on a planar surface of the substrate.

The substrate can have an at least partly ring-shaped structure, wherein, in the at least partly ring-shaped structure of the substrate, the optoelectronic components arranged alongside one another on the substrate can be, for example, optoelectronic components arranged alongside one another and/or one above another.

The substrate can be designed as a flexible printed circuit board (flex PCB) having a metal core, a flexible printed circuit board having conductive regions and/or a mounting circuit board.

The substrate, for example, a mounting circuit board, can form a geometrically continuous line progression, wherein the line progression does not overlap.

A geometrically continuous line progression can be, for example, at least one partial segment of a circle, at least one partial segment of an ellipse for a straight section, that is to say a linear substrate, for example, similar or identical to a strip.

Two or more optoelectronic components of the plurality of optoelectronic components, for example, light emitting diodes and/or photodetectors, can be arranged on or above the substrate in a manner interconnected electrically in series and/or electrically in parallel with one another.

The radiance and/or the field distribution of the radiation field of the electromagnetic radiation in the optoelectronic component device, for example, the intensity of the light field provided by the optoelectronic component device in the image plane, can be set, for example, by the number and the arrangement of the optoelectronic components.

The radiance and/or the perceptible field distribution of the electromagnetic radiation in the image plane of the optoelectronic component device can be set, for example, by the number of the optoelectronic components arranged in a ring-shaped manner, for example, the number of optoelectronic components arranged in a ring-shaped manner concentrically with respect to one another or one above another.

The ring-shaped arrangement of the optoelectronic components can be formed by a deformed substrate with optoelectronic components. The substrate can be designed such that the ring-shaped structure can be formed by one of the following processes: folding, bending, rolling, deep-drawing or some other conventional process for reshaping a substrate.

The ring-shaped arrangement of optoelectronic components can be formed by singulated optoelectronic components arranged at least partly in a ring-shaped manner on or above a substrate.

The process of ring-shaped arrangement forms a partly or completely closed ring-shaped arrangement of optoelectronic components in a manner similar or identical to a circle, triangle, quadrilateral or polygon and/or a segment thereof, for example, a semicircle, a U-shape or the like.

The radiance and/or the field distribution can be set, for example, by the diameter of the ring-shaped arrangement of the optoelectronic components, the number of optoelectronic components in the ring-shaped arrangement and/or configuration of the optoelectronic components, for example, the dimensions of a optoelectronic component.

The substrate can be designed in a mechanically flexible fashion, for example, as a film.

The substrate can have as geometrical shape at least part of a shape similar or identical to one of the following geometrical shapes: a band, a strip, a cross, a rectangle, a triangle, a circle, a square, an ellipse, a star having blunt and/or pointed serrations.

One optoelectronic component or a plurality of optoelectronic components can have one of the following geometrical shapes: a circle; an ellipse; a square; a rectangle; and/or a polygon.

Dimensioning of the substrate can be similar or identical to the size of the optoelectronic component. However, the substrate can also be very much larger than the dimensioning of an individual optoelectronic component, for example, if a plurality of optoelectronic components are applied on a common substrate, for example, alongside one another, for example, as a chip-on-board module.

An optoelectronic component can comprise a semiconductor chip or can be designed as a semiconductor chip, wherein the semiconductor chip can absorb and/or provide electromagnetic radiation.

In other words: an optoelectronic component can comprise an LED chip or can be designed as an LED chip.

An optoelectronic component can comprise a light emitting diode or can be designed as a light emitting diode.

An optoelectronic component comprising an LED chip can be designed, for example, as an SMD (surface mounted device) or a light emitting diode.

An optoelectronic component designed as an LED chip can be formed, for example, as a chip-on-board on a substrate, for example, a printed circuit board.

An optoelectronic component can comprise a laser diode or can be designed as a laser diode.

One optoelectronic component or a plurality of optoelectronic components can comprise a photodetector or can be designed as a photodetector.

A photodetector can comprise, for example, a photodiode, a CCD sensor (charged coupled device—CCD) or a similar optoelectronic component that is sensitive with respect to electromagnetic radiation, or can be designed in such a way.

One optoelectronic component or a plurality of optoelectronic components can comprise an optical lens.

One optoelectronic component or a plurality of optoelectronic components can comprise a wavelength-converting structure, for example, a luminophore layer in the beam path of the provided electromagnetic radiation.

One optoelectronic component or a plurality of optoelectronic components can be designed to be movable with respect to the substrate, for example, can be rotatably mounted.

A rotatably mounted optoelectronic component with respect to the substrate can be tilted, inclined, pivoted and/or rotated, for example.

The component device can comprise a plurality of substrates with optoelectronic components.

The plurality of substrates with optoelectronic components can be arranged in the optoelectronic component device in a, at least partly, ring-shaped structure or ring-shaped arrangements.

The plurality of substrates arranged in an at least partly ring-shaped manner can be arranged, for example, concentrically with respect to one another, for example, around one another.

The plurality of at least partly ring-shaped substrates can, for example, each have a different diameter with respect to one another or be designed as segments of a ring-shaped arrangement and/or ring-shaped structure.

The plurality of at least partly ring-shaped substrates with optoelectronic components can each have optoelectronic components of different design, for example, having different color valences and/or further optical components, for example, lenses, luminophore layers and similar conventional optical components.

The reflector can be arranged in the beam path of the electromagnetic radiation of the optoelectronic components, for example, within the at least partly ring-shaped structure and/or ring-shaped arrangement, for example, in the center of the at least partly ring-shaped structure and/or ring-shaped arrangement, for example, concentrically with respect to the optoelectronic components of the ring-shaped structure and/or ring-shaped arrangement.

The reflector can also be understood or designated as a light kernel.

The reflector can have regions of different reflectivity with respect to electromagnetic radiation having a direction of incidence and a polarization.

The plurality of optoelectronic components can differ in at least one optoelectronic property, for example, the color valence of the electromagnetic radiation that can be provided and/or absorbed by the optoelectronic components.

A different color valence can be realized, for example, by optoelectronic components of different design, different wavelength-converting structures, for example, different luminophore layers and/or different optical elements, for example, different optical lenses, in the beam path of the electromagnetic radiation of the optoelectronic components.

The optoelectronic component device can comprise further optoelectronic components arranged or formed in the optoelectronic component device, for example, for the direct illumination of the image plane of the optoelectronic component device.

The optoelectronic component device can comprise at least two optoelectronic components, wherein the at least two optoelectronic components are arranged around the reflector and/or wherein the reflector is arranged around the at least two optoelectronic components, for example, concentrically.

The optoelectronic component device can comprise a housing, wherein the housing has at least one base and at least one side wall.

At least one portion of the plurality of optoelectronic components can be applied or arranged on or above the side wall of the housing and/or the base, for example, can be applied, for example, fixed, for example, adhesively bonded with the substrate on the side wall of the housing.

The at least one side wall of the housing can be designed as substrate for at least one portion of the plurality of optoelectronic components.

At least one portion of the plurality of optoelectronic components can be arranged in a package on the base of the housing, for example, as laterally emitting LED (side LED).

The reflector can be applied on the base of the housing and/or the base of the housing can be designed as a reflector.

Further optoelectronic components can be applied on or above the base.

The reflector can have at least one cavity.

Further optoelectronic components can be arranged in the cavity of the reflector.

The optoelectronic component device can furthermore comprise electronic components for controlling the optoelectronic components.

The electronic components can be arranged at least partly on the optically inactive rear side of the base and/or at least one side wall of the housing.

The electronic components can be arranged at least partly in a cavity of the reflector.

The optoelectronic component device can furthermore comprise a heat sink for cooling, for example, at least one portion of the plurality of optoelectronic components, the reflector, and/or a luminophore layer on or above the optoelectronic component and/or the reflector.

However, the cooling of the optoelectronic component device can also be realized without a heat sink laterally via the side walls and/or the base of the ring-shaped structure of the optoelectronic component device. In other words, over the circumference or diameter of the ring-shaped structure.

The base, for example, the baseplate of the housing or the baseplate of a printed circuit board can enable, for example, a large-area thermal linking, for example, to a heat sink, for example, to cool the optoelectronic component device.

The reflector can be designed to be totally reflective at least for part of the provided electromagnetic radiation.

In other words: the provided electromagnetic radiation can be totally reflected by the reflective surface of the reflector, wherein the reflector can be designed, for example, as an inverted geometrical shape with respect to a prism or cone, for example, a negative shape. In other words: the reflector can have a cavity, wherein the reflective surface of the reflector is designed as a totally reflective interface with respect to the cavity.

The reflector can be designed to be reflective at least for part of the provided electromagnetic radiation.

The reflector can be designed to be transmissive at least for part of the provided electromagnetic radiation.

It is thereby possible to realize a chromatically selectively deflecting reflector by virtue of provided electromagnetic radiation in a first wavelength range being reflected and transmitted differently than electromagnetic radiation in a different, second wavelength range.

The reflector can be designed to be transmissive and reflective at least for part of the provided electromagnetic radiation. It is thereby possible to design an optoelectronic component device that provides and/or absorbes electromagnetic radiation omnidirectionally, for example, by virtue of the fact that the electromagnetic radiation transmitted by the reflector is provided into a different image plane or into the same image plane but at a different angle relative to the electromagnetic radiation that is reflected by the reflector.

A wavelength converter, for example, a luminophore layer can be applied on or above the reflective surface of the reflector.

The reflector can be a geometrical polyhedron and have, for example, one of the following geometrical shapes: cone, truncated cone, cylinder, pyramid, truncated pyramid, prism, wherein the side faces can be straight, convex, concave or irregularly shaped.

With the configuration of the reflector it is possible to set the emission characteristic of the provided electromagnetic radiation in the image plane of the optoelectronic component device, for example, a non-symmetrical field distribution of the electromagnetic radiation in the image plane, for example, a linear, elliptical, rectangular, globe-shaped, Lambertian field distribution.

The reflective surface of the reflector can have one of the following geometrical shapes: planar, convex, concave, facet-like.

The shape and the surface constitution of the optical components, for example, of the reflector, for example, of the reflective surface can influence the quality of the intermixing of the deflected electromagnetic radiation and additionally the emission characteristic. The emission characteristic of an optoelectronic component device can be, for example, the field distribution, for example, a narrow or wide emission of the electromagnetic radiation which can be provided by an optoelectronic component, for example, the shape, for example, collimated, divergent or focused, of a beam and/or the manifestation of the shape, for example, the aperture angle of a focused or divergent beam.

The local shape of the reflective surface of the reflector which reflects the provided electromagnetic radiation can be designed to be variable.

The optoelectronic component device, to alter the local shape of the reflective surface of the reflector, can have one of the following devices: a device to move the reflector, for example, to lift and/or lower and/or rotate the reflector; a device to alter the local angles of incidence of the provided electromagnetic radiation, for example, piezo-operated and/or microelectromechanical (MEMS), facet-like, reflective surface segments; a reflector composed of an elastic substance, and a device to elastically change the shape of the reflector, for example, a mechanical spring or a device that changes the compressive force and/or the tensile force on the reflector and/or a device that changes the pressure in the reflector, for example, the gas pressure.

To change the local shape of the reflective surface of the reflector by rotating the reflector, the reflector can have an asymmetrical shape with respect to the rotation axis. In other words: the reflector can have a shape such that it is not completely rotationally invariant. Such a reflector can have, for example, a point-symmetrical, mirror-symmetrical or arbitrary shape.

The reflector can have one of the following geometrical shapes as basic surface: a circle, a square, a rectangle, an ellipse, a triangle, a polygon, a ring, a frame.

By configuration of the reflector, for example, the geometrical shape and the arrangement of the optoelectronic components with respect to the reflector, mixing the provided electromagnetic radiation can be set, for example, the emission characteristic of the light provided by the optoelectronic components can be set.

As a result, the electromagnetic radiation in the image plane can have, for example, a homogeneous distribution of the intensity and/or of the color valence.

However, the radiance of the electromagnetic radiation in the image plane can, for example, also change monotonically or with a few discontinuous locations, for example, in a large field of view, i.e. a large, continuous image plane.

A further optoelectronic component device can be in physical contact with, for example, physically connected to, the optoelectronic component device, for example, in a back-to-back arrangement.

The optoelectronic component device can comprise further optical components in the beam path of the electromagnetic radiation, for example, a lens, a diaphragm and/or a similar, conventional optical component.

A lens, for example, a cylindrical lens in the beam path of the electromagnetic radiation can comprise a wavelength converter, for example, a luminophore layer.

An encapsulation element can be arranged in the beam path of the electromagnetic radiation, for example, an encapsulation of the optoelectronic components and/or of the optoelectronic component device.

The encapsulation element can be, for example, transparent or translucent, for example, from a glass, a plastic or the like, for example, a transparent cover.

The encapsulation element can be, for example, part of the encapsulation of the optoelectronic component device.

The encapsulation can protect the optoelectronic component device, for example, the optoelectronic components, for example, against moisture, corrosive gases and/or corrosive liquids.

The base of the housing and/or the reflector can be part of the encapsulation of the optoelectronic component device. In other words: the housing and/or the reflector of the optoelectronic component device can encapsulate, for example, seal the optoelectronic component device, for example, the optoelectronic components toward the bottom.

The optoelectronic component device can be potted, for example, filled, with a formable substance, for example, a silicone, an epoxy, a silazane or the like.

For example, the mechanical stability and/or the encapsulation of the optoelectronic component device can be improved as a result.

One optoelectronic component or a plurality of optoelectronic components can be designed, for example, as a light emitting diode and/or a photodetector.

The optoelectronic component device can be designed as an LED lighting, for example, an LED light source, or a chip-on-board module.

The optoelectronic component device can comprise different optoelectronic components which provide, for example, different spectra of electromagnetic radiation, wherein the different spectra can be associated with different color loci in a CIE standard chromaticity diagram, i.e. have different color valences. In other words: the optoelectronic components can provide light of different colors, for example, which can be mixed in the optoelectronic component device, for example, by the reflector.

The different optoelectronic components can provide electromagnetic radiation having different wavelengths and/or part of the provided electromagnetic radiation can be wavelength-converted in the optoelectronic component device, for example, by a luminophore layer.

The optoelectronic component device can comprise at least one optoelectronic component, for example, an LED chip or an LED, which emits red light.

The optoelectronic component device can comprise at least one optoelectronic component, for example, an LED chip or an LED, which emits green light.

The optoelectronic component device can comprise at least one optoelectronic component, for example, an LED chip or an LED, which emits blue light.

The optoelectronic component device can comprise at least one luminophore layer, for example, a yellow phosphor layer.

Our optoelectronic component may comprise at least one optoelectronic component that provides and/or takes up electromagnetic radiation; a reflector arranged in the beam path of the electromagnetic radiation of the at least one optoelectronic component and has a surface at least partly reflective with respect to the provided electromagnetic radiation; wherein the reflector has a shape of the reflective surface of the reflector formed in a locally variable fashion.

The configurations and arrangements of the reflector, of the at least one optoelectronic component, of the electronic components for controlling, of the heat sink and further features described above of the optoelectronic component device can be designed similarly or identically to one of the configurations already described above.

To alter the local shape of the reflective surface of the reflector, the optoelectronic component device can comprise: a device that moves the reflector, for example, lifts, lowers and/or rotates the reflector; a device that alters the local angles of incidence, for example, piezo-operated and/or microelectromechanical, facet-like reflective surface segments; and/or a reflector composed of an elastic substance and a device that elastically changes the shape of the reflector, for example, a mechanical spring and/or a device that changes the tensile force and/or the compressive force on a reflector and/or a device that changes the pressure in the reflector.

Our method of producing an optoelectronic component device may comprise: forming an arrangement comprising a plurality of optoelectronic components and a reflector such that the optoelectronic components at least partly surround the reflector; wherein the optoelectronic components provide and/or take up electromagnetic radiation; wherein the reflector is arranged in the beam path of the electromagnetic radiation of the optoelectronic components, and wherein the reflector has a surface that is at least partly reflective with respect to the provided electromagnetic radiation; and wherein the reflector and/or the optoelectronic components are/is arranged for indirect illumination of the image plane of the optoelectronic component device.

One optoelectronic component or a plurality of optoelectronic components can be applied on or above a first substrate or can be formed on or above a first substrate, for example, as SMD.

The reflector can be applied on or above a second substrate or can be designed as a second substrate.

The first substrate and the second substrate can be designed as different regions of a common substrate.

The first substrate and/or the common substrate can be mechanically flexible, for example, similarly or identically to a film.

The reflector can be formed or embodied as a part of the second substrate.

Arranging the optoelectronic components and the reflector, i.e. arranging the first substrate on or above the second substrate, can comprise one of the following processes with respect to the first substrate: bending; folding; rolling; curving; setting up; and/or erecting.

The first substrate can be closely connected to the second substrate.

A plurality of optoelectronic components can be arranged on or above the first substrate.

The plurality of optoelectronic components can be arranged alongside one another on a planar surface of the first substrate.

The first substrate and/or second substrate can be designed to be mechanically flexible, for example, as a film.

The first substrate and/or the second substrate can have as geometrical shape a shape similar or identical to one of the following geometrical shapes: a band, a strip, a cross, a rectangle, a triangle, a circle, a square, an ellipse, a star having blunt or pointed serrations.

One optoelectronic component or a plurality of optoelectronic components can have one of the following geometrical basic shapes from the group of the geometrical shapes: a circle; an ellipse; a square; a rectangle; and/or a polygon.

One optoelectronic component or a plurality of optoelectronic components can comprise an LED chip, a light emitting diode and/or a laser diode or can be designed as an LED chip, a light emitting diode and/or a laser diode.

One optoelectronic component or a plurality of optoelectronic components can comprise an optical lens in the beam path of the provided electromagnetic radiation.

One optoelectronic component or a plurality of optoelectronic components can comprise a wavelength-converting structure, for example, a luminophore layer.

One optoelectronic component or a plurality of optoelectronic components can be movable with respect to the first substrate, for example, can be rotatably mounted.

A plurality of first substrates with optoelectronic components can connect to the second substrate, for example, a plurality of LED chips in a housing (first substrate) can be arranged, for example, fixed on or above the second substrate.

The optoelectronic component device can be formed with a plurality of optoelectronic components, wherein the plurality of optoelectronic components differ in at least one optoelectronic property, for example, the color valence of the electromagnetic radiation that can be provided and/or absorbed.

The method can furthermore comprise applying further optoelectronic components, wherein the further optoelectronic components are arranged or formed in the optoelectronic component device such that the direction of propagation of the provided and/or absorbed electromagnetic radiation of the further optoelectronic components at least partly serves as a direct illumination of the image plane of the optoelectronic component device.

The further optoelectronic components can be arranged or formed on the second substrate.

The optoelectronic component device can be formed such that at least two optoelectronic components of the plurality of optoelectronic components become concentric around a reflector.

The optoelectronic component device can be formed such that at least two optoelectronic components of the plurality of optoelectronic components are surrounded concentrically by a reflector.

The reflector can be formed such that the reflective surface has regions of different reflectivity with respect to a direction of incidence of electromagnetic radiation.

The second substrate can be part of a housing or can be understood as a housing, wherein the housing has at least one base and at least one side wall.

The second substrate can be understood as a base of the housing, for example, if a plurality of singulated optoelectronic components in a component housing, for example, side LEDs are arranged on or above the second substrate.

The first substrate with at least one optoelectronic component can be applied on a side wall of the housing.

The at least one side wall of the housing can be designed as a first substrate.

The reflector can be applied on the second substrate, the second substrate can be formed as a reflector, or the reflector can be designed at least partly as a second substrate, for example, as a base of the housing of the optoelectronic component device.

Further optoelectronic components can be applied on or above the second substrate, for example, on or above the base of the housing of the optoelectronic component device.

The reflector can have at least one cavity.

At least one further optoelectronic component can be arranged in the at least one cavity, wherein the reflector, for example, in the beam path of the provided electromagnetic radiation of the further optoelectronic component is designed to be at least partly translucent.

The method can furthermore comprise: applying electronic components to control the optoelectronic components and/or the reflector of the optoelectronic component device, wherein the electronic components are arranged on or above the second substrate, a side wall of the housing and/or in the cavity of the reflector.

The method can furthermore comprise: applying a heat sink, designed for cooling the optoelectronic components and/or the reflector, on an outer side or underside of the second substrate, for example, optically inactive underside of the housing.

The reflector can be formed such that it is totally reflective at least for part of the provided electromagnetic radiation.

In other words: the electromagnetic radiation can be totally reflected by the reflective surface of the reflector, wherein the reflector is formed, for example, in an inverted geometrical shape with respect to a prism or cone, for example, a negative shape.

The reflector can be formed such that it is reflective at least for part of the provided electromagnetic radiation.

The reflector can be formed such that it is transmissive at least for part of the provided electromagnetic radiation.

By configuration of the reflector it is possible to realize a chromatically selectively deflecting reflector, i.e. the reflector can have a different reflectivity and/or transmission for electromagnetic radiation of a first spectrum than for electromagnetic radiation of a second spectrum.

The reflector can be formed such that it is transmissive and/or reflective at least for part of the provided electromagnetic radiation. In one configuration, an omnidirectionally providing and/or taking-up optoelectronic component device can be formed by a reflector formed as transmissive and/or reflective.

A wavelength converter, for example, a luminophore layer, can be applied on or above the reflective surface of the reflector.

The reflective surface of the reflector can have one of the following geometrical shapes: planar, convex, concave and/or facet-like.

The reflector can be formed such that the shape of the reflective surface of the reflector is formed in a locally variable fashion.

The method can comprise: forming a device that moves the reflector, for example, lifts, lowers and/or rotates the reflector; forming a device that alters the local angles of incidence, for example, forms piezo-operated and/or micro-electromechanical, facet-like reflective surface segments of the reflective surface of the reflector; forming a reflector composed of an elastic substance and forming a device that elastically changes the shape of the reflector, for example, coupling the reflector to a mechanical spring and/or a device that changes the tensile force and/or the compressive force on the reflector and/or forming a device that changes the pressure in the reflector, for example, the gas pressure.

The reflector can have one of the following geometrical shapes as basic surface: a circle, a square, a rectangle, an ellipse, a triangle, a polygon, a ring, a frame.

The shape and the surface constitution of the optical component, for example, of the reflector, for example, of the reflective surface of the reflector, can influence the quality of the intermixing of the deflected, provided electromagnetic radiation and additionally the emission characteristic. The emission characteristic of an optoelectronic component device can be, for example, the field distribution, for example, a narrow or wide emission of the electromagnetic radiation which can be provided by the plurality of optoelectronic components.

The optoelectronic component device can physically connect to a further optoelectronic component device, for example, in a back-to-back arrangement.

At least one further, optical component can be formed or arranged in the beam path of the electromagnetic radiation, for example, a lens, a diaphragm and/or the like.

A further optical component can be arranged in the beam path of the electromagnetic radiation, wherein the further optical component is designed at least as a wavelength-converting component, for example, comprises a luminophore layer.

The optoelectronic component device can be formed as an LED lighting and/or a photodetector.

The method can furthermore comprise: applying at least one further optoelectronic component, wherein the at least one further optoelectronic component is arranged for the direct illumination of the image plane of the optoelectronic component device, for example, by arranging the at least one further optoelectronic component on or above the second substrate, for example, the base of the housing.

An encapsulation element can be arranged in the beam path of the electromagnetic radiation of the optoelectronic components. The encapsulation element can be designed to be, for example, transparent or translucent, for example, composed of a glass or plastic or the like.

The encapsulation element can be, for example, part of the encapsulation of the optoelectronic component device.

The encapsulation can protect the optoelectronic component device, for example, the optoelectronic components, for example, against moisture, corrosive gases and/or corrosive liquids.

The base of the housing and/or the reflector can be part of the encapsulation of the optoelectronic component device. In other words: the housing and/or the reflector of the optoelectronic component device can encapsulate, for example, seal the optoelectronic component device, for example, the optoelectronic components toward the bottom.

The optoelectronic component device can be filled, for example, potted with a formable substance, for example, a silicone, an epoxy, a silazane or the like. The mechanical stability and/or the encapsulation of the optoelectronic component device can be improved as a result.

One optoelectronic component or a plurality of optoelectronic components can be designed or formed, for example, as a light emitting diode and/or a photodetector.

The optoelectronic component device can be formed as a lighting, for example, an LED light source, for example, a chip-on-board module device.

The optoelectronic component device can comprise different optoelectronic components which provide, for example, different spectra of electromagnetic radiation, wherein the different spectra can be associated with different color loci in a CIE standard chromaticity diagram, i.e. can have different color valences. In other words: the optoelectronic components can provide, for example, light of different colors which can be mixed in the optoelectronic component device, for example, by the reflector.

The different optoelectronic components can provide electromagnetic radiation, having different wavelengths and/or part of the provided electromagnetic radiation can be wavelength-converted in the optoelectronic component device, for example, by a luminophore layer.

The optoelectronic component device can be formed from at least one optoelectronic component (for example, an LED chip or an LED) which emits red light, green light and/or blue light.

The optoelectronic component device can be formed from at least one luminophore layer, for example, a yellow phosphor layer.

A method of operating an optoelectronic component device may comprise: providing a field distribution of electromagnetic radiation in the image plane of an optoelectronic component device, wherein the field distribution of electromagnetic radiation is provided and/or absorbed by at least one optoelectronic component of the optoelectronic component device, wherein a reflector having a variable shape is formed in the component device in the beam path of the electromagnetic radiation of the optoelectronic component, changing the field distribution of the electromagnetic radiation in the image plane of the optoelectronic component device, wherein changing the field distribution comprises altering the angle of incidence of the provided electromagnetic radiation on the reflective surface of the reflector, wherein changing the angle of incidence is formed by changing the shape of the reflective surface of the reflector.

Changing the angle of incidence can comprise moving the reflector, for example, lifting, lowering and/or rotating the reflector with respect to the at least one optoelectronic component.

Changing the field distribution can comprise changing the number of optically active optoelectronic components. An optically active optoelectronic component can absorb or provide electromagnetic radiation, for example.

Changing the shape of the reflector can comprise exerting a compressive force and/or a tensile force on the reflector and/or changing the pressure in the reflector, for example, the gas pressure in the reflector.

Changing the gas pressure in the reflector can be temporally modulated.

Changing the shape of the reflector can comprise changing the orientation of the reflective surface of the reflector, wherein changing the reflective surface comprises changing the orientation of movable segments at the reflective surface of the reflector with respect to incident electromagnetic radiation.

Changing the orientation of the movable segments at the reflective surface of the reflector can be implemented piezoelectrically and/or microelectromechanically.

Changing the field distribution can be designed as changing the type of illumination of the optoelectronic component device, for example, as changing the operating mode of the optoelectronic component device, for example, as switching from high beam to low beam, wherein high beam and low beam have different field distributions in the image plane.

When changing the type of illumination of the optoelectronic component device, at least one optoelectronic property of the optoelectronic components can be altered, for example, the color valence, the polarization, the coherence length, the intensity and/or the form of the field distribution of the provided or absorbed electromagnetic radiation, for example, changing the near field and/or the far field of the provided electromagnetic radiation, and/or as dimming the provided electromagnetic radiation.

When changing the type of illumination of the optoelectronic component device, the electrical driving of at least one optoelectronic component can be altered with respect to at least one further optoelectronic component, for example, by phase gating dimming or phase chopping dimming of the optoelectronic components in accordance with conventional methods.

Examples are illustrated in the figures and are explained in greater detail below.

In the following detailed description, reference is made to the accompanying drawings, which form part of this description and show for illustration purposes specific examples which can be implemented. In this regard, direction terminology such as, for instance, "at the top", "at the bottom", "at the front", "at the back", "front", "rear" and the like is used with respect to the orientation of the figure(s) described. Since component parts of examples can be positioned in a number of different orientations, the direction terminology serves for illustration and is not restrictive in any way whatsoever. Other examples can be used and structural or logical changes can be made, without departing from the scope of protection of this disclosure. It goes without saying that the features of the various examples described herein can be combined with one another, unless specifically indicated otherwise. Therefore, the following detailed description should not be interpreted in a restrictive sense, and the scope of protection of this disclosure is defined by the appended claims.

The terms "connected" and "coupled" are used to describe both a direct and an indirect connection, and a direct or indirect coupling. In the figures, identical or similar elements are provided with identical reference signs, insofar as this is expedient.

FIG. 1 shows a schematic cross-sectional view of the beam path in an optoelectronic component device in accordance with various configurations.

For illustration purposes, without restricting generality, the beam path of an electromagnetic beam 102, 114 of electromagnetic radiation in an optoelectronic component device 100 is illustrated, wherein the beam is provided by an optoelectronic component 104. The beam path for one optoelectronic component is illustrated in FIG. 1, without restricting generality. However, the optoelectronic component device can also comprise two or more optoelectronic components.

For an optoelectronic component device 100 in which the provided electromagnetic radiation 102 is absorbed by an optoelectronic component 104, the beam path can be configured in a manner similar to the illustrated beam path, wherein, however, the image plane 122 is arranged in, on or at the optoelectronic component 104 that absorbs radiation, and wherein the electromagnetic radiation is provided by a radiation source (not illustrated).

The beam 102 can be provided, for example, emitted by an optoelectronic component 104.

The beam 114 can be absorbed, for example, absorbed by an optoelectronic component 104.

The optoelectronic component 104 can be fixed, for example, formed or adhesively bonded on or above a first substrate 106.

The first substrate 106 can be fixed on, above or to a second substrate 108, for example, cohesively in a force-locking manner or in a positively locking manner.

However, the first substrate 106 and the second substrate 108 can also be part of a common substrate, for example, by a part (106) of the common substrate being folded, thereby forming the first substrate 106 and/or the second substrate 108.

The optoelectronic component 104 can be designed, for example, as a surface-emitting and/or surface-absorbing optoelectronic component.

A surface-emitting optoelectronic component can also be understood as a radiation-providing optoelectronic component, wherein the electromagnetic radiation is provided by the optoelectronic component from the surface of the optoelectronic component.

A surface-absorbing optoelectronic component can also be understood as an optoelectronic component that absorbs radiation, wherein the electromagnetic radiation is absorbed by the optoelectronic component by the surface of the optoelectronic component.

Surface-emitting and/or surface-absorbing optoelectronic components can have the advantage that the optoelectronic components 104 can be used without a reflector and/or a lens, i.e. technically more simply with respect to manufacture.

A surface-emitting optoelectronic component can be designed, for example, as a light emitting diode, for example, an InGaN diode 104 or InGaAlP diode 104.

A surface-absorbing optoelectronic component 104 can be designed, for example, as a photodetector 104, for example, a photodiode, a CCD sensor or the like.

An optoelectronic component 104, for example, an LED chip, a light emitting diode or a laser diode, can comprise a wavelength-converting structure, for example, a luminophore layer, for example, a phosphor layer in the beam path of the electromagnetic radiation.

A luminophore layer can be applied, for example, to the optoelectronic component 104, for example, an LED chip 104 after the optoelectronic component 104 has been applied to the first substrate 106.

Applying the luminophore layer can comprise, for example, spraying, printing (jetting) or some other similar, conventional method.

Applying the luminophore layer can be applied completely or onto defined regions onto or above the first substrate, for example, only on or above the optoelectronic component.

A reflector 110 can be applied on or above the second substrate 108.

The first substrate 106 and/or the second substrate 108 can comprise or be formed from, as substance, a substance from the group of the following substances: iron, steel, aluminum, copper, silver, gold, palladium, magnesium, titanium, platinum, nickel, tin, zinc, glass, quartz glass, sapphire, silicon carbide, graphene, diamond, elemental semiconductor: silicon, germanium, α-tin, carbon compounds, for example, fullerenes, boron, selenium, tellurium; compound semiconductors: indium, gallium, arsenic, phosphorus, antimony, nitrogen, zinc, cadmium, beryllium, mercury; organic semiconductors: tetracene, pentacene, phthalocyanines, polythiophene, PTCDA, MePTCDI, quinacridone, acridone, indanthrone, flavanthrone, perinone, Alq3; and mixed systems: polyvinylcarbazol, TCNQ complexes, polyolefins (for example, high or low density polyethylene (PE) or polypropylene (PP)), polyvinyl chloride (PVC), polystyrene (PS), polyester, polycarbonate (PC), polyethylene terephthalate (PET), polyethersulfone (PES), polyethylene naphthalate (PEN), polymethyl methacrylate (PMMA), polyimide (PI), polyether ketones (PEEK).

The first substrate 106 can be designed, for example, as a flexible printed circuit board (flex PCB).

The at least one optoelectronic component 104 can be applied or formed, for example, on or above the first substrate 106.

The reflector 110 can have a reflective surface 112 for at least one wavelength range of the electromagnetic radiation.

The reflector 110 can comprise or be formed from, as substance, a substance from the group of the following substances: iron, steel, aluminum, copper, silver, gold, palladium, magnesium, titanium, platinum, nickel, tin, zinc, glass, quartz glass, sapphire, silicon carbide, graphene, diamond, elemental semiconductor: silicon, germanium, α-tin, carbon compounds, for example, fullerenes, boron, selenium, tellurium; compound semiconductors: indium, gallium, arsenic, phosphorus, antimony, nitrogen, zinc, cadmium, beryllium, mercury; organic semiconductors: tetracene, pentacene, phthalocyanines, polythiophene, PTCDA, MePTCDI, quinacridone, acridone, indanthrone, flavanthrone, perinone, Alq3; and mixed systems: polyvinylcarbazol, TCNQ complexes, polyolefins (for example, high or low density polyethylene (PE) or polypropylene (PP)), polyvinyl chloride (PVC), polystyrene (PS), polyester, polycarbonate (PC), polyethylene terephthalate (PET), polyethersulfone (PES), polyethylene naphthalate (PEN), polymethyl methacrylate (PMMA), polyimide (PI), polyether ketones (PEEK), silicone, epoxy.

The reflective surface 112 of the reflector can comprise or be formed from, for example, the same substance as or a different substance than the reflector 110.

The reflective surface 112 can comprise or be formed from, as substance, a substance from the group of the following substances: iron, steel, aluminum, copper, silver, gold, palladium, magnesium, titanium, platinum, nickel, tin, zinc, glass, quartz glass, sapphire, silicon carbide, graphene, diamond, elemental semiconductor: silicon, germanium, α-tin, carbon compounds, for example, fullerenes, boron, selenium, tellurium; compound semiconductors: indium, gallium, arsenic, phosphorus, antimony, nitrogen, zinc, cadmium, beryllium, mercury; organic semiconductors: tetracene, pentacene, phthalocyanines, polythiophene, PTCDA, MePTCDI, quinacridone, acridone, indanthrone, flavanthrone, perinone, Alq3; and mixed systems: polyvinylcarbazol, TCNQ complexes, polyolefins (for example, high or low density polyethylene (PE) or polypropylene (PP)), polyvinyl chloride (PVC), polystyrene (PS), polyester, polycarbonate (PC), polyethylene terephthalate (PET), polyethersulfone (PES), polyethylene naphthalate (PEN), polymethyl methacrylate (PMMA), polyimide (PI), polyether ketones (PEEK), silicone, epoxy.

The reflective surface 112 can be at least partly reflective at least in a wavelength range for electromagnetic radiation, for example, in a wavelength range of approximately 25 nm to approximately 5 µm, for example, approximately 350 nm to approximately 850 nm, for example, light for angles of incidence having an absolute value of approximately 0° to approximately 90°, for example, of approximately −45° to approximately 45°.

Electromagnetic radiation 102 can be provided by the optoelectronic component 104 and have a direction of propagation in the direction of the reflective surface 112 of the reflector 110.

The provided electromagnetic radiation 102 can have locally an angle 118 of incidence with respect to the perpendicular 116 to the reflective surface 112 of the reflector 110.

The provided electromagnetic radiation 102 can be deflected by the reflective surface 112 of the reflector 110 at an angle 120 of reflection.

The optoelectronic component 104 and the reflective surface 112 of the reflector 110 can be arranged such that the electromagnetic radiation 114 deflected by the reflective surface 112 can be detected, for example, can be perceived or observed, in the image plane 122 of the optoelectronic component device.

The direction of the deflected electromagnetic radiation 114 can also be understood as a main emission direction of the optoelectronic component device.

In a radiation-providing optoelectronic component 104 (illustrated in FIG. 1), for example, an observer (not illustrated) can be situated in the image plane of the optoelectronic component device and view that portion of the provided electromagnetic radiation which is deflected by the reflector 110.

In a different configuration, an observer can observe a portion of the deflected electromagnetic radiation which is scattered in the image plane of the optoelectronic component device.

In an optoelectronic component 104 that absorbs radiation, the optoelectronic component (not illustrated) can be situated in the image plane 122 of the optoelectronic component device and absorb that portion of the electromagnetic radiation provided by a radiation source (not illustrated) which is deflected by the reflector 110.

Figure 2:
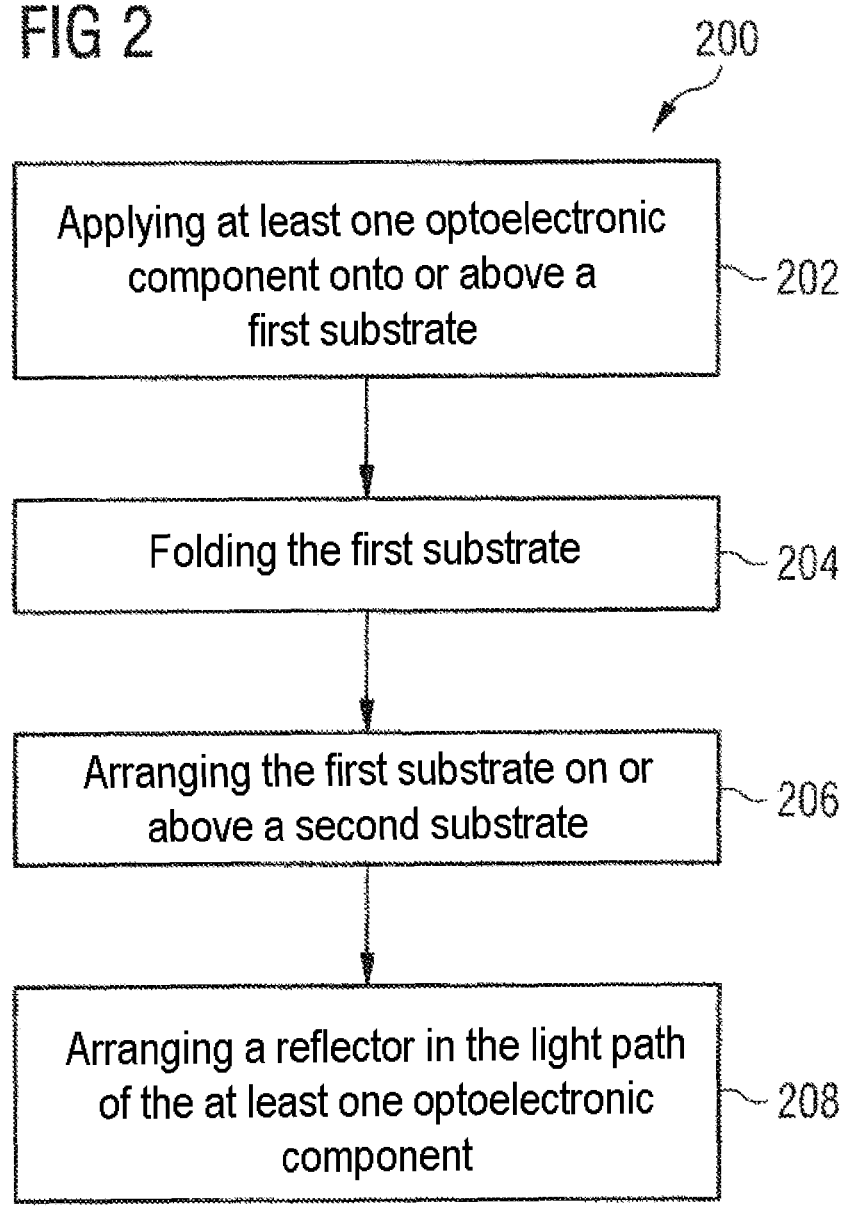
FIG. 2 shows a schematic overview for a method of producing an optoelectronic component device in accordance with various configurations.

FIG. 2 shows a schematic overview for a method of producing an optoelectronic component device in accordance with various configurations.

The method 200 of producing an optoelectronic component device 100 can comprise arranging 202 a plurality of optoelectronic components 104 on or above a second substrate 108 and/or forming 202 a plurality of optoelectronic components 104 on or above a first substrate 106.

When arranging 202 a plurality of optoelectronic components 104 on or above a second substrate 108, the first substrate 106 can be understood, for example, as a component housing of the optoelectronic components 104.

The method 200 of producing an optoelectronic component device 100 can comprise forming 204 a ring-shaped structure and/or arrangement of the optoelectronic components 104.

Forming 204 a ring-shaped structure 204 can comprise, for example, folding 204 the first substrate 106 with optoelectronic components 104.

Folding 204 can be understood as folding 204 the first substrate 106 at a folding edge and/or in the mathematical sense as mathematically folding the first substrate 106 with optoelectronic components 104 with a geometrical body, for example, a ring, a U-shape or the like.

Mathematically folding can be understood, for example, as arranging a plurality of singulated optoelectronic components 104 in a manner similar or identical to a geometrical body, for example, arranging in a ring-shaped fashion.

The method 200 of producing an optoelectronic component device 100 can comprise arranging the first, folded substrate 106 with at least one optoelectronic component 104 at, on or above a second substrate 108. Arranging 206 the first substrate 106 at a second substrate can comprise, for example, folding 204 of at least one region of a common substrate at an edge, wherein one region at the edge of the folded, common substrate can be understood as the first substrate 106 and the other region at the edge of the folded, common substrate can be understood as the second substrate 108.

The method 200 of producing an optoelectronic component device 100 can comprise arranging 208 a reflector 110 having a reflective surface 112 in the beam path of the electromagnetic radiation of the plurality of optoelectronic components 104.

In other words: The first substrate 106 can be understood, for example, as a line progression 106, for example, as a mounting element 106, for example, a metal-core printed circuit board (MC-PCB) having a mounting surface (not illustrated). Arranging 202 at least one optoelectronic component 104 can be effected on or above the first substrate 106, that is to say on the mounting surface.

The angle between the mounting surface and the mounting plane can be dependent on the main emission direction and/or the main absorption direction of the at least one optoelectronic component, for example, the main emission direction of a light emitting diode. By way of example, an optoelectronic component that provides electromagnetic radiation laterally, for example, a SideLED, can have a different main emission direction with respect to the mounting surface or the mounting element than an LED which can provide electromagnetic radiation perpendicularly (top emitter or TopLED).

The main emission direction of a provided electromagnetic radiation means the proportionally weighted average value of the emission directions.

The optoelectronic component can be such that the angle between mounting surface and mounting plane can be varied continuously or discontinuously. By way of example, the angle between mounting surface and mounting plane can be chosen such that the illumination of the reflector is optimized in turned-up optoelectronic components. Furthermore, the illumination of the reflector can be optimized by optoelectronic components having, for example, an asymmetrical emission characteristic, for example, by squint lenses.

An optoelectronic component can, for example, be fixed on or above the mounting surface, for example, be closely connected, for example, cohesively, for example, adhesively bonded, soldered; for example, in a positively locking manner, for example, plugged; and/or in a force-locking manner, for example, screwed, riveted.

Forming 204 a ring-shaped arrangement and/or ring-shaped structure of optoelectronic components 104 of the first substrate 106 with a plurality of optoelectronic components 104 can be designed or formed, for example, as rolling up a mechanically flexible first substrate 106 to form an at least partly ring-shaped structure and/or ring-shaped arrangement of the optoelectronic components.

A completely ring-shaped structure or completely ring-shaped arrangement of optoelectronic components 104 can be formed in more than two optoelectronic components 104 on or above the first substrate 106.

A completely ring-shaped arrangement can be formed in more than two optoelectronic components 104 on or above the second substrate 108.

An at least partly ring-shaped structure and/or at least partly ring-shaped arrangement of the optoelectronic components 104 can be formed with at least one optoelectronic component, for example, as a ring segment.

Forming 204 a ring-shaped arrangement and/or ring-shaped structure of optoelectronic components 104 can also be designated as shaping the line progression in a plane, wherein the plane can be designated as mounting plane. The shaped line progression can have, for example, a closed shape, for example, of a circle, of an ellipse, or of a polygon (n-gon) or of a partial segment of these shapes.

The mounting plane can be understood as second substrate 108 and/or reflector 110 depending on the respective configuration.

The at least one optoelectronic component 104 can be arranged partly or completely on the inner side or the outer side or on the inner side and the outer side of the ring-shaped structure.

In other words: a plurality of optoelectronic components can be oriented toward the geometrical center and/or toward the center of the mass centroid of the ring-shaped structure or can be directed away therefrom, for example, antiparallel.

The arrangement of the optoelectronic component 104 can relate in each case to that surface of the optoelectronic component 104 which provides or absorb electromagnetic radiation.

Arranging 202 the optoelectronic components 104 on the mounting surface 106 can be implemented such that the angle between the mounting plane 108 and the main emission direction 102 of the optoelectronic components 104 has a value of approximately +45° to approximately −45°, for example, approximately +15° to approximately −20°.

An angle of approximately 0° describes the case in which the main emission direction 102 is designed to be parallel to the mounting plane 108, for example, the second substrate 108.

The reflector 110 can be arranged in the beam path of the electromagnetic radiation of the plurality of optoelectronic components 104, for example, in the center, for example, (approximately) concentrically with respect to the ring-shaped structure and/or ring-shaped arrangement.

The reflector 110 can be shaped separately before the process of arranging 208 the reflector 110, i.e. can be formed before the process of introducing the reflector into the beam path of the electromagnetic radiation.

However, the reflector 110 can also be understood as a region of the second substrate 108 in the beam path of the electromagnetic radiation of the optoelectronic component 104.

By the shape of the reflective surface 112 of the reflector 110 in the beam path of the electromagnetic radiation of the optoelectronic component 104, it is possible to set the type and quality of the intermixing of the deflected electromagnetic radiation 114.

The reflector 110 should be formed and arranged in the optoelectronic component device such that a significant proportion of the provided electromagnetic radiation 102, for example, greater than approximately 50%, for example, greater than approximately 75%, impinges on the reflector 110 and is deflected.

The reflective surface 112 of the reflector 110 should be formed with regard to the provided electromagnetic radiation 102, for example, the polarization, the wavelength and/or the angle of incidence such that the proportion of the deflected electromagnetic radiation 114 is greater than approximately 50%, for example, greater than approximately 90% with respect to the provided electromagnetic radiation 102.

The optoelectronic component device 100 should be designed such that the provided electromagnetic radiation 102 is reflected, for example, deflected once before the electromagnetic radiation reaches the image plane 122.

Furthermore, by the indirect arrangement of the plurality of optoelectronic components with respect to the image plane 122 of the optoelectronic component device, it is possible to set the type and quality of the intermixing independently of the respective configuration of the radiation source(s), for example, by the configuration of the reflector 110.

Figure 3:
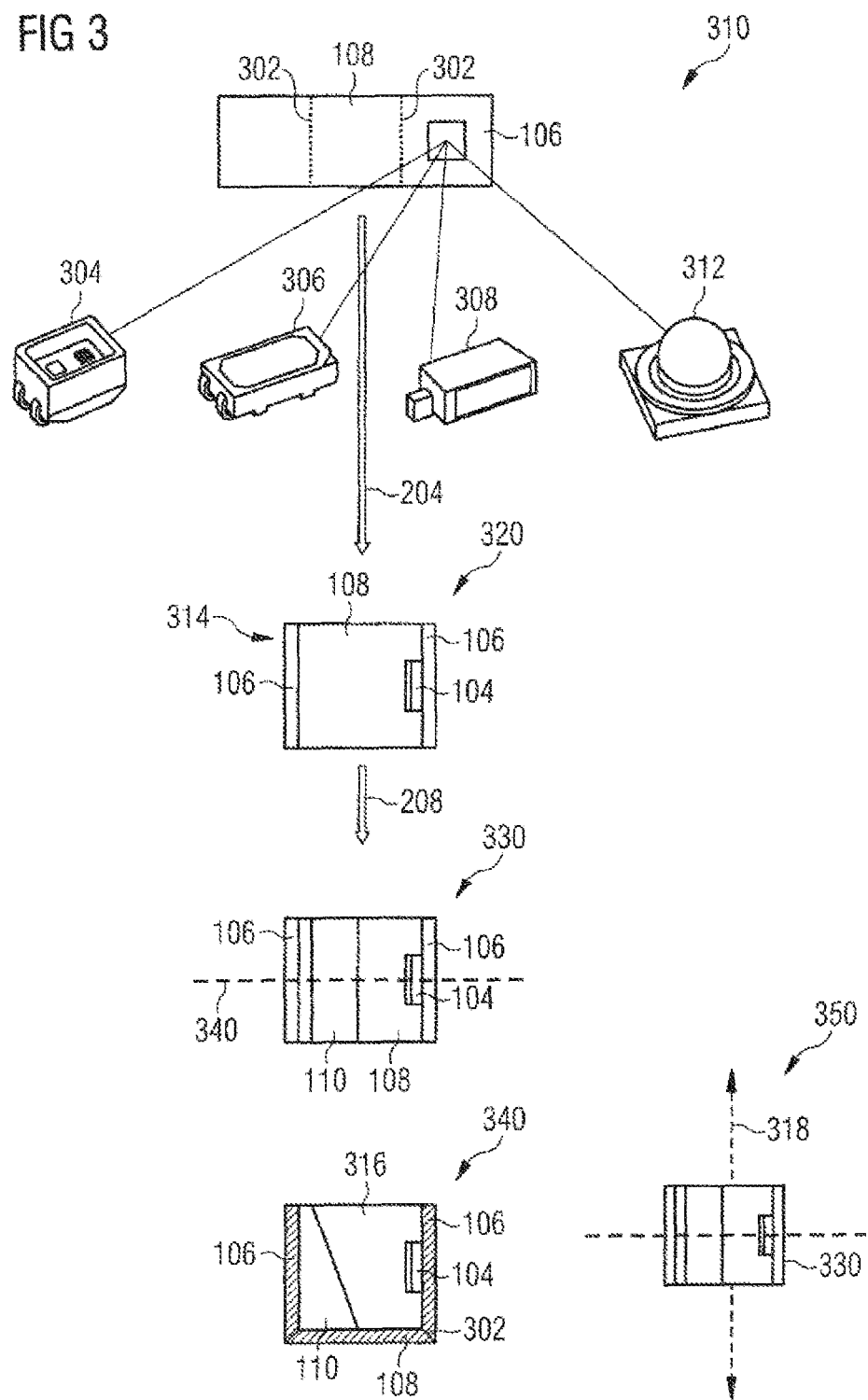
FIG. 3 shows an optoelectronic component device in accordance with various configurations.

FIG. 3 shows an optoelectronic component device in accordance with various configurations.

Different views 310, 320, 330, 340 of an optoelectronic component device 100 are illustrated.

The optoelectronic component 104, the first substrate 106, the second substrate 108 and/or the reflector 110 having a reflective surface 112 may have been designed in accordance with one of the configurations from the description of FIG. 1 and formed in accordance with one of the configurations from the descriptions of FIG. 2.

The first plan view 310 illustrates an optoelectronic component 104 on a first substrate 106.

The optoelectronic component 104 can be designed as a singulated optoelectronic component 304.

The optoelectronic component 104 can be designed as a singulated optoelectronic component 104 having a wavelength-converting structure 306 in the beam path of the electromagnetic radiation of the optoelectronic component 304.

The optoelectronic component 104 can be designed as an optoelectronic component 308 providing radiation laterally and/or taking up radiation laterally and having a wavelength-converting structure in the beam path of the electromagnetic radiation of an optoelectronic component, for example, an LED providing radiation laterally with respect to the fixing (SideLED/Sidelooker).

The optoelectronic component 104 can be designed as a singulated optoelectronic component 312 having a wavelength-converting structure and a lens in the beam path of the electromagnetic radiation of an optoelectronic component 104, for example, of an LED, for example, of an InGaN diode.

The lens can be formed, for example, by volume potting of a formable substance or substance mixture on or above the LED.

The lens can be formed, for example, asymmetrically with respect to the rotation axis parallel to the light path. By the asymmetrical shape of the lens, illumination of the reflector 110 can be improved, for example, that is to say that a direct illumination of the image plane can be prevented or reduced by the shape of the lens of the optoelectronic component.

A second plan view 320 illustrates the first substrate 106 with optoelectronic components 304, 306, 308, 312 after the process of forming 204 a partly ring-shaped arrangement and/or ring-shaped structure of the optoelectronic component 104 of the first substrate 106. A partly ring-shaped arrangement of an optoelectronic component can be understood in this sense as a segment of a ring (not illustrated).

Forming 204 a ring-shaped arrangement and/or ring-shaped structure of optoelectronic components 104 of the first substrate 106 can be effected, for example, at the folding lines 302 of the first substrate 106.

The base 108 of the folded structure 314 can be understood as the second substrate 108, for example, wherein the first substrate 106 and the second substrate 108 can be different regions of a common substrate.

In other words: a first substrate 106 and a second substrate 108 can be formed by folding 204 the common substrate.

The folded structure 314 can have a cavity 316, wherein the cavity has at least one opening.

The folded structure 314 can have one of the following geometrical shapes as basic surface 108: a circle, a triangle, a square, a rectangle, an ellipse, a polygon, a ring.

The flexible substrate 106 with optoelectronic component 104 can be folded, for example, such that the at least one optoelectronic component 104 together with the reflector 110 forms an at least partly concentric arrangement, for example, forms a positionally invariant arrangement, for example, is opposite the reflector 110 at an axis of symmetry of the first substrate.

A partly concentric arrangement can be understood as approximate correspondence of the position of the reference points of the reflector and of the optoelectronic components.

The reference point of the optoelectronic components can be, for example, the geometrical center of the ring-shaped structure of the optoelectronic components.

The reference point of the reflector can be, for example, the center of mass, an axis of symmetry, the geometrical center or of a projection of these reference points.

The different reference points of the reflector can have different positions in the reflector, for example, in an asymmetrically shaped reflector.

In an at least partly concentric arrangement of the optoelectronic components around the reflector, the position of the reference point of the optoelectronic components can be approximately identical to one of the reference points of the reflector.

A third view 330 illustrates a plan view 330 of the folded structure 314 after the process of arranging 208 a reflector 110 in the beam path of the electromagnetic radiation of the at least one optoelectronic component 104.

The reflective surface 112 of the reflector can comprise or be formed from, for example, the same substance as or a different substance than the reflector 110.

A further view 340 illustrates a cross-sectional view of the third view 330—the sectional axis 340 is indicated by a dashed line 340 in the third view 330.

The reflector 110 can have the shape similar or identical to a prism, wherein the side faces of the prism can be curved, for example, in a straight, convex, concave or arbitrary manner.

Further configurations of reflectors 110 can be gathered from the descriptions of FIG. 18, for example.

The illustrated configuration 310, 320, 330, 340 of the optoelectronic component device can be understood as an excerpt from a larger optoelectronic component device, comprising two or more optoelectronic components—indicated by the arrow 318 in the schematic plan view 350.

The shape, the material composition, the design, the dimensioning, the arrangement and the number, of the first substrate 106, of the second substrate 108, of the reflector 110, and of the optoelectronic components 104 can be designed, for example, in accordance with one configuration from the description of FIG. 1 or 2 and following figures.

Figure 4:
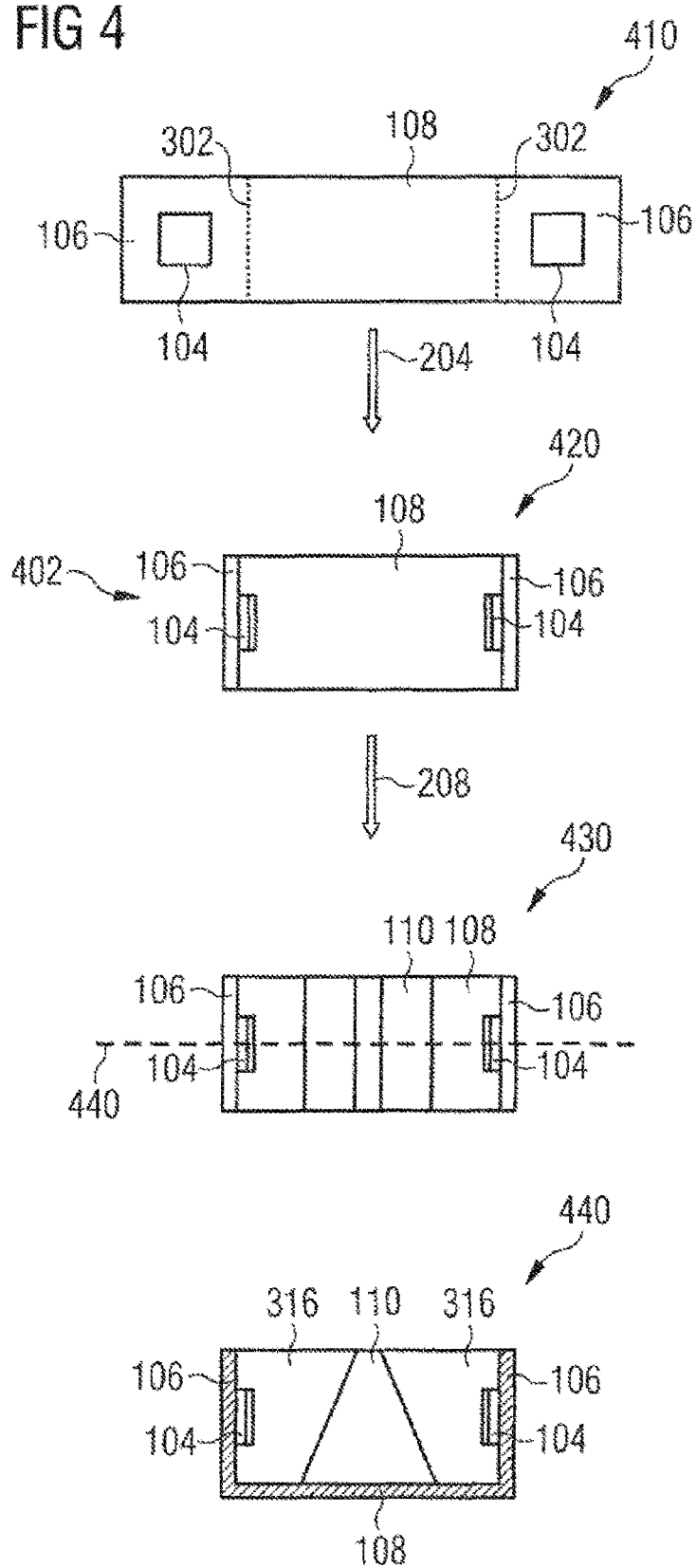
FIG. 4 shows an optoelectronic component device in accordance with various configurations.

FIG. 4 shows an optoelectronic component device in accordance with various configurations.

Different views 410, 420, 430, 440 of an optoelectronic component device 100 are illustrated.

The optoelectronic component 104, the first substrate 106, the second substrate 108 and/or the reflector 110 having a reflective surface 112 can be designed in accordance with one of the configurations from the description of FIGS. 1 to 3.

The first view 410 illustrates two optoelectronic components 104 on a common, first substrate 106.

A second view 420 illustrates a plan view 420 of the first substrate 106 after the process of forming 204 a ring-shaped arrangement and/or ring-shaped structure of optoelectronic components 104 of the first substrate 106.

The first substrate 106 can be folded at the folding lines 302, for example.

The base of the folded structure 402 can be understood as the second substrate 108, wherein the first substrate 106 and the second substrate 108 can be different regions of a common substrate from the first view 410.

In an optoelectronic component device 100 comprising two optoelectronic components 104 which at least partly surround a reflector 110, the optoelectronic components 104 can be arranged opposite, alongside one another, diagonally, or in a similar arrangement with respect to one another.

The folded structure 402 can have a cavity 404. The optoelectronic components 104 can be arranged, for example, on the inner side in the cavity 404 of the folded structure 402.

The folded structure 402 can have one of the following geometrical shapes as basic surface 108: a circle, a triangle, a square, a rectangle, an ellipse, a polygon, a ring.

The flexible substrate 106 with optoelectronic component 104 can be folded, for example, such that the flexible substrate 106 and the optoelectronic components form an at least partly concentric arrangement, for example, are opposite one another.

The optoelectronic components 104 can be arranged on the outer side of the folded structure 402.

One optoelectronic component 104 can be arranged on the inner side and one optoelectronic component 104 can be arranged on the outer side of the folded structure 402.

A third view 430 illustrates a plan view 430 of the folded structure 402 from the second view 420 after the process of arranging the reflector in the beam path of the electromagnetic radiation of the optoelectronic components 104.

The folded structure 402 can have, for example, a geometrical shape similar or identical to a ring, a hollow cylinder or a blind hole.

The first substrate 106 can be arranged (204) or on the second substrate 108 closely, for example, in a force-locking manner, cohesively, in a positively locking manner, for example, at the lines 302, and can connect to the second substrate 108.

The reflector 110 can be arranged in the cavity 316 of the folded structure 402, for example, concentrically with respect to the first substrates 106 of the folded structure 402.

A further view 440 illustrates a cross-sectional view of the third view 430—the sectional axis 440 is indicated by the dashed lines 440 in the third view 430.

The reflector 110 can have the shape similar or identical to a prism, for example, of a truncated pyramid or of a truncated cone.

Further configurations of reflectors 110 can be gathered from the descriptions of FIG. 18, for example.

The reflective surface 112 of the reflector can comprise or be formed from, for example, the same substance as or a different substance than the reflector 110.

The illustrated configuration of the optoelectronic component device can be understood, for example, as an excerpt from a larger optoelectronic component device, in a manner similar to a configuration of the illustration 350 in FIG. 3.

Figure 5:
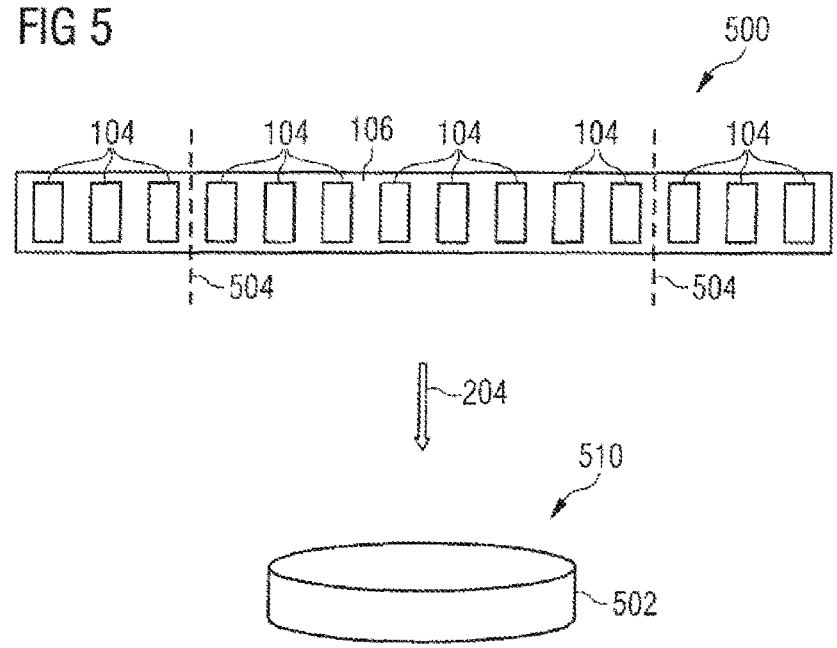
FIG. 5 shows a configuration of optoelectronic components on a first substrate in accordance with various configurations.

FIG. 5 shows a configuration of optoelectronic components on a first substrate in accordance with various configurations.

The two or more optoelectronic components 104 can be arranged on a common first substrate 106. In other words: the optoelectronic components 104 are not applied to the first substrate 106 in a singulated fashion, but rather are formed on a common, first substrate 106—illustrated in the view 500.

The optoelectronic components 104 can be formed on a common leadframe 106. The optoelectronic components 104 then need not be singulated, rather the leadframe 106 can be separated application-specifically in the required length, for example, can be cut apart—indicated by the dashed lines 504.

A leadframe means, for example, a metal structure which has one or a plurality of metal pieces, for example, which holds together the metal pieces by a metal frame.

A leadframe can be formed, for example, from a planar, for example, mechanically flexible, metal plate, for example, by a chemical method such as etching, for example, or by a mechanical method such as stamping, for example.

The resulting strips 106 of the leadframe can then be rolled up to form a, for example, ring-shaped structure.

In a configuration in which the first substrate 106 with optoelectronic component 104 is designed as a leadframe 106 with optoelectronic component 104, the electrical interconnection of the optoelectronic components 104 can be effected during the process of forming the optoelectronic components 104 on or above the leadframe 106.

Forming the optoelectronic components 104 on a common substrate 106, for example, on a leadframe 106, can have the advantage that the number of optoelectronic components 104 and/or the dimensioning of the first substrate 106 can be formed application-specifically—indicated by the dashed lines 504.

Forming 204 a ring-shaped arrangement 502 and/or a ring-shaped structure 502 of optoelectronic components 104 of the first substrate 106 to form a ring-shaped structure 502 can be implemented, for example, as bending 204 the first substrate 106—illustrated in the view 510.

The optoelectronic components 104 can be arranged on the inner side and/or outer sides of the ring-shaped structure 502.

A ring-shaped structure 502 can be understood as a partly or completely closed curve, wherein a closed curve can have the geometrical shape of a circle, of an ellipse, of a rectangle or generally of a polygon.

In other words: the ring-shaped structure 502 can have a geometrical shape such that the first substrate 106 with optoelectronic components 104 describes a geometrical shape similar to a closed curve, for example, a ring 502, a triangle 502, a quadrilateral 502, a polygon 502 or similar geometrical shapes.

Forming the complete, closed ring-shaped structure 502 can be effected starting from three or more optoelectronic components.

The concrete configuration of the ring-shaped structure 502, for example, the geometrical shape or the diameter, can be dependent on the number of optoelectronic components 104.

The shape, the material composition, the design, the dimensioning, the arrangement and the number, of the first substrate 106, of the second substrate 108, of the reflector 110, and of the optoelectronic components 104 can be designed, for example, in accordance with a configuration from the description of FIGS. 1 to 4 and following figures.

Figure 6:
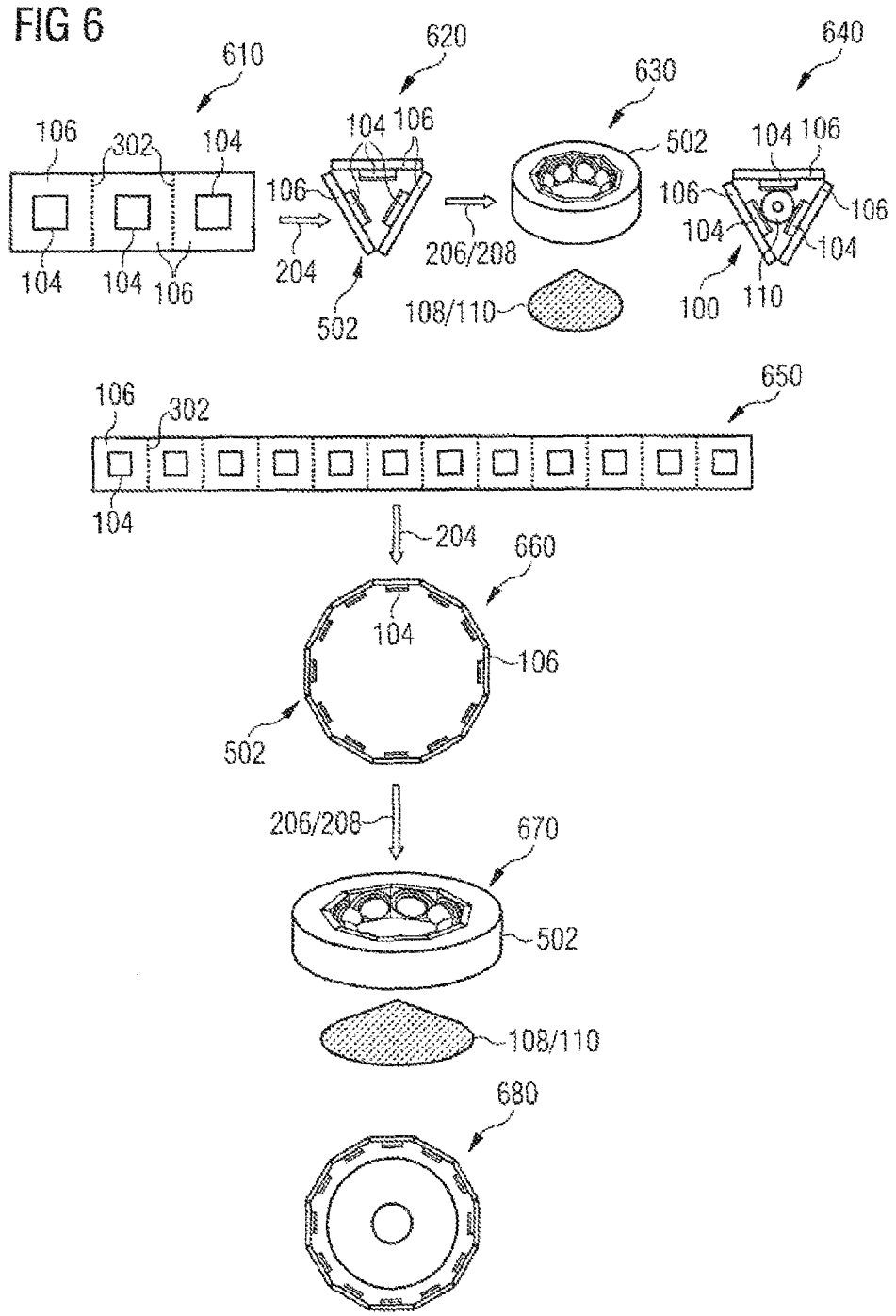
FIG. 6 shows optoelectronic component devices in accordance with various configurations.

FIG. 6 shows optoelectronic component devices in accordance with various configurations.

Different views 610, 620, 630, 640, 650, 660, 670, 680 of two different configurations of optoelectronic component devices 100 in the method 200 of producing an optoelectronic component device 100 are illustrated.

FIG. 5 illustrates a configuration of the first substrate 106 in which the number of optoelectronic components 104 on the first substrate 106 was increased by adaptation of the dimensioning of the first substrate 106.

FIG. 6, for illustration purposes, i.e. without restricting generality, illustrates two configurations (640, 680) in which the number of optoelectronic components 104 on the first substrate 106 is increased, wherein the height of the optoelectronic component device 100 is formed in an unchanged manner, i.e. in a constant fashion.

With regard to the indications concerning method steps 204, 206, 208, reference should be made to the description of the method 200 in the description of FIG. 2.

With regard to the indications concerning the optoelectronic components 104, the first substrate 106 and the reflector 110, reference is made to configurations from the descriptions of FIGS. 1 to 5.

In addition to and/or in a departure from the configurations from the descriptions of FIGS. 1 to 5, the reflector 110 can be designed as second substrate 108 or the second substrate 108 can be designed as the reflector 110—illustrated in the views 630, 670.

Arranging 206 the first substrate 106 on or above the second substrate 108 can be implemented in that case at the same time as arranging 208 the reflector 110 in the beam path of the electromagnetic radiation of the optoelectronic component 104.

The illustrated views 610, 620, 630, 640, 650, 660, 670, 680, without restricting generality, should be understood as illustration of the scalability of the optoelectronic component device 100. By way of example, the shape of the first substrate 106, the number of optoelectronic components 104 on or above the first substrate 106, the shape of the ring-shaped structure 502 and the configuration of the reflector 110 should be understood merely as an example for illustration purposes.

The dimensions of the first substrate 106 that forms the ring-shaped structure 502 can be varied such that the optoelectronic component device 100 comprises an application-specifically determined number of optoelectronic components 104.

A ring-shaped structure 502 can be formed in a first substrate 106 which has three or more optoelectronic components 104 on a common, first substrate 106, wherein the first substrate was folded such that the ends of the first substrate 106 have a partly or completely physical contact.

By way of example, the diameter of the ring-shaped structure 502 can be set by the dimensioning of the first substrate 106.

The number and/or the size of the optoelectronic components can be set, for example, scaled by the diameter of the ring-shaped structure 502.

By way of example, the luminance of the electromagnetic radiation which can be absorbed or provided by the optoelectronic component device 100 can be increased by the number of optoelectronic components 104.

By way of example, luminance of the optoelectronic component device 100 can be set by the number of optoelectronic components 104 of the component device 100.

The first substrate can be folded similarly to a spiral, i.e. it is possible to form a plurality of ring-shaped structures one above another with a single first substrate 106. As a result, by way of example, it is possible to increase the radiance in the optoelectronic component device, without increasing the number of first substrates 106 or the diameter of the ring-shaped structure 502.

As is illustrated in the views 620, 650, it is possible to form the optoelectronic components 104 on the first substrate 106 into ring-shaped structures 602.

The ring-shaped structures 502 with reflector 110 are illustrated in the respective third view 630, 640, 670, 680.

The concrete configuration of the reflector 110, for example, the size of the reflector 110 can be dependent on the configuration of the ring-shaped structures 502, for example, the geometrical shape of the ring-shaped structure 502 and/or the diameter of the ring-shaped structure 502.

The shape, the material composition, the design, the dimensioning, the arrangement and the number, of the first substrate 106, of the second substrate 108, of the reflector 110, and of the optoelectronic components 104 can be designed, for example, in accordance with a configuration from the description of FIGS. 1 to 5 and following figures.

Figure 7:
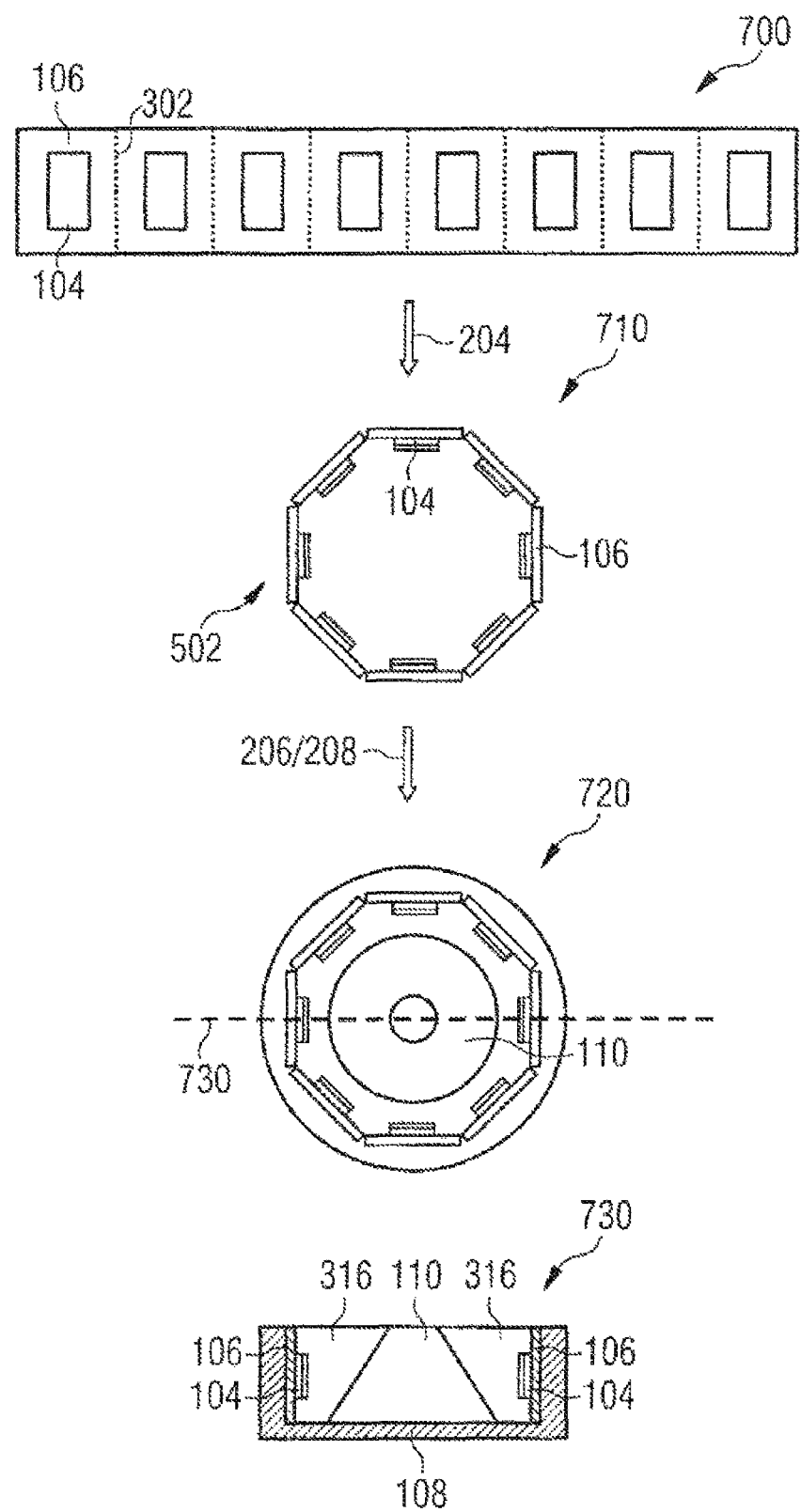
FIG. 7 shows an optoelectronic component device in accordance with various configurations.

FIG. 7 shows an optoelectronic component device in accordance with various configurations.

In addition or instead of the configurations in FIG. 6 that adapt, for example, scaling, the radiance of the provided electromagnetic radiation in the image plane 122 of the optoelectronic component device 100, the dimensions and/or the design of the optoelectronic components 104 can be application-specifically adapted.

Adapting the design of the optoelectronic components 104 can also be realized by one of the configurations from the descriptions of FIGS. 3 and 4, for example, by forming an optical lens on or above an LED.

The optoelectronic components 104 can have, for example, a rectangular, hexagonal, polygonal and/or circular geometrical shape of the radiation-providing surface and/or surface that absorbs radiation.

The shape, the material composition, the design, the dimensioning, the arrangement and the number, of the first substrate 106, of the second substrate 108, of the reflector 110, and of the optoelectronic components 104 can be designed, for example, in accordance with a configuration from the description of FIGS. 1 to 6 and following figures.

Figure 8:
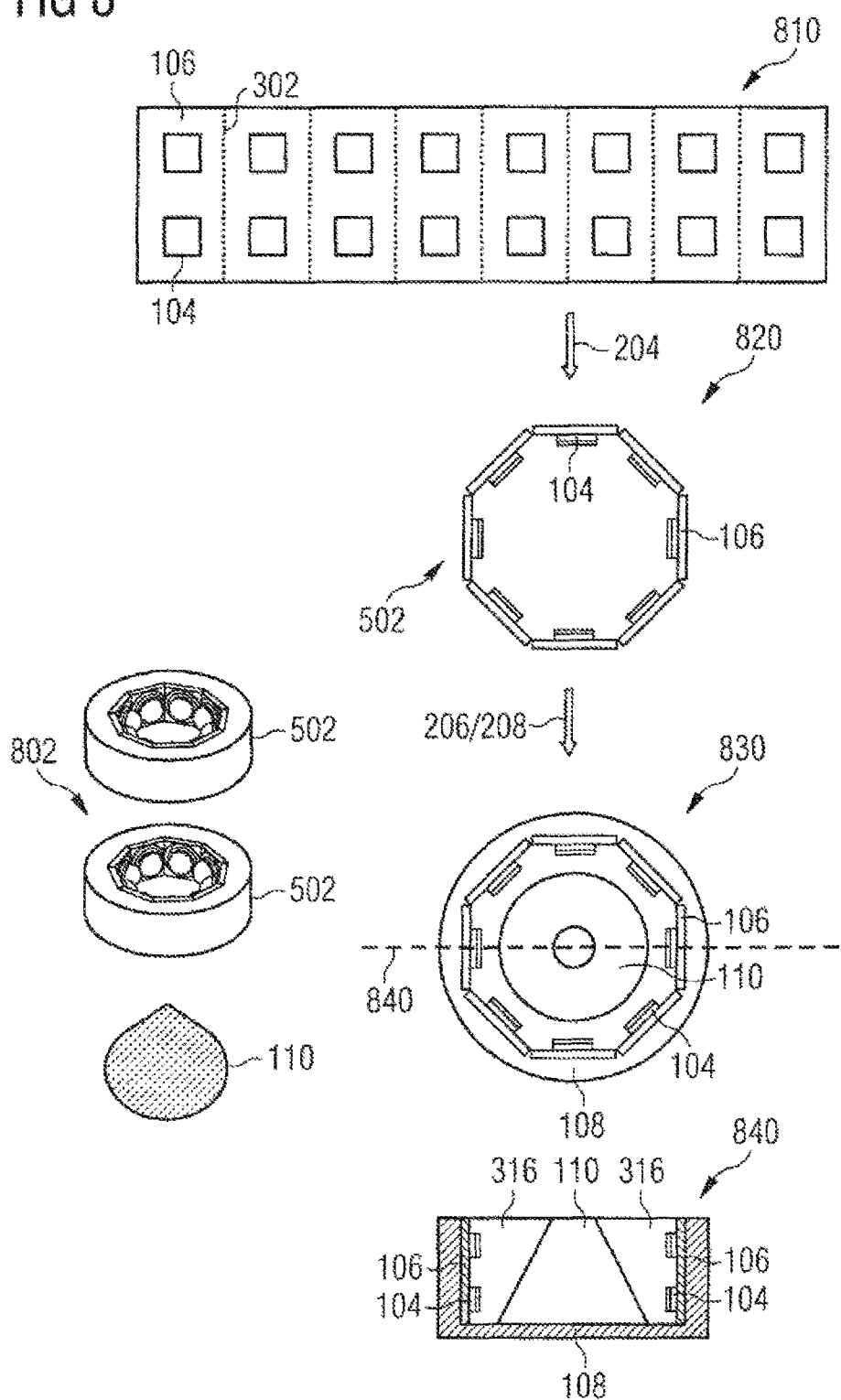
FIG. 8 shows an optoelectronic component device in accordance with various configurations.

FIG. 8 shows an optoelectronic component device in accordance with various configurations.

Different views 810, 820, 830, 840 of an optoelectronic component device 100 are illustrated.

In addition to or instead of the configuration from the descriptions of FIGS. 6 and/or 7, the electromagnetic radiation field of the optoelectronic component device can be scaled by a plurality of optoelectronic components 104 being arranged alongside one another on or above a common, first substrate 106.

The plurality of optoelectronic components are arranged with respect to the configuration from the description of FIGS. 1 to 7 such that the optoelectronic components 104 are arranged or discernible after the formation of the ring-shaped structure 502 vertically one above another, for example, in different series.

Further parameters of the optoelectronic component device 100 can be gathered from the configurations from the descriptions of FIGS. 1 to 7.

By arranging the optoelectronic components 104 one above another in the optoelectronic component device 100, it is possible to increase the radiance, for example, the luminance, of the electromagnetic radiation in the optoelectronic component device which can be absorbed and/or provided by the optoelectronic component, without increasing the diameter of the ring-shaped structure, for example, in accordance with one of the configurations from the descriptions of FIG. 5.

Forming a plurality of optoelectronic components 104 arranged one above another in the optoelectronic component device 100 can be implemented, for example, by arranging a further ring-shaped structure 502 on or above another ring-shaped structure 502—indicated in the view 802.

The plurality of ring-shaped structures 502 arranged one above another can have an identical or similar diameter and/or an identical or similar geometrical shape.

The diameter of adjacent ring-shaped structures 502 can also be different, however, for example, in a manner increasing or decreasing with respect to the second substrate 108.

In other words: when arranging 206 the first substrate on or above a second substrate, in some configurations it is also possible for the second substrate to be designed as a ring-shaped structure 502.

The shape, the material composition, the design, the dimensioning, the arrangement and the number, of the first substrate 106, of the second substrate 108, of the reflector 110, and of the optoelectronic components 104 can be designed, for example, in accordance with a configuration from the description of FIGS. 1 to 7 and following figures.

Arranging a plurality of optoelectronic components 104 one above another in the ring-shaped structure 502 can increase the total power of the optoelectronic component device 100 and additionally the power density of the reflector 110.

Figure 9:
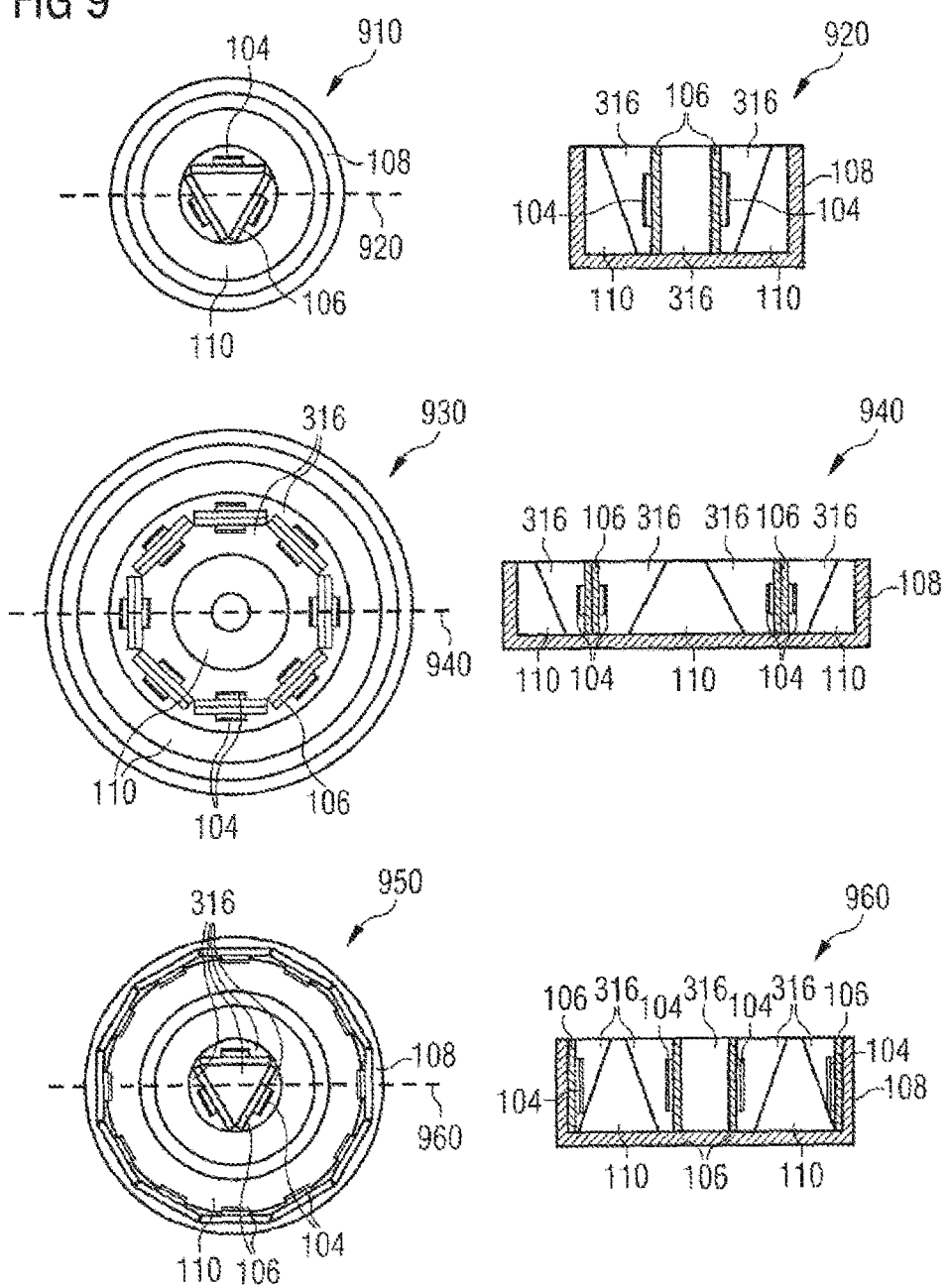
FIG. 9 shows different optoelectronic components in accordance with various configurations.

FIG. 9 shows different optoelectronic component devices in accordance with various configurations.

The illustration shows, in each case in plan views 910, 930, 950 and cross-sectional view 920, 940, 960, three different configurations 910, 930, 950 of optoelectronic component device 100 in accordance with various configurations.

The number of optoelectronic components 104 and the shape and/or the design of the optoelectronic components 104, of the first substrate 106 and of the reflector 110 can be designed to be similar or identical to one of the configurations from the description of FIGS. 1 to 8.

The surface taking up radiation and/or the radiation-providing surface of the optoelectronic components 104 can be oriented toward the geometrical center of the ring-shaped structure 502 and/or can be directed away from the geometrical center of the ring-shaped structure 502.

The geometrical center of a ring-shaped structure can be understood, for example, as an axis of symmetry, for example, of a rotational symmetry and/or of a point symmetry.

The optoelectronic components 104 can be arranged on the outer side of the first substrate 106 in the geometrical center of the ring-shaped structure 502.

In other words: the optoelectronic components 104 can be surrounded, for example, surrounded concentrically, by a reflector 110 in the optoelectronic component device 100.

In a further configuration 930 of the optoelectronic component device 100, optoelectronic components 104 on a first substrate 106 can concentrically surround, for example, a first reflector 110.

In addition, optoelectronic components 104 on a first substrate 106 can be surrounded, for example, surrounded concentrically by a second reflector 902.

The optoelectronic components 104 on a first substrate 106 can be arranged, for example, in a back-to-back arrangement.

However, the optoelectronic component device 100 can also be formed such that a plurality of ring-shaped structures 502 surround one or a plurality of reflectors 110, a ring-shaped structure 502 is surrounded by one or a plurality of reflectors 110, a ring-shaped structure 502 surrounds one or a plurality of ring-shaped structures 502 and/or is surrounded by one or a plurality of ring-shaped structures 502.

In other words: the plurality of optoelectronic components 104 on a first substrate 106, for example, in a ring-shaped structure 502, can surround a reflector 110 and/or can be surrounded by a reflector 110.

A configuration of an optoelectronic component device 100 in which optoelectronic components 104 in a ring-shaped structure 502 or ring-shaped arrangement 502 surround a reflector 110 and are additionally surrounded by a reflector 110 is illustrated in the view 950, 960.

By the configurations of the optoelectronic component device comprising a plurality of ring-shaped structures 502 and/or reflectors 110 arranged concentrically with respect to one another, it is possible to increase the radiance of the electromagnetic radiation of the optoelectronic component device 100.

Furthermore, the concentric arrangement of the optoelectronic components 104 and the arrangement of the reflector 110 can enable a compact design.

The shape, the material composition, the design, the dimensioning, the arrangement and the number, of the first substrate 106, of the second substrate 108, of the reflector 110, and of the optoelectronic components 104 can be designed, for example, in accordance with a configuration from the description of FIGS. 1 to 8 and following figures.

Figure 10:
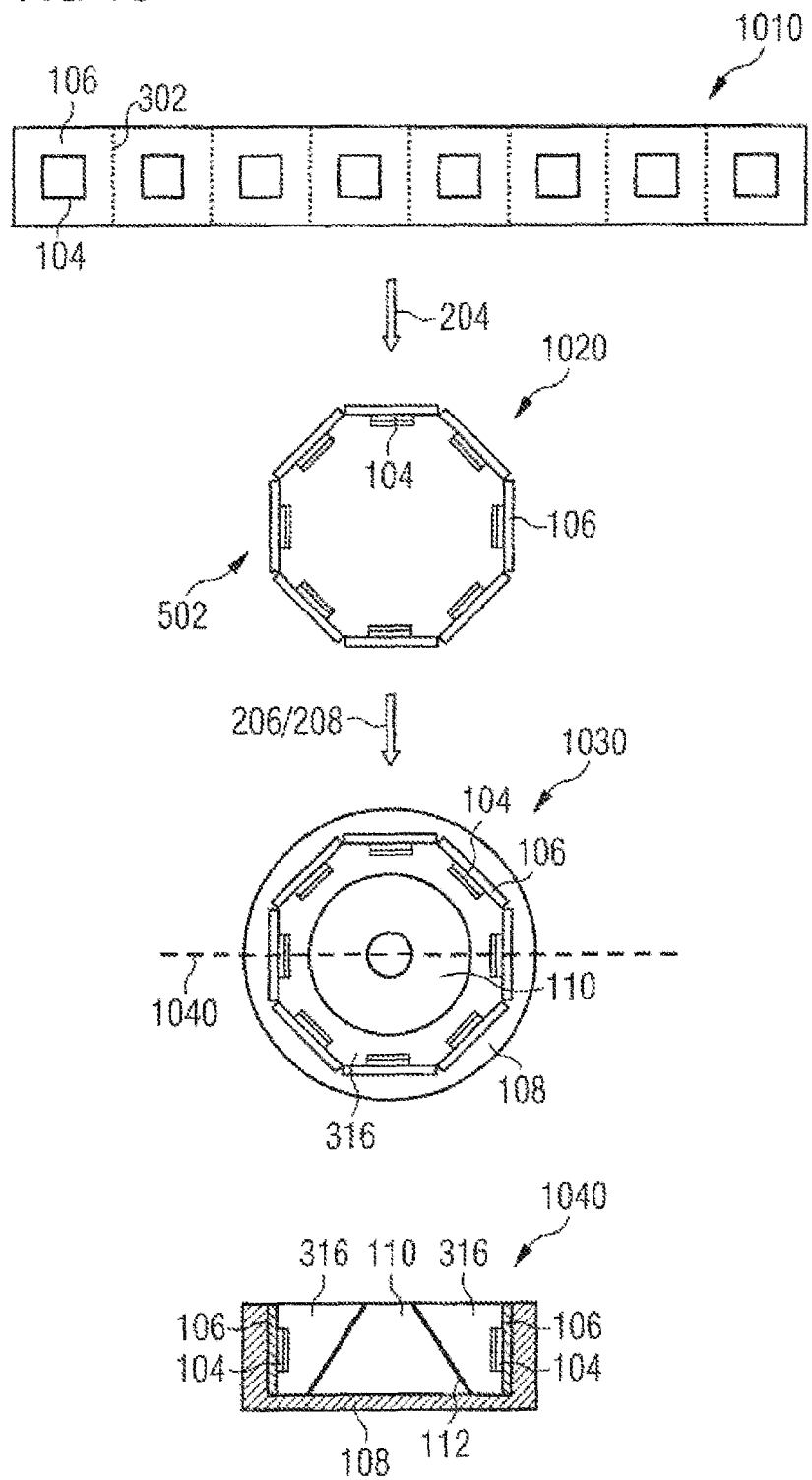
FIG. 10 shows an optoelectronic component device in accordance with various configurations.

FIG. 10 shows an optoelectronic component device in accordance with various configurations.

Different views 1010, 1020, 1030, 1040 of the optoelectronic component device 100 are illustrated.

Forming the optoelectronic component device 100 can be designed, for example, in a manner similar or identical to a configuration of the method 200 from the description of FIG. 2.

The optoelectronic component 104, the first substrate 106, the second substrate 108 and/or the reflector 110 having a reflective surface 112 can be designed or formed in terms of the geometrical shape, number and design in accordance with one of the configurations from the description of FIGS. 1 to 9.

The first view 1010 illustrates a plurality of optoelectronic components 104 on a common, first substrate 106.

A second view 1020 illustrates a plan view of a configuration of a folded, first substrate 106.

The flexible substrate 106 with optoelectronic component 104 can be folded, for example, such that the flexible substrate 106 and the optoelectronic components 106 form an at least partly concentric arrangement, for example, partly ring-shaped structure 502.

The optoelectronic components 104 can be arranged, for example, on the inner side of the ring structure 502.

A third view 1030 illustrates a plan view 1030 of the ring structure 502 of the second view 1020 in a housing 108.

The housing 108 can be understood as a second substrate 108, wherein the housing 108 can have a cavity, in which the first substrate 106 with optoelectronic component 104 can be arranged, for example, can be fixed, for example, at or on the side walls of the housing 108 (illustrated).

The reflector 110 can be a part of the second substrate 108 or the second substrate 108 can be a part of the reflector 110.

Arranging 208 the reflector 110 in the beam path of the electromagnetic radiation of the optoelectronic components 104 can be designed to take place at the same time as arranging 206 the first substrate 106 on or above the second substrate 108, for example, can be implemented as a single process.

The housing 108 can have, for example, a geometrical shape similar or identical to a ring, a hollow cylinder, a blind hole, a cone, a truncated cone, a prism or a similar geometrical shape, wherein the side faces can have a straight, convex, concave or irregularly shaped surface.

The first substrate 106 with optoelectronic components 104 can be closely fixed, for example, adhesively bonded, clamped, plugged or screwed, for example, on the inner side of the ring, hollow cylinder or blind hole.

The first substrate 106 can connect to the housing 108, for example, closely, for example, in a force-locking manner, in a positively locking manner, cohesively.

A further view 1040 illustrates a cross-sectional view of the third view 1030—the sectional axis 1040 is indicated by a dashed line 1040 in the third view 1030.

The reflector 110 can be designed in a shape similar or identical to one of the configurations of the reflectors 110 from the descriptions of FIG. 18, for example, similar or identical to a truncated cone.

The shape, the material composition, the design, the dimensioning, the arrangement and the number, of the first substrate 106, of the second substrate 108, of the reflector 110, and of the optoelectronic components 104 can be designed, for example, in accordance with a configuration from the description of FIGS. 1 to 9 and following figures.

FIG. 11 shows different optoelectronic component devices in accordance with various configurations.

The illustration shows two configurations 1110, 1120 of optoelectronic component device, in accordance with various configurations.

Plan views 1110, 1120, 1030, 1140, 1150 and a cross-sectional view 1160 of an optoelectronic component device are illustrated.

The illustrated configurations should be understood merely as examples for illustrating the principle.

One optoelectronic component 104 or a plurality of optoelectronic components 104 can comprise a wavelength-converting structure, a lens and/or a diaphragm, for example, in a manner similar or identical to the optoelectronic component 312 of a configuration from the description of FIG. 3—illustrated in the view 1120, 1140.

The first substrate 106 can be shaped such that after the process of forming 204 a ring-shaped arrangement 502 and/or ring-shaped structure 502, a geometrical shape is formed in a manner similar or identical to a ring-shaped structure 502 having a base 108.

The base 108 of the ring-shaped structure 502 can be formed, for example, by close, for example, force-locking, positively locking, cohesive, connection at the edges 1102 of the first substrate 106.

The base 108 of the ring-shaped structure 502, the base being shaped from the first substrate 106, can be designed or understood, for example, as the second substrate 108, wherein the first substrate 106 and the second substrate 108 can be understood as different regions of a common substrate in the view 1100.

In other words: the first substrate 106 can be formed as a linear substrate having triangular additions 108. After folding the first substrate 106 and turning over the triangular additions 108, the triangular additions 108 can form the second substrate 108 or the base 108 of the ring-shaped structure 502. A further mechanical reshaping of the first substrate 106 and/or of the second substrate 108 can be optional. The reflector 110 in accordance with various configurations can be positioned in the ring-shaped structure, for example, in the center, for example, on or above the triangular additions 108, i.e. the second substrate 108.

The shaped base 108 can, for example, also be understood as a baseplate 108. The baseplate 108 can have mechanical and also optical functions.

A mechanical function can be, for example, the stabilization of the ring-shaped structure 502. An optical function can be, for example, formation of an optical component, for example, of a reflector 110 from the baseplate 108.

The base 108 of the ring-shaped structure 502 can be formed geometrically, for example, as a closed area or an area similar or identical with a hole, for example, a ring.

The folded structure 502 with base 108 can have, for example, a geometrical shape similar or identical to a ring, a hollow cylinder, a blind hole or a can.

A reflector 110 can be arranged in the cavity 304, for example, concentrically with respect to the first substrates 106 of the folded structure 302.

The shape, the material composition, the design, the dimensioning, the arrangement and the number, of the first substrate 106, of the second substrate 108, of the reflector 110, and of the optoelectronic components 104 can be designed, for example, in accordance with a configuration from the description of FIGS. 1 to 10 and following figures.

FIG. 12 shows an optoelectronic component device in accordance with various configurations.

Various views 1210, 1220, 1230, 1240 illustrate an optoelectronic component device 100 in the method 200 of producing an optoelectronic component device 100.

In addition to or instead of the configuration of the folding 204 of the first substrate 106 in FIG. 11, the ring-shaped structure 502 with base 108 can be formed from a planar substrate by folding the substrate, for example, by folding 204 at the folding lines 1202.

The folding lines 1202 can closely connect to one another, for example, cohesively in a positively locking manner and/or in a force-locking manner.

The base 108 of the folded ring-shaped structure 502 can be understood as the second substrate 108, wherein the first substrate 106 and the second substrate 108 can be different regions of a common substrate.

The folded ring-shaped structure 502 in the view 1220 can have one of the following geometrical shapes as a basic surface 108: a circle, a triangle, a square, a rectangle, an ellipse, a polygon, a ring.

The folded ring-shaped structure 502 with base 108 can have, for example, a geometrical shape, similar or identical to a ring, a hollow cylinder or a blind hole.

The shape, the material composition, the design, the dimensioning, the arrangement and the number, of the first substrate 106, of the second substrate 108, of the reflector 110, and of the optoelectronic components 104 can be designed, for example, in accordance with a configuration from the description of FIGS. 1 to 11 and following figures.

FIG. 13 shows an optoelectronic component device in accordance with various configurations.

Different views 1310, 1320, 1330, 1340 in the method 200 of producing an optoelectronic component device 100 are illustrated.

The shape, the material composition, the design, the dimensioning, the arrangement and the number, of the first substrate 106, of the second substrate 108, of the reflector 110, and of the optoelectronic components 104 can be designed, for example, in accordance with a configuration from the description of FIGS. 1 to 12 and following figures.

The first view 1310 illustrates a plurality of optoelectronic components 104 on a common, first substrate 106.

A second view 1320 illustrates a plan view of a configuration of a folded, first substrate 106.

The first substrate 106 can be folded at folding lines 1202, for example.

The base 108 of the folded ring-shaped structure 502 can be understood as the second substrate 108, wherein the first substrate 106 and the second substrate 108 can be different regions of a common substrate.

The folded ring-shaped structure 502 can have a cavity 1304.

The folded ring-shaped structure 502 can have one of the following geometrical shapes as a basic surface 108: a circle, a triangle, a square, a rectangle, an ellipse, a polygon, a ring, i.e. can be formed as an area provided with a hole.

The flexible substrate 106 with optoelectronic components 104 can be folded, for example, such that the flexible substrate 106 and the optoelectronic components 104 form an at least partly concentric arrangement.

The optoelectronic components 104 can be arranged, for example, on the inner side in the cavity 316 of the folded ring-shaped structure 502.

A third view 1330 illustrates a plan view 1330 of the folded ring-shaped structure 502 from the second view 1320 with reflector 110 in the cavity 316.

The folded ring-shaped structure 502 can have, for example, a geometrical shape similar or identical to a ring, a hollow cylinder or a blind hole.

The edges 1302 of the first substrate 106 can, for example, be closely fixed to one another, for example, can connect cohesively in a force-locking manner, in a positively locking manner, for example, can be plugged, clamped, adhesively bonded, screwed or riveted.

A reflector 110 can be arranged in the cavity 316, for example, concentrically with respect to the first substrates 106 of the folded ring-shaped structure 502.

A further view 1340 illustrates a cross-sectional view of the third view 1330—the sectional axis 1340 is indicated by a dashed line 1340 in the third view 1330.

The reflector 110 can have the shape similar or identical to a truncated cone.

The reflective surface 112 of the reflector can comprise or be formed from, for example, the same substance as or a different substance than the reflector 110.

The cross-sectional view 1340 furthermore illustrates that the first substrate 106 can be shaped such that the orientation of the optoelectronic component 104 relative to the reflective surface 112 of the reflector 110 can be altered.

As a result, it is possible to set the angle 118 of incidence of electromagnetic radiation on the reflective surface 112, without changing the shape of the reflective surface 112 of the reflector 110 for this purpose.

The common substrate (from the view 1310) can be shaped such that adjacent first substrates 106 terminate flush with one another or a gap (not illustrated) is formed between the first substrates 106 with optoelectronic components 104.

Orientation of the optoelectronic component 104 on the first substrate 106 with respect to the reflector 110 can be set once, discretely or continuously variably.

Continuously variable setting can be set by a servomotor, for example.

Setting once can be set by a close connection of the edges 1302 of the first substrate 106, for example.

FIG. 14 shows an optoelectronic component device in the method of producing an optoelectronic component device in accordance with various configurations.

The views 1410, 1420 illustrate two configurations of a second substrate 108 without optoelectronic components, that is to say before the process of arranging 206 the optoelectronic components 308 on or above the second substrate 108.

The second substrate 108 can be designed, for example, as a ring (1410), i.e. with a hole or have an opening, or as a closed area (1420).

The second substrate 108 can have, for example, a flat, for example, planar surface on or above which the optoelectronic components 104 can be arranged.

Optoelectronic components 104 can be installed, i.e. arranged and fixed in the optoelectronic component device 100 on or above the second substrate 108, at which optoelectronic components the electromagnetic radiation 102 is absorbed and/or provided from the side of the optoelectronic component 308 with respect to the fixing of the optoelectronic component 308.

The optoelectronic component 308 can be designed as an optoelectronic component 308 providing radiation laterally and/or taking up radiation laterally, for example, a SideLED (Sidelooker) similar or identical to one of the configurations from the description of the optoelectronic component 308 in FIG. 3.

In an optoelectronic component 308 providing radiation laterally, the housing 106 of the optoelectronic component 104 can be regarded as the first substrate 106.

In a configuration with singulated optoelectronic components 308 providing radiation laterally and/or taking up radiation laterally, a ring-shaped structure 502 can be formed by arranging 502 the optoelectronic components 308 in a ring-shaped fashion on or above the second substrate 108—illustrated in the views 1430, 1440.

FIG. 15 shows an optoelectronic component device in accordance with various configurations.

Various views 1510, 1520, 1530, 1540, 1550 illustrate an optoelectronic component device 100 in the method 200 of producing an optoelectronic component device.

The shape, the material composition, the design, the dimensioning, the arrangement and the number, of the first substrate 106, of the second substrate 108, of the reflector 110, and of the optoelectronic component 104 can be designed, for example, in accordance with a configuration from the description of FIGS. 1 to 14 and following figures.

Optoelectronic components 104, 1502 of different designs, for example, having different optoelectronic properties, for example, different color valences of provided electromagnetic radiation can be arranged on or above the first substrate 104.

The different optoelectronic components 104, 1502 can have an ordered, for example, regular, arrangement or a disordered, for example, irregular, arrangement on or above the first substrate 106—illustrated in the views 1510, 1520.

An arrangement, for example, a configuration of optoelectronic components 104 can comprise, for example, a sequence, for example, a spacing and the positions of the optoelectronic components 104, 1502 of one design on the first substrate 106.

The optoelectronic components 104, 1502 having different optoelectronic properties can be applied, for example, alternately, for example, in an alternating manner on the first substrate 106.

FIG. 16 shows schematic illustrations of optoelectronic component devices in the method of producing an optoelectronic component device in accordance with various configurations.

The shape, the material composition, the design, the dimensioning, the arrangement and the number, of the first substrate 106, of the second substrate 108, of the reflector 110, and of the optoelectronic components 104 can be designed, for example, in accordance with a configuration from the description of FIGS. 1 to 15 and following figures.

In addition to or instead of the configurations from the description of FIG. 15, the substrate can have a differently geometrical shape—illustrated in the views 1610, 1620, 1630—and/or have two or more optoelectronic components 1502, 1602, 1604 of different designs, for example, have optoelectronic components which provide electromagnetic radiation having different color valences, for example, a red LED 1502, a blue LED 1602, a green LED 1604. The designation, for example, red LED 1502, can designate the color valence of the provided electromagnetic radiation.

The different color valences can be realized, for example, by different wavelength-converting structures of the optoelectronic components of different designs, for example, by different luminophore layers.

View 1620 furthermore illustrates a close connection 1606 of adjacent first substrates to one another.

FIG. 17 shows an optoelectronic component device in the method of producing an optoelectronic component device in accordance with various configurations.

The schematic cross-sectional views 1710, 1720, 1730, 1740, 1750, 1760 of the optoelectronic component device 100, for illustration purposes without restricting generality, illustrate different configurations with regard to changing the angle 118 of incidence of provided electromagnetic radiation 102 in the image plane 122 of the optoelectronic component device 100 without changing the shape and/or the reflectivity of the reflector 110.

By deflecting the first substrate 106, it is possible to form a further degree of freedom, for example, to adapt the emission characteristic of the deflected electromagnetic radiation 114 and/or the efficiency of the optoelectronic component device 100.

The shape, the material composition, the design, the dimensioning, the arrangement and the number, of the first substrate 106, of the second substrate 108, of the reflector 110, and of the optoelectronic components 104 can be designed, for example, in accordance with a configuration from the description of FIGS. 1 to 16 and following figures.

View 1710 shows a plan view of a partly completed optoelectronic component device 100 in the method 200 of producing an optoelectronic component device 100.

View 1750 shows a plan view of a partly completed optoelectronic component device 100 in the method 200 of producing an optoelectronic component device 100 after forming 204 a ring-shaped arrangement 502 and/or ring-shaped structure 502 of optoelectronic components 104 and arranging 208 a reflector 110 in the beam path of the electromagnetic radiation of the optoelectronic components 104.

The views 1720, 1730, 1740, 1760 illustrate cross-sectional views of the partly completed optoelectronic component after forming 204 a ring-shaped arrangement 502 and/or ring-shaped structure 502 of optoelectronic components 104 and arranging 208 the reflector 110 in the beam path of the electromagnetic radiation of the optoelectronic components.

The view 1720 illustrates an arrangement of the optoelectronic component 104 on the first substrate 106 with a reflector 110 similar or identical to a cone 110 or prism 110, similar or identical to one of the configurations from the description of FIGS. 1 to 16.

The reflector 110 can be arranged on or above a second substrate 108.

The surface normal 1702 of the optoelectronic component 104 can be oriented parallel to the surface normal 1702 of the first substrate 106 and perpendicular to the surface normal 1706 of the second substrate 108.

Furthermore, the optoelectronic component device 100 can comprise a heat sink 1704. The heat sink 1704 can be fitted, for example, on the optically inactive underside of the second substrate 108, for example, in physical, thermally conductive contact with the second substrate 108.

The dissipation of heat from the optoelectronic component device can be realized, in principle, via the base 108 or the baseplate 108 and/or via the ring circumference in a lateral direction.

In other words: for the purpose of heat dissipation the heat sink 1704 can be arranged in thermal contact with the baseplate 108 (illustrated) and/or at the lateral surfaces of the ring-shaped structure 502 (illustrated in view 2820).

Furthermore, the optoelectronic component device 100 can comprise further components, not illustrated, for example, further optical components, for example, lenses, diaphragms, converter elements, and/or electrical components, for example, to electrically control the optoelectronic components 104, and/or further optoelectronic components 104, for example, in a concentric arrangement with respect to the illustrated optoelectronic components 104, for example, in accordance with one of the configurations in FIG. 9.

The surface normal 1702 of the optoelectronic component 104 and of the first substrate 106 can have a direction component parallel to one of the direction components of the surface normal 1706 of the second substrate 108.

Forming the parallel direction component can be implemented, for example, by turning up 204, bending 204 and/or folding 204 a region of the common substrate, i.e. of the first substrate 106.

The views 1730, 1740 illustrate orientations of the surface normal 1702 of the first substrate 106 and/or of the optoelectronic component 104 with respect to the surface normal 1706 of the second substrate 108, wherein the surface normal 1702 of the first substrate 106 and/or of the optoelectronic component 104 have a direction component parallel to the surface normal of the second substrate 108.

The surface normals 1702, 1706 can be at an angle relative to one another, wherein the angle can have an absolute value of approximately 0° to approximately 90°.

In other words: in one example of the optoelectronic component device 100, by the tilting angle of the first substrate 106 with respect to the second substrate 108, a further degree of freedom can be obtained with respect to the angle 118, 120 of incidence of the electromagnetic radiation provided into the image plane 122.

In one example—illustrated in the views 1750, 1760, it is possible to deflect at least one optoelectronic component of the plurality of optoelectronic components 104 with respect to the first substrate 106—illustrated by the arrows of the surface normal 1702 of the first substrate 106 and the surface normal 1708 of the optoelectronic component 104.

It is thereby possible to realize a change in the angle 118 of incidence of the electromagnetic radiation in the image plane 122 of the optoelectronic component device 100, without deflecting the first substrate 106 with respect to the second substrate 108 for this purpose.

Deflecting at least one optoelectronic component 104 of the plurality of optoelectronic components 104 with respect to the first substrate 106 can be, for example, inclining, tilting, turning and/or rotating the at least one optoelectronic component 104.

Deflecting optoelectronic components 104, for example, in optoelectronic components 104, for example, LEDs in which the provided electromagnetic radiation has an asymmetrical field distribution with respect to the direction of propagation can be suitable, for example, by squint lenses to realize a predefined field distribution of the electromagnetic radiation.

Changing the angle 118 of incidence, for example, by deflecting the first substrate 106 (configurations in accordance with the views 1720, 1730, 1740) and/or by deflecting the optoelectronic components 104 with respect to the first substrate 106 (configurations in accordance with the view 1760) can be set in a continuous or discontinuous fashion, for example, in a discrete fashion.

FIG. 18 shows different optoelectronic component devices comprising different reflectors in accordance with various configurations.

The illustrated further components of the optoelectronic component device 100, for example, the first substrate 106, the second substrate 108 or the number and/or the configuration of the optoelectronic component 104 should be understood as examples illustrating the optoelectronic component device 100.

The shape, the material composition, the design, the dimensioning, the arrangement and the number, of the first substrate 106, of the second substrate 108, of the reflector 110, and of the optoelectronic components 104 can be designed, for example, in accordance with a configuration from the description of FIGS. 1 to 17 and following figures.

The schematic cross-sectional views 1810, 1820, 1830, 1840, 1850 illustrate differently shaped reflectors 110 to illustrate the essential principle of the optoelectronic component device 100.

The illustrated shapes of the reflectors 110 can be understood as prisms, rotationally symmetrical shapes and/or mirror-symmetrical shapes.

The illustrated shapes of the reflectors 110 can also be understood as different cross-sectional views of a reflector 110.

The first view 1810 illustrates an optoelectronic component device 100 comprising a reflector 110, wherein the reflector 110 can have, for example, the shape of a prism or of a cone.

The second view 1820 illustrates an optoelectronic component device 100 comprising a reflector 110, wherein the reflector 110 can have, for example, the shape of a prism, for example, of a truncated pyramid or of a truncated cone.

The third view 1830 illustrates an optoelectronic component device 100 comprising a reflector 110, wherein the reflector 110 can have, for example, the shape of a prism or of a cone, wherein the side faces of the prism or of the cone can be provided in a convex fashion, for example, as a convex mirror.

The fourth view 1840 illustrates an optoelectronic component device 100 comprising a reflector 110, wherein the reflector 110 can have, for example, the shape of a prism or of a cone, wherein the side faces of the prism or of the cone can be provided in a concave fashion, for example, as a concave mirror.

The fifth view 1850 illustrates an optoelectronic component device 100 comprising a reflector 110, wherein the reflector 110 can have, for example, the shape of a multipartite reflector 110, for example, of a multipartite prism or of a multipartite cone, for example, in a manner similar to facets or a reflector having facet-like surface segments.

With standardized light sources, i.e. by identical ring-shaped structures 502, a variable emission characteristic of the optoelectronic component device 100 can be set by the different configurations 1810, 1820, 1830, 1840, 1850 of the reflector 110.

FIG. 19 shows an optoelectronic component device comprising different reflectors in accordance with various configurations.

The reflector 110 can have at least one differently shaped regions 1902, 1904 in a vertical direction with respect to the second substrate 108, for example, having a different geometrical shape with respect to incident electromagnetic radiation 102 with a polarization, for example, having a different reflectivity, for example, a different roughness and/or material composition of the individual regions 1902, 1904.

The individual regions 1902, 1904 of the reflector can have, for example, an identical or different shape, for example, in a manner similar or identical to one of the configurations from the description of FIG. 18.

The schematic cross-sectional views 1910, 1920 illustrate different optoelectronic component devices 100 comprising different shaped reflectors 110.

The illustrated shapes of the reflectors 110 can be understood, for example, as prisms, rotationally symmetrical and/or point-symmetrical shapes.

The illustrated further components of the optoelectronic component device 100, for example, the first substrate 106, the second substrate 108 or the number and/or the configuration of the optoelectronic component 104 should be understood as examples illustrating the optoelectronic component device 100.

The second view 1920 illustrates an optoelectronic component device 100 comprising a reflector 110, wherein the reflector can have differently reflective regions 1902, 1904.

The optoelectronic component device 100 can comprise, for example, a reflector 110 having differently reflective region 1902, 1904 if the optoelectronic component device 100 comprises optoelectronic components 104 of different designs and/or has specially arranged optoelectronic components 104 one on top of another, for example, one above another.

In one example of an optoelectronic component device 100 comprising optoelectronic components 104 arranged one above another, a different reflectivity for electromagnetic radiation having at least one direction of polarization may be required, for example, for the lower one of the two optoelectronic components 104, illustrated in view 1920, than for the upper optoelectronic component 104 of the optoelectronic components 104 arranged one above another.

The different reflectivity can be realized, for example, by a reflector having differently reflective regions 1902, 1904.

FIG. 20 shows different optoelectronic component devices comprising different reflectors in accordance with various configurations.

The views 2010, 2020 show schematic cross-sectional views of optoelectronic component devices 100 comprising different reflectors 110.

The reflector 110 can be designed to be semitransparent for a wavelength range of the provided electromagnetic radiation 102—illustrated in the view 2010.

One part 114 of the provided electromagnetic radiation can be deflected by the reflector 110 into the image plane and a further part 2002 of the same wavelength range of the electromagnetic radiation 2002 can be passed on, for example, transmitted, by the reflector 110.

As a result, it is possible to form an optoelectronic component device 100 having bidirectional deflection of the electromagnetic radiation, for example, an omnidirectionally emitting optoelectronic component device 100.

One part 114 of the provided electromagnetic radiation can be deflected by the reflector 110 into the image plane 122 and a further part 2004, for example, in a different wavelength range of the electromagnetic radiation 102, can be passed on by the reflector 110—illustrated in the view 2020. As a result, a selection of the deflected electromagnetic radiation 114, for example, a chromatic selection, can be effected by the reflector 110.

One part 114 of the provided electromagnetic radiation can be deflected by the reflector 110 into the image plane 122 and another part (not illustrated), for example, having a different direction of polarization of the electromagnetic radiation 102, can be at least partly passed on by the reflector 110. As a result, a selection of the direction of polarization of the deflected electromagnetic radiation 114, for example, a selection of the polarization, can be effected by the reflector 110.

The heat sink 1704 can have lamellae, for example, wherein the lamellae can have a larger surface area and/or comprise or be formed from a substance having, for example, a higher thermal conductivity than the second substrate 108 or the housing 108.

FIG. 21 shows an optoelectronic component device comprising a totally reflecting reflector in accordance with various configurations.

An essential distinguishing feature of the optoelectronic component device 100 illustrated in the views 2110, 2120, 2130, 2140, 2150 with respect to the configurations from the descriptions of FIGS. 1 to 20 is the configuration of the reflector 110.

The reflector 110 can be designed as a reflector 110 having a totally reflective surface 112.

In other words: the reflector 110 can be designed as an inverse shape with respect to the reflectors 110 of the configurations from the descriptions of FIGS. 1 to 20.

In other words: the reflector 110 of the configuration in FIG. 21 can be understood as a geometrical negative shape of one of the reflectors 110 of the configurations from the descriptions of FIGS. 1 to 20.

The negative shape of the reflector 110 can be formed, for example, by volume potting of a reflector 110 of a configuration from the descriptions of FIGS. 1 to 20 with a formable substance and/or substance mixture, for example, by potting with a silicone, an epoxy, a polycarbonate or the like.

The total reflection can take place at the reflective surface 112, wherein the totally reflective reflector 110 comprises or is formed from a substance having a refractive index which is approximately greater than the refractive index of the substance or substance mixture adjoining the reflective surface 112. The angle 118 of incidence of the electromagnetic radiation should be greater than the critical angle of total reflection.

FIG. 22 shows an optoelectronic component device in accordance with various configurations.

The schematic illustration 2210, 2240 illustrate different types of reflectors 110 which can be used to set the angle 118 of incidence of the provided electromagnetic radiation 102 on the reflective surface 112 of the reflector 110.

The first schematic view 2210 illustrates a configuration of an optoelectronic component device 100 comprising a reflector 110 having a variable shape.

The reflector 110 can comprise or be formed from a formable substance, for example, wherein the reflector 110 can have a formable region 2202 by the formable substance and/or formable substance mixture of the reflector.

A formable substance or a formable substance mixture can have, for example, a modulus of elasticity similar or identical to a gel or a rubber.

In other words: the reflector 110 can have geometrical flexible reflector flanks, for example, similar or identical to a rubber skin.

The formable region 2202 of the reflector 110 can be altered, for example, by a mechanical force, for example, a tensile force or a compressive force on the reflector 110, for example, a change in the gas pressure in the reflector 110 and/or the cavity 316 such that the reflector can form differently reflective shapes—illustrated in the views 2220, 2230.

Alteration of the shape of the reflective surface 112 can be implemented, for example, by introduction of a mechanical pin and/or a change in the pressure in the reflector, for example, in a manner similar or identical to one of the configurations from the description of FIG. 21.

By a variable reflector 110 it is possible to form continuously variably different reflector profiles, that is to say different angles 118 of incidence on the reflective surface 112 of the reflector 110. The reflective surface can have or form a concave, linear or convex shape, for example. As a result, it is possible to set different beam shapes and illumination cones in the image plane 122 of the optoelectronic component device.

The reflective surface 112 of the reflector 110 can comprise or be formed from a thin metal film, for example. The metal film can be deformed, for example, by a reduced pressure or an excess pressure in the interior of the reflector 110 and/or by a mechanism in the interior of the reflector 110, for example, in a manner similar or identical to an expanding mechanism of a dowel.

By a temporal change in the shape of the reflector, for example, by a temporal change in the gas pressure in the reflector 110, it is possible to form, for example, a temporal variation of the emission characteristic and/or detection characteristic in an optoelectronic component device 100.

The formable region 2202 of the reflector can lead to a change in the curvature, i.e. in the angle 118 of incidence of the provided electromagnetic radiation 112, of the reflective surface 112.

In other words: The beam path of the deflected electromagnetic radiation 2204, 2206 can be altered by the formable region 2202 of the reflector 110. The concrete influence of the formable region 2202 can be dependent on the shape of the reflector 110 and the shape of the formable region 2202, for example, in accordance with different configurations of the reflectors 110 in FIG. 18.

The schematic views 2240, 2250 illustrate a further configuration of a reflector 110 having a variable reflectivity of the reflective surface 112.

The reflective surface 112 of the reflector 110, that is to say the reflector flanks, can have reflective, movable segments 2208, 2212. In other words: movable, for example, deflectable, reflective segments 2208, 2212 can be arranged on the surface of the reflector 110, from the surface of which segments the incident electromagnetic radiation 102 can be reflected, for example, similar or identical to movable mirrors.

The movable segments 2208, 2212 can be designed or formed, for example, in a piezoelectric fashion in a microelectromechanical fashion, for example, as microelectromechanical systems (MEMS), for example, as flexible reflector flanks or facets with piezo-motors.

By the reflective, movable segments 2208, 2212, it is possible to alter the orientation of the reflective surface 112 with respect to the non-movable part of the reflector 110, for example, the suspension of the movable segments (not illustrated).

By way of example, without restricting generality, different orientations 2208, 2112 of the movable segments are illustrated in the view 2250, an enlargement of a region of the reflective surface 112 of the reflector 110 in the view 2240.

The segments 2208, 2212 can be deflected singularly, for example, individually and/or collectively, for example, in a correlated manner.

Deflecting the segments 2208, 2212 can comprise, for example, rotating, lifting and/or lowering the segments 2208, 2112.

By the reflective, movable segments at the surface 112 of the reflector 110, the angle 118 of incidence of the provided electromagnetic radiation 102 on the reflective surface 112 of the reflector 110 can be set dynamically and locally, for example, can be adapted to different illumination scenarios, for example, different operating modes of the optoelectronic component device 100, for example, can be altered in the course of operation of the optoelectronic component device.

The shape and curvature of a reflector 110 having reflective, movable segments can thereby be greatly altered within short distances. As a result, it is possible to produce or set reflectors which would not be manufacturable, or would be manufacturable only in a complex manner, as a genuine geometrical shape. A wide variety of application-specifically optimized beam shapes and illumination cones can be made possible with these reflector profiles that can be set continuously variably.

The illustration furthermore shows a different emission characteristic of deflected electromagnetic radiation 2204, 2206 depending on the position of the incident electromagnetic radiation 102 on the reflective surface 112 of the reflector 110.

Figure 23:
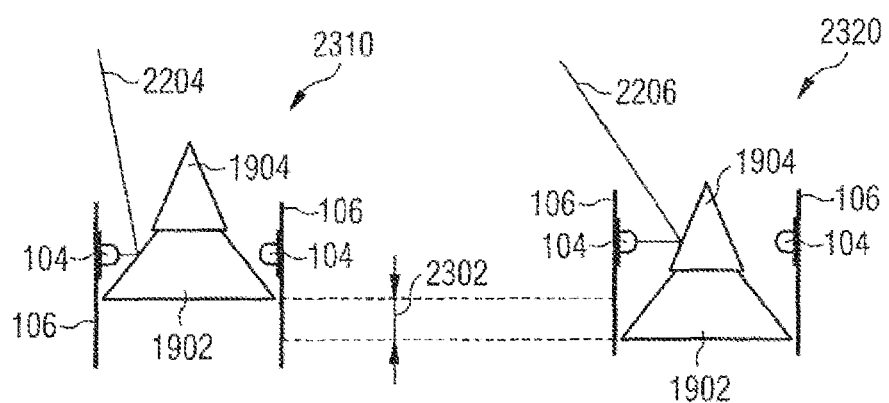
FIG. 23 shows an optoelectronic component device with a movable reflector in accordance with various configurations.

FIG. 23 shows an optoelectronic component device comprising a movable reflector in accordance with various configurations.

In addition to the configurations from the description of FIGS. 1 to 22, the reflector 110 can be designed or formed in a movable fashion—illustrated in the views 2310, 2320, without restricting generality, as vertical deflection 2302 of the reflector 110.

A deflection 2302 of the reflector 110 can be designed as rotating, inclining, tilting, pivoting and/or displacing the reflector 110 with respect to the second substrate 108 and/or the first substrate 106.

The reflector 110 can have regions having different reflectivities, for example, in accordance with one of the configurations from the description of FIGS. 18 to 22—a configuration of the reflector 110 in a manner similar or identical to one of the descriptions of FIG. 19 is illustrated.

In other words: the reflector 110 can have varying surface angles, for example, a varying curvature along the z-axis of the ring-shaped structure 502, that is to say perpendicular to the main emission direction of the optoelectronic components 104 of the optoelectronic component device.

In other words: the reflector 2202 can have on the reflective surface 112 angles 118 of incidence for provided electromagnetic radiation 102 which can be dependent on the position of the provided beam 102 on the reflective surface 112.

By a deflection 2302 of the reflector 110, it is possible to alter, for example, reflectivity of the reflector 110 with respect to incident electromagnetic radiation 102, for example, the angle 118 of incidence of the incident electromagnetic radiation 102 on the reflective surface 112.

In other words: the ring-shaped structure 502 with optoelectronic components 104 and reflector 110 can be designed to be displaceable, for example, relative to one another along the z-axis, that is to say parallel to the direction perpendicular to the main emission direction of the optoelectronic components 104. Due to a change in the relative position, for example, by displacement of the ring-shaped structure 502 with respect to the reflector 110 or by a reflector 110 movable with respect to the ring-shaped structure 502, a different emission profile can be set depending on the position, that is to say depending on the relative position of the reflector 110. By way of example, it is possible to switch between a narrow, spot-like emission profile and a wide emission profile, for example, of surface lighting.

As a result, it is possible to set, for example, the emission characteristic of the deflected electromagnetic radiation 114, 2204, 2206 in the optoelectronic component device 100.

The reflector 110 can be shaped arbitrarily in the other spatial directions, for example, rotationally symmetrically, mirror-symmetrically or asymmetrically.

Figure 24:
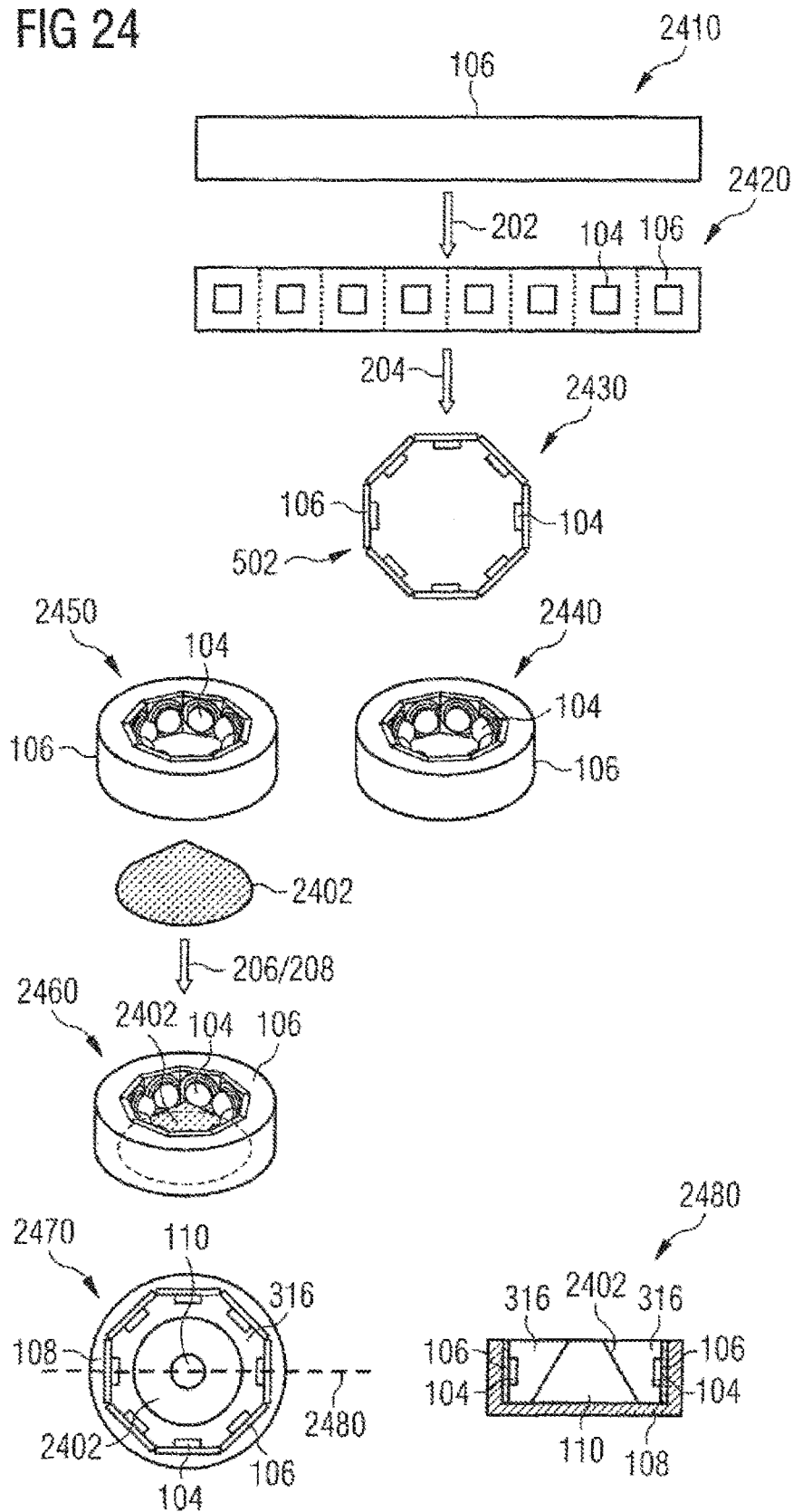
FIG. 24 shows an optoelectronic component device in accordance with various configurations.

FIG. 24 shows an optoelectronic component device in accordance with various configurations.

The views 2410, 2420, 2430, 2440, 2450, 2460, 2470, 2480 illustrate an optoelectronic component device 100 in the method 200 of producing an optoelectronic component device 100.

In addition to or instead of the configuration of the optoelectronic component device 100 from the descriptions of FIGS. 1 to 23, the reflective surface 112 of the reflector 110 can have a wavelength-converting structure 2402, for example, a luminophore layer 2402, or can be formed, for example, deposited, thereon.

The reflector 110 can be coated with a phosphor layer 2402, for example.

The optoelectronic components 104 can be formed as InGaN-LED without a wavelength-converting structure and the wavelength-converting structure 2402 on or above the reflector 110 can be designed as remote phosphor.

The wavelength conversion of the electromagnetic radiation can then take place on the reflective surface 112 of the reflector 110.

By a remote phosphor on or above the reflector 110, a higher efficiency of the optoelectronic component device 100 can be achieved since the reflector 110 can be cooled separately, for example, in a manner similar or identical to a configuration in FIG. 18.

Figure 25:
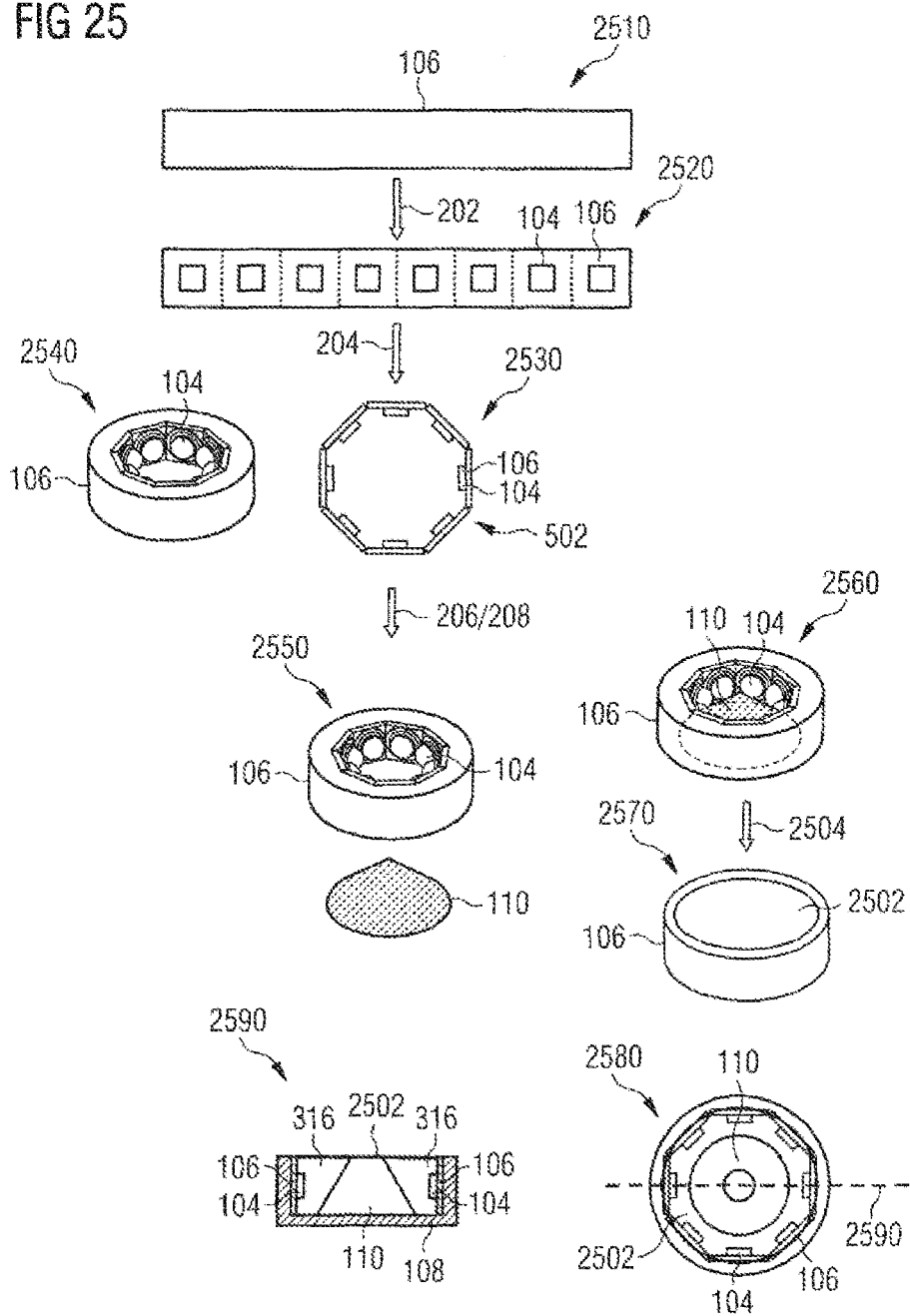
FIG. 25 shows an optoelectronic component device in accordance with various configurations.

FIG. 25 shows an optoelectronic component device in accordance with various configurations.

The views 2510, 2520, 2530, 2540, 2550, 2560, 2570, 2580, 2590 illustrate an optoelectronic component device 100 in the method 200 of producing an optoelectronic component device 100.

In addition to or instead of the configuration of the optoelectronic component device 100 from the descriptions of FIGS. 1 to 24, the optoelectronic component device 100 can have or be formed as a wavelength-converting structure 2502 in the beam path of the electromagnetic radiation of the optoelectronic components 104.

The wavelength-converting structure 2502 can be designed for at least one range of the provided electromagnetic radiation 102, for example, as a luminophore lamina, a glass carrier having a layer composed of a wavelength-converting substance or substance mixture or, for example, as a wavelength-converting film. The wavelength-converting film can be designed, for example, as a translucent plastic film comprising a luminophore layer.

Forming 2504 or arranging 2504 the wavelength-converting structure 2502 in the beam path of the electromagnetic radiation of the at least one optoelectronic component 104 can be carried out, for example, before arranging 206 the first substrate 106 on or above a second substrate 108 or after arranging 208 the reflector 110 in the beam path of the electromagnetic radiation of the at least one optoelectronic component 104.

The optoelectronic components 104 can be formed as blue LED 104 and/or red LED 104 without wavelength-converting structures.

The electromagnetic radiation wavelength-converted by the wavelength-converting structure 2502, for example, green light can be mixed with the unconverted light of the red LED 104 and/or of the blue LED 104.

In other words: the wavelength-converting structure 2502 in the beam path of the electromagnetic radiation of the optoelectronic components 104 can be designed as remote phosphor. The wavelength conversion of the provided electromagnetic radiation 102 can take place in the beam path of the electromagnetic radiation of the at least one optoelectronic component 104.

By arranging 2504 the wavelength-converting structure 2502 in the beam path of the electromagnetic radiation of the at least one optoelectronic component 104, it is possible to achieve a higher efficiency of the optoelectronic component device 100 since the wavelength-converting structure 2502 can be cooled separately.

In addition, the wavelength-converting structure 2502 can be designed as a cover 2502, for example, as part of an encapsulation of the optoelectronic component device 100.

The wavelength-converting structure 2502 can be designed identically to or differently than a further wavelength-converting structure of the optoelectronic component device, for example, of the optoelectronic component, for example, with an LED chip and converter element or wavelength-converting reflector 2402 of the configuration in FIG. 24.

Figure 26:
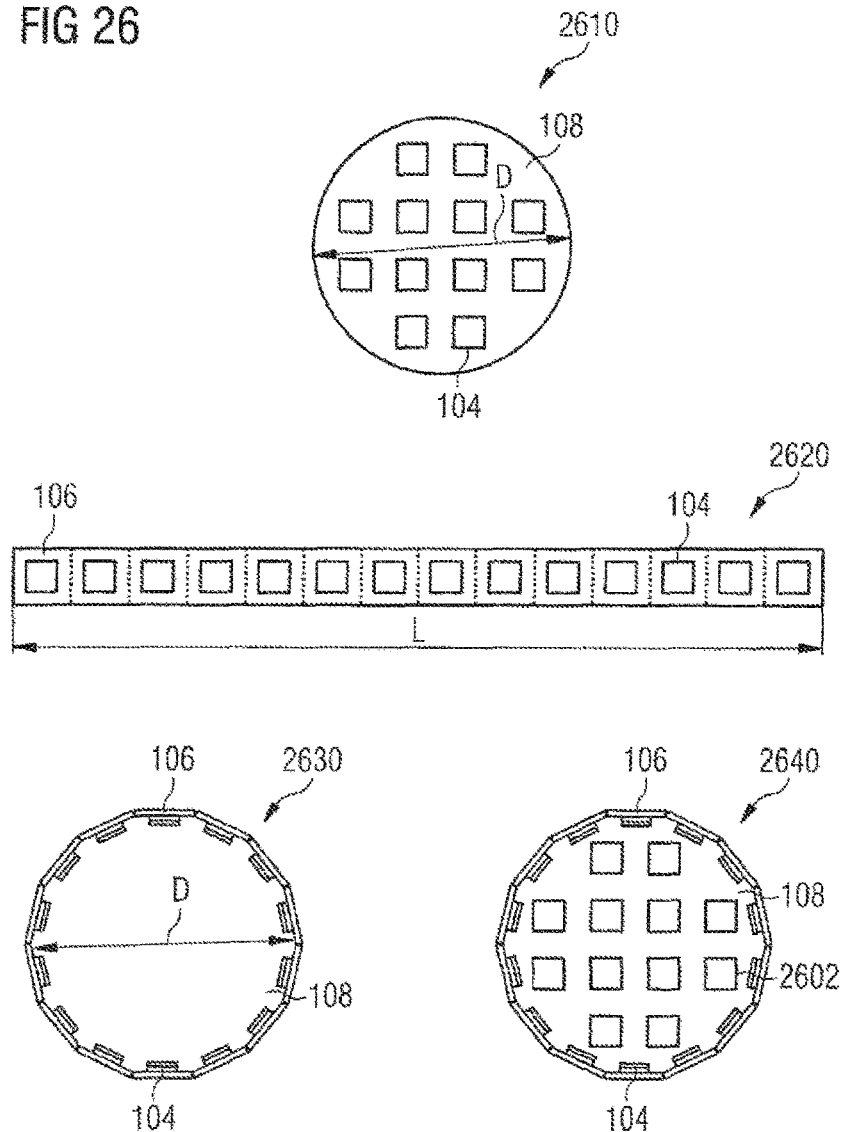
FIG. 26 shows an illustration of increasing the radiance of an optoelectronic component device in accordance with various configurations.

FIG. 26 shows an illustration that increases the radiance of an optoelectronic component device in accordance with various configurations.

View 2610 illustrates a conventional optoelectronic component device.

The views 2620, 2630, 2640 illustrate an optoelectronic component device 100 in accordance with various configurations from the descriptions of FIGS. 1 to 25.

In a conventional optoelectronic component device, a specific number of optoelectronic components 104, for example, 12 optoelectronic components (illustrated) can be arranged on a substrate 108 having a diameter D, depending on D.

The circumference of a, for example, circular, substrate 108 with optoelectronic components can correspond to approximately 28 mm given a diameter D of 9 mm, for example.

In an optoelectronic component device 100, 14 optoelectronic components 104 can be arranged, for example, on a linear first substrate 106 having a length L of approximately 28 mm.

After folding 206 the linear, first substrate 106 having the length L, it is possible to form a ring-shaped structure 502 which can have approximately the same diameter D as a conventional optoelectronic component device—illustrated in the view 2610.

In other words: given identical lateral dimensions of the optoelectronic component device, it is possible to arrange a larger number of optoelectronic components 104 in the optoelectronic component device in accordance with various configurations.

In one example of the optoelectronic component device 100, similar or identical to one of the examples from the descriptions of FIGS. 1 to 25, further optoelectronic components 2602 can additionally be arranged in the optoelectronic component device 100 on or above the second substrate 108, for example, the base of the ring-shaped structure

502. As a result, the number of optoelectronic components 104, 2602 in the optoelectronic component device 100 can be additionally increased.

As a result, the radiance of the optoelectronic component device 100 in accordance with various configurations, can be increased.

At least one reflector 110 can be arranged on or above the further optoelectronic components 2602 and/or between the further optoelectronic components 2602.

A reflector 110 in the beam path of the electromagnetic radiation of the optoelectronic components 104 can be formed, for example, such that it is semitransparent for the provided electromagnetic radiation 102, for example, in a manner similar or identical to a reflector 110 of the configuration in FIG. 21.

The additional optoelectronic components 2602 can have a design identical to or different than the optoelectronic components 104 on the first substrate 106.

FIG. 27 shows an illustration to reduce the dimensioning of an optoelectronic component device in accordance with various configurations.

View 2710 illustrates a conventional optoelectronic component device.

View 2720 illustrates an optoelectronic component device 100, in accordance with various configurations from the descriptions of FIGS. 1 to 26.

In a conventional optoelectronic component device, similar or identical to the configuration in the view 2610 in FIG. 26, the optoelectronic component device can have a structural height H of 12 mm, for example, by the dimensioning of a conventional reflector 2702.

In our optoelectronic component devices 100, a conventional reflector 2702 can be optional.

In other words: the height of the optoelectronic component device can be reduced approximately by the height of a conventional reflector 2702.

The optoelectronic component device 100 can thereby be formed in a manner thinner than in a conventional optoelectronic component device, for example, with a height H of approximately 5 mm.

Figure 28:
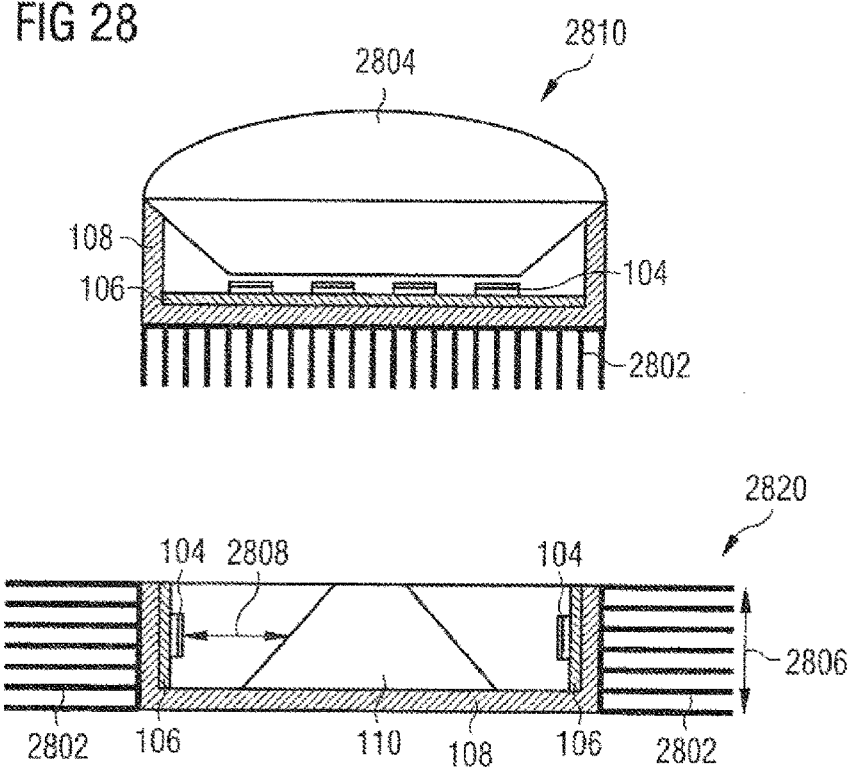
FIG. 28 shows an optoelectronic component device in accordance with various configurations.

FIG. 28 shows an optoelectronic component device in accordance with various configurations.

View 2810 illustrates a conventional optoelectronic component device.

A conventional optoelectronic component device can comprise a heat sink 2802 that dissipates the waste heat from the optoelectronic component device, wherein the heat sink 2802 is often fitted to the underside of the housing 108.

Furthermore, a conventional optoelectronic component device can comprise an optical unit 2804, for example, a lens system 2804, in the beam path of the electromagnetic radiation of the optoelectronic components 104.

View 2820 illustrates an optoelectronic component device 100, in accordance with various configurations from the descriptions of FIGS. 1 to 27.

The at least one heat sink 2802 can be arranged laterally with respect to the optoelectronic component device 100, for example, for the purpose of dissipating heat from the optoelectronic components in accordance with the ring-shaped arrangement 502 of the optoelectronic components.

The heat sink 2802 can be in physical contact with the side walls of the housing 108, for example, can be cohesively connected, for example, adhesively bonded to the side walls.

The housing can constitute a thermal bridge between the optoelectronic component and the heat sink 2302.

By dimensioning the heat sink 2302, for example, the surface area of the heat sink 2302, and the physical properties of the heat sink 2302, for example, the thermal conductivity, it is possible to set the emission of the waste heat from the optoelectronic component device 100, for example, from the optoelectronic component 104 and/or a wavelength-converting element 2402, 2502, for example, a luminophore layer, for example, a remote phosphor.

The provided electromagnetic radiation 102 can be shaped by a reflector 110 similar or identical to one of the configurations from the description of FIG. 18 in a similar way to or in the same way as by the optical unit 2804 in a conventional optoelectronic component device.

The optical unit 2804 used in the conventional optoelectronic component device can therefore be optional in the optoelectronic component device.

A smaller structural height of the optoelectronic component device and/or a greater distance between an optoelectronic component 104, for example, an LED chip 104, and the optical unit, for example, the reflector 110 can be realized as a result.

Figure 29:
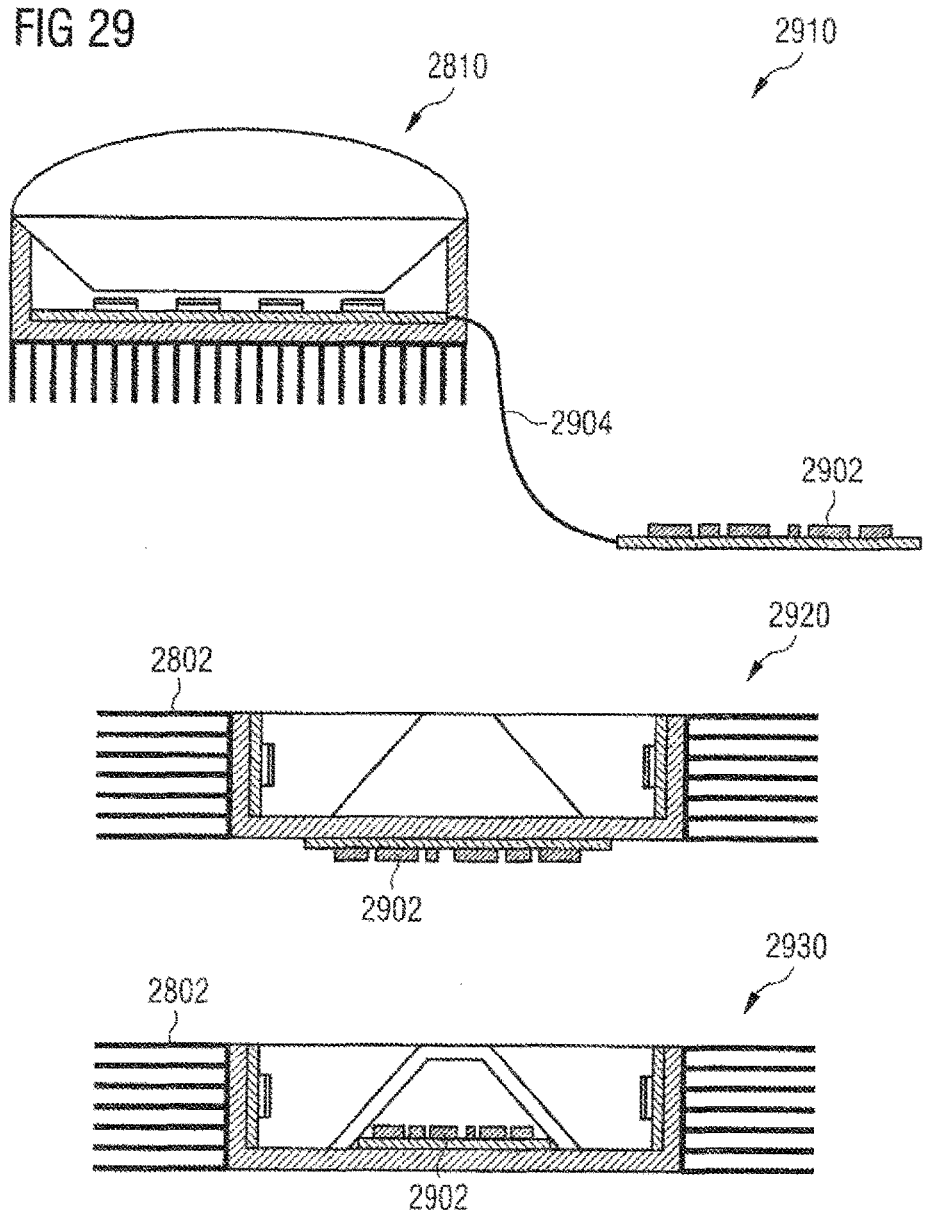
FIG. 29 shows various configurations of arranging electronic components of the optoelectronic component device in the optoelectronic component device in accordance with various configurations.

FIG. 29 shows various configurations of arranging electronic components of the optoelectronic component device in the optoelectronic component device in accordance with various configurations.

View 2910 illustrates a conventional optoelectronic component device 2810 comprising electronic components 2902.

In a conventional optoelectronic component device, the electronic components 2902 that control the optoelectronic components 104 are arranged outside the component device 2810 and connect to the optoelectronic component(s) 104 by an electrical connection 2904.

Views 2920, 2930 illustrate optoelectronic component devices 100, in accordance with various configurations from the descriptions of FIGS. 1 to 28.

Optoelectronic components 104 on a first substrate 106 with a second substrate 108 and a reflector 110 are illustrated schematically in the illustrated configuration 2920, 2930. The second substrate 108 can be designed as a housing 108.

Two optoelectronic components can be discerned in the cross-sectional view, wherein the two optoelectronic components 104 concentrically surround the reflector 110. The reflector 110 can be designed as a truncated cone or a prism, wherein the reflector 110 can have a reflective surface 112 in the beam path of the electromagnetic radiation of the optoelectronic components 104.

With regard to the specifications of the optoelectronic components 104, of the first substrate 106, of the second substrate 108, of the reflector 110 and of the heat sink 2902, reference should be made to the configurations from the descriptions of FIGS. 1 to 28.

The optoelectronic component device 100 can comprise electronic components 2902 that control the optoelectronic properties of the optoelectronic component device 100, for example, to control optoelectronic components 104 and/or at least one reflector 110 having a variable reflectivity, for example, a deflection of the reflector 110 of the first substrate 106 or of an optoelectronic component.

The electronic components 2902 can be applied, for example, on or over the underside of the second substrate 108, for example, of the housing 108—illustrated in the schematic cross-sectional view 2920.

The electronic components 2902 can be applied on or above the top side (optically active side of the optoelectronic component device) of the second substrate 108—illustrated in the schematic cross-sectional view 2930.

The reflector 110 can have a cavity, for example. The electronic components 2902 can be arranged, for example, in a cavity of the reflector 110.

In other words: in the optoelectronic component device 100 comprising electronic components 2902 the electronic components 2902 can be integrated in the optoelectronic component device 100. A compact design of the optoelectronic component device 100 can be formed as a result.

The electronic components 2902 can electrically connect to the optoelectronic components 104 by conventional methods, for example, by vias, conductor tracks or the like.

FIG. 30 shows an optoelectronic component device in accordance with various configurations.

The views 3010, 3020 illustrate a concrete configuration of an optoelectronic component device 100 in accordance with various configurations.

The views 3030, 3040, 3050 illustrate the emission characteristics of the electromagnetic radiation field of an optoelectronic component device 100 from the schematic views 3010, 3020.

The optoelectronic component device can comprise, for example, 8 light emitting diodes 104, for example, InGaAlP diodes of conventional design which can be arranged concentrically around a convex reflector 110.

The internal diameter of the ring-shaped structure 502 can have, for example, an internal diameter of approximately 9 mm.

The reflector 110 can be produced, for example, milled, from aluminum, for example.

The reflector 110 can be formed, for example, such that the radiation field of the electromagnetic radiation of the optoelectronic component device 100 has a homogeneous radiation field in the near field 3030 and in the far field 3040, 3050.

Photographic images of the radiation fields are illustrated in the views 3030, 3040.

The width of the illustrated view 3030 of the far field is approximately 6 m.

The view 3050 illustrates a radiation field of the optoelectronic component device from the views 3010, 3020. The radiation field was measured at a distance of approximately 2 m from the optoelectronic component device.

The illustration shows the intensity 3014 of the radiation field as a function of the observation angle 3012 with respect to the direction 3002, 3004, 3006 of the optoelectronic component device.

Figure 31:
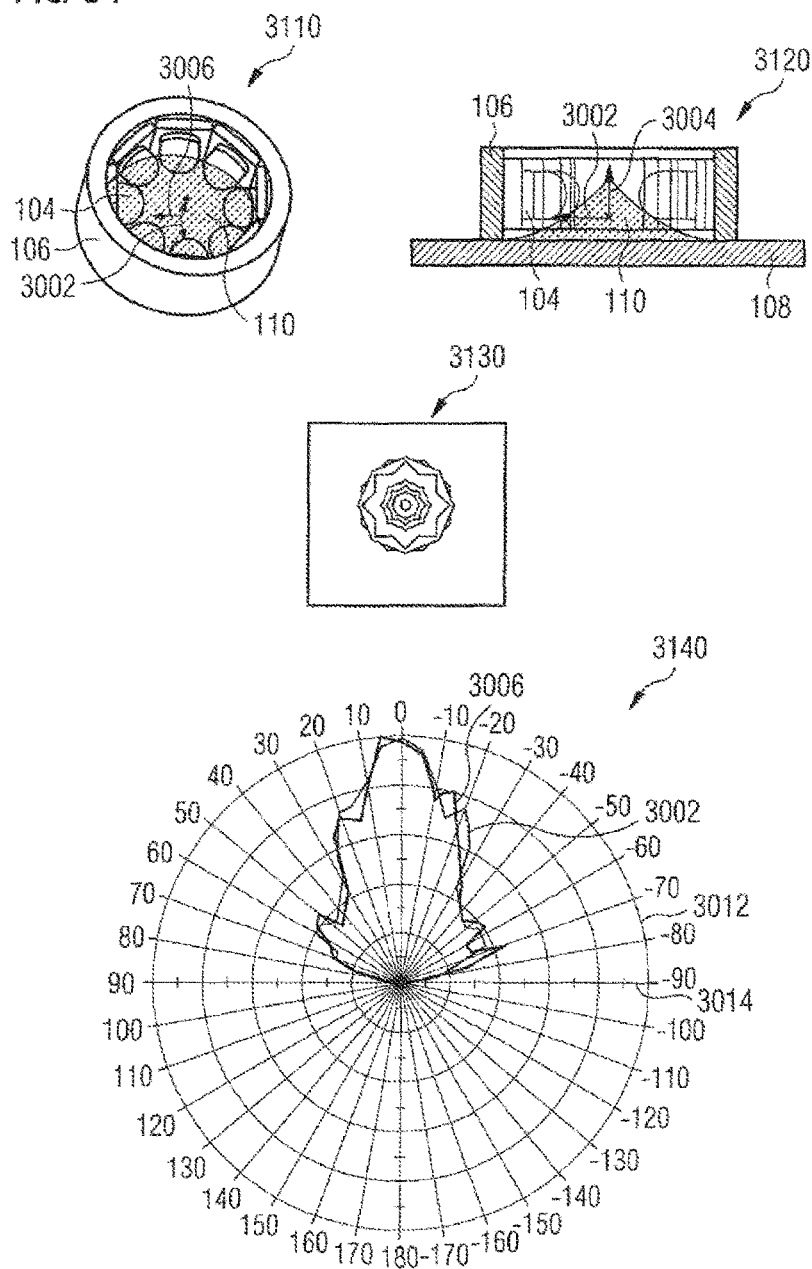
FIG. 31 shows an optoelectronic component device in accordance with various configurations.

FIG. 31 shows an optoelectronic component device in accordance with various configurations.

The views 3110, 3120 illustrate a concrete configuration of an optoelectronic component device 100 in accordance with various configurations.

The views 3130, 3140 illustrate the emission characteristics of the electromagnetic radiation field of an optoelectronic component device 100 from the views 3110, 3120.

The optoelectronic component device 100 can comprise, for example, 8 light emitting diodes 104, for example, InGaAlP diodes of conventional design, for example, OSLON 80° LEDs which can be arranged concentrically around a concave reflector 110.

The reflector 110 can be produced, for example, milled, from aluminum, for example.

In accordance with the configuration in the views 310, 3120, the near field 3130 of the radiation field of the optoelectronic component device was captured photographically approximately 100 μm above the optoelectronic component device in the beam path of the electromagnetic radiation.

View 3140 illustrates the measured far field of the radiation field of the optoelectronic component device 100 in accordance with the configuration in the views 310, 3120.

Figure 32:
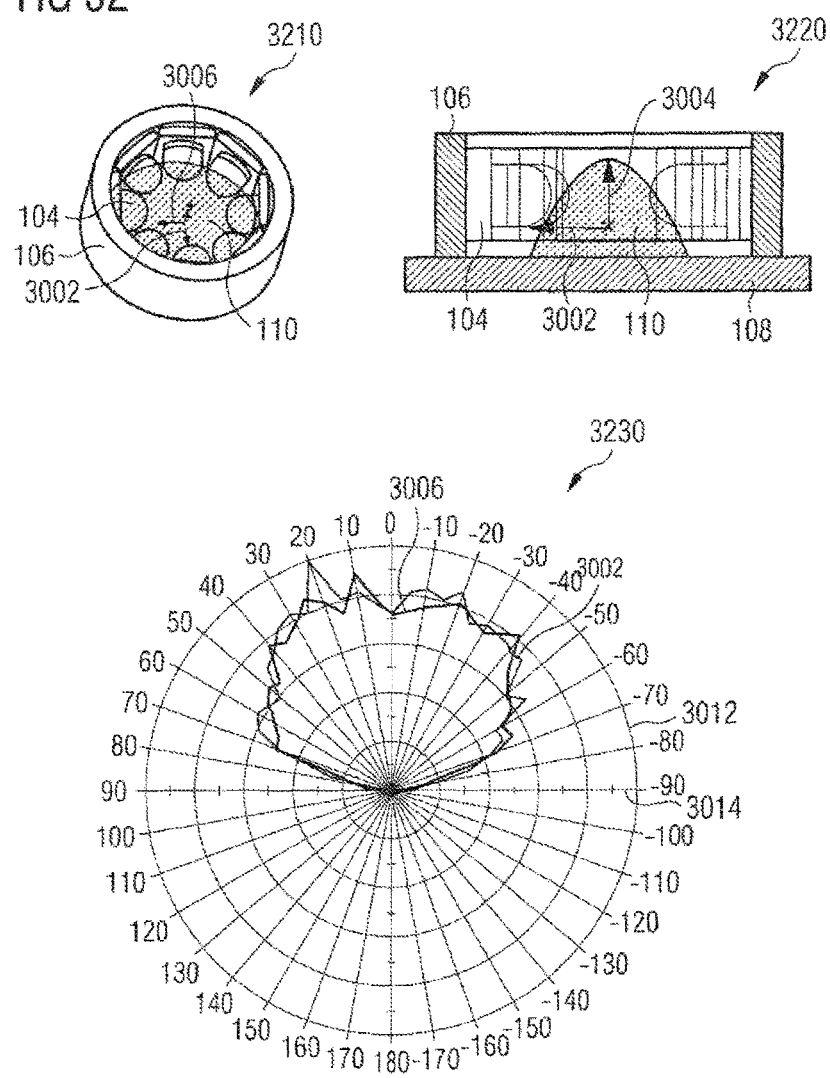
FIG. 32 shows an optoelectronic component device in accordance with various configurations.

FIG. 32 shows an optoelectronic component device in accordance with various configurations.

The views 3210, 3220 illustrate a concrete configuration of an optoelectronic component device 100 in accordance with various configurations.

The view 3230 illustrates the emission characteristics of the electromagnetic radiation field of the optoelectronic component device 100 from the views 3210, 3220.

The emission characteristic of the radiation field of the optoelectronic component device 100 illustrated in the views 3210, 3220 can be, for example, similar or identical to that of a Lambertian emitter.

The optoelectronic component device can comprise, for example, 8 light emitting diodes 104, for example, InGaAlP diodes of conventional design which can be arranged concentrically around a convex reflector 110.

The internal diameter D of the ring-shaped structures 502 can have, for example, an internal diameter of approximately 9 mm.

The reflector 110 can be produced, for example, milled, from aluminum, for example.

The reflector 110 can be formed, for example, such that the radiation field of the electromagnetic radiation of the optoelectronic component device 100 has a homogeneous radiation field in the far field 3240.

The view 3230 illustrates the intensity 3014 of the radiation field as a function of the observation angle 3012 with respect to the direction 3002, 3004, 3006 of the optoelectronic component device.

Figure 33:
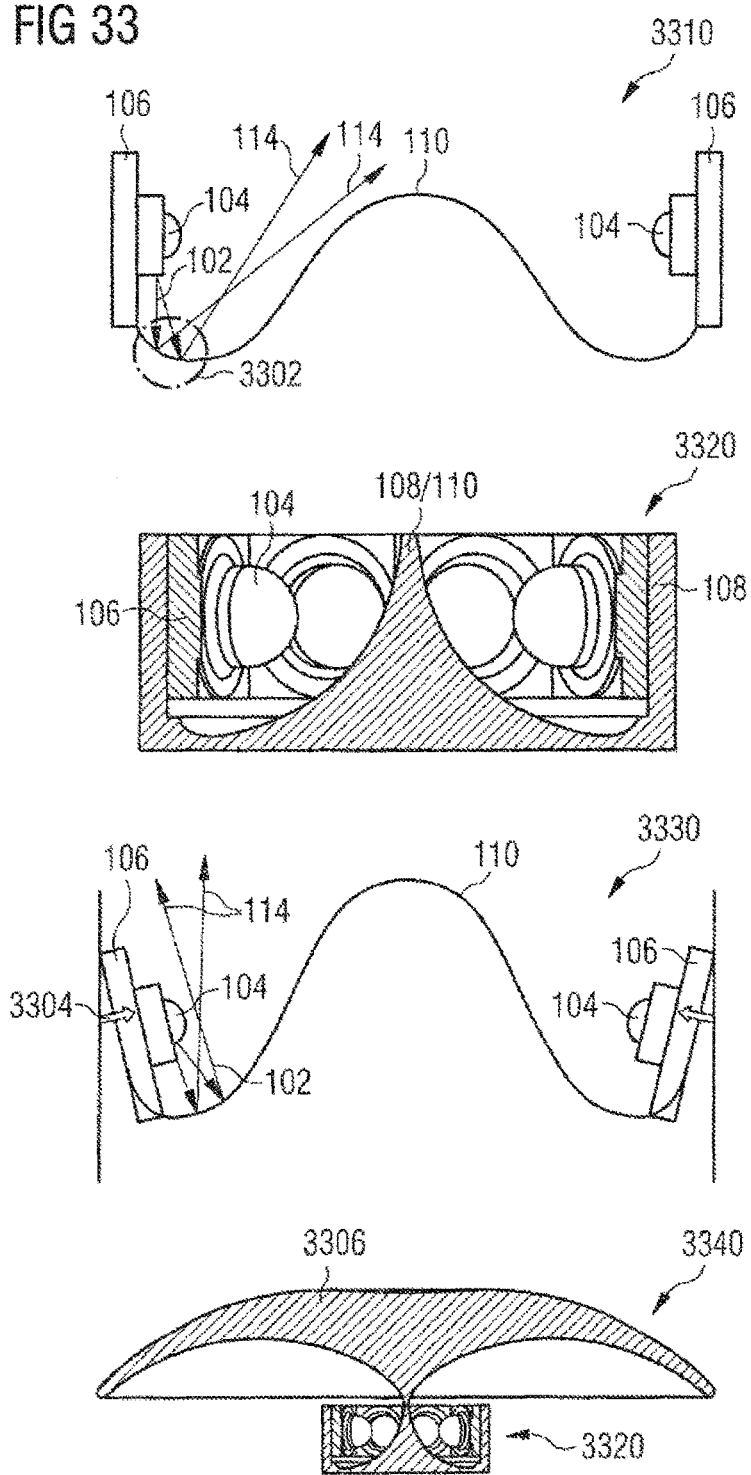
FIG. 33 shows an optoelectronic component device in accordance with various configurations.

FIG. 33 shows an optoelectronic component device in accordance with various configurations.

Concrete configurations of an optoelectronic component device are illustrated schematically in the schematic cross-sectional views in 3310, 3320, 3330, 3340.

In addition to the configuration of the optoelectronic component device 100 from the descriptions of FIGS. 1 to 32, the reflector 100 can be formed such that the electromagnetic radiation provided in the direction of the second substrate 108—highlighted by the marking 3302 in view 3310—is deflected by the reflector (114).

The reflector 110 can be part, for example, a region of the second substrate 108 or of the housing 108.

The view 3320 illustrates a more concrete illustration 3320 of the optoelectronic component device 3310.

To set the angle of incidence in a manner similar or identical to one of the configurations from the descriptions of FIG. 17, the at least one optoelectronic component can be deflected (3304)—illustrated in view 3330. Setting the angle of incidence can also be understood as changing the emission characteristic. By way of example, the loss of provided electromagnetic radiation 102 can be reduced as a result.

A further optical component, for example, a lens 3306 can be arranged in the beam path of the electromagnetic radiation of the at least one optoelectronic component of the optoelectronic component device, for example, of the illustrated optoelectronic component device in the view 3320.

The radiation field of the optoelectronic component device 100 can be expanded by at least one further optical component, for example, the lens 3306 such that, for example, the electromagnetic radiation provided by the optoelectronic component device can be omnidirectionally emitted. In other words: the electromagnetic radiation can be provided in all directions or else, in another configuration, absorbed, from all directions by the optoelectronic component device 100.

By further optical elements or optical components, it is possible to improve the light mixing of the optoelectronic components arranged in a ring-shaped manner in accordance with various configurations. However, losses of efficiency can occur by Fresnel reflections.

Figure 34:
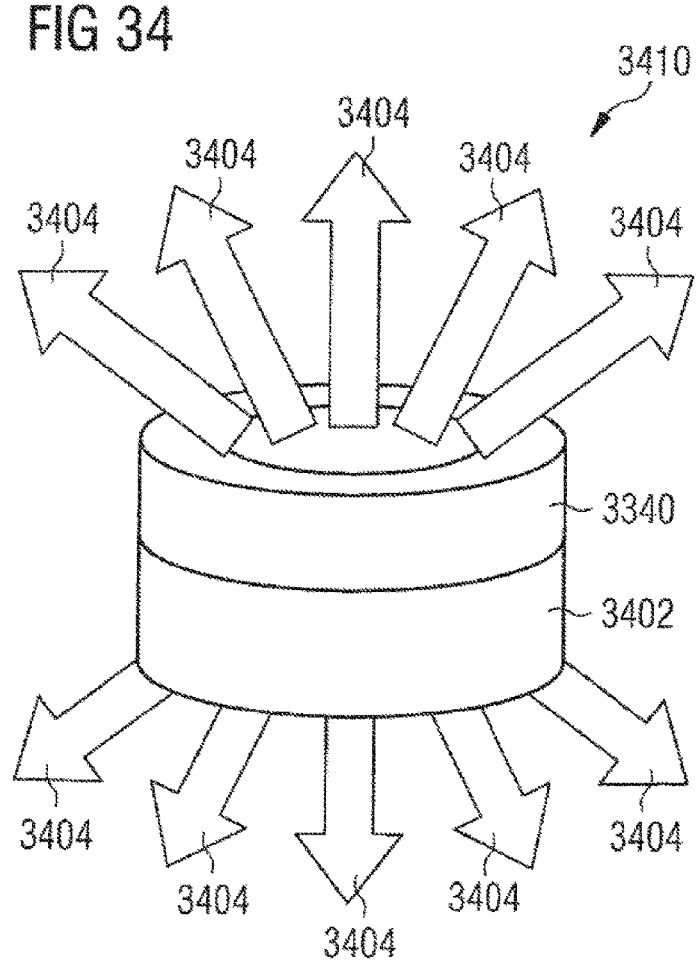
FIG. 34 shows an optoelectronic component device in accordance with various configurations.

FIG. 34 shows an optoelectronic component device in accordance with various configurations.

The illustration shows an optoelectronic component device 100 in accordance with one of the configurations from the description of FIGS. 1 to 33, for example, the configuration from the view 3340 in FIG. 33.

The optoelectronic component device 3340 can be formed in physical contact with a further optoelectronic component device 3402, for example, in a back-to-back arrangement.

In a back-to-back arrangement of the optoelectronic component devices, it is possible to form, for example, an optoelectronic component device 3410 that provides electromagnetic radiation 3404 omnidirectionally, for example, a lighting.

In other words: by a back-to-back arrangement of the optoelectronic component device it is possible to form a lighting which can be used to realize an omnidirectional emission of electromagnetic radiation. The optoelectronic component devices can be arranged such that the provided electromagnetic radiation of the optoelectronic components is provided in different spatial directions.

The optoelectronic component device 3340 and/or the further optoelectronic component device 3402 can be formed similarly or identically to one of the configurations of the optoelectronic components from the descriptions of FIGS. 1 to 33.

The optoelectronic component device 3340 and/or the further optoelectronic component device 3402 can have an identical or different design.

A different design can have, for example, differences in the color valence of provided electromagnetic radiation.

FIG. 35 shows optoelectronic component devices in accordance with various configurations.

The optoelectronic component devices 3510, 3530 can be designed in accordance with configurations from the descriptions of FIGS. 1 to 34.

The schematic views 3510, 3530 illustrate optoelectronic component devices having different diameters D of the ring-shaped structure 502 and/or different numbers of optoelectronic components 104.

By the number of optoelectronic components 104 and/or the shape of the reflector 110, it is possible to set, for example, the form of the radiation field 3520, 3540, for example, of the far field 3520, 3540, of the electromagnetic radiation provided by the optoelectronic component device.

In the first configuration 3510 with radiation field 3520, by way of example, eight optoelectronic components 104 are arranged concentrically around a reflector 110. The ring-shaped structure 502 can have an internal diameter of 9 mm, for example. The optoelectronic components 104 can be designed, for example, as InGaN diode 104, for example, as OSLON SSL. The radiation field 3520 can have, for example, the form similar or identical to a spot, for example, of a collimated beam spot.

In the second configuration 3530 with radiation field 3540, an optoelectronic component device similar to the configuration 3510 is illustrated, wherein, however, 17 optoelectronic components 104, for example, InGaN diodes 104, for example, OSLON SSL 104 are arranged concentrically around the reflector 110.

The reflector 110 in the view 3530 is correspondingly enlarged, that is to say scaled with respect to the reflector 110 of the configuration in the view 3510.

The ring-shaped structure 502 of the configuration in the view 3530 can have an internal diameter of approximately 19 mm.

In the far fields 3520, 3540 of the two configurations in the views 3510, 3520, it can be recognized that the radiation field can be formed differently depending on the configuration of the optoelectronic component device 100.

Figure 36:
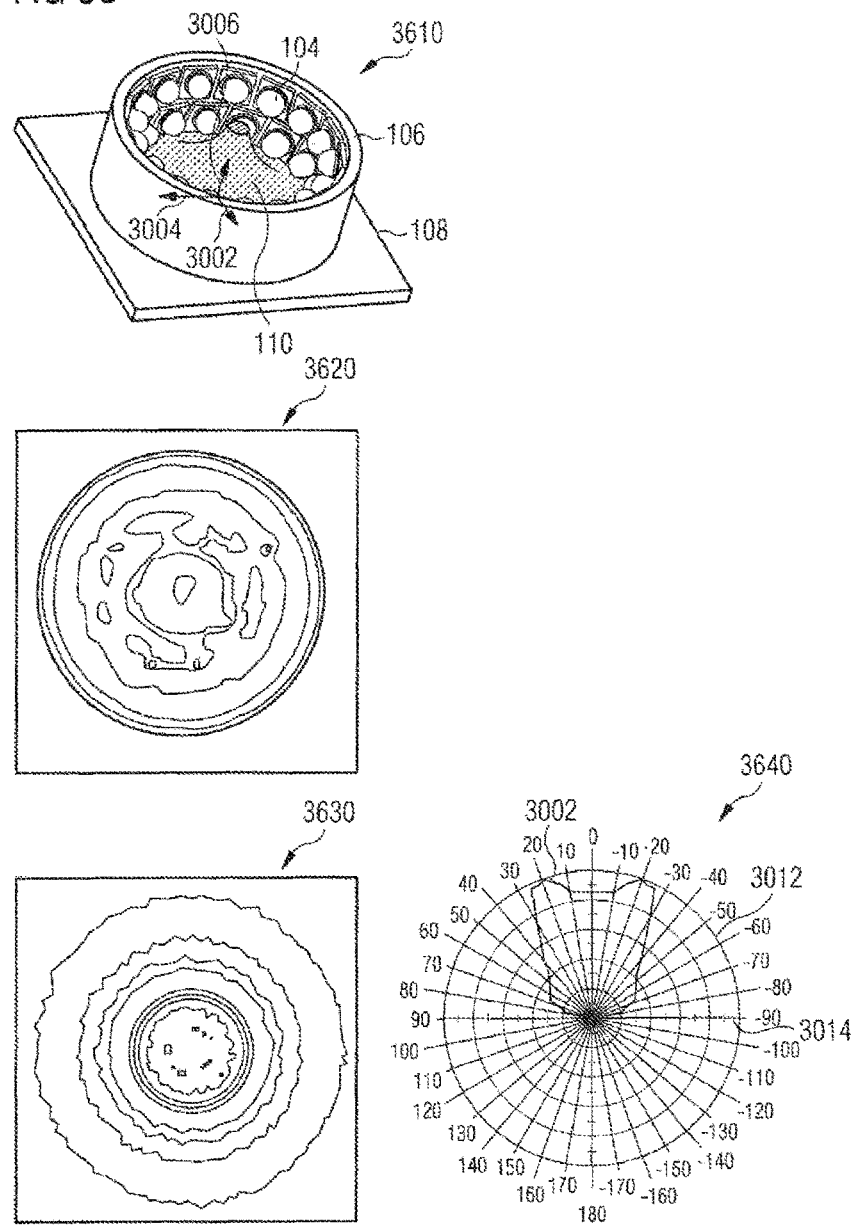
FIG. 36 shows an optoelectronic component device in accordance with various configurations.

FIG. 36 shows an optoelectronic component device in accordance with various configurations.

An optoelectronic component device is illustrated, wherein a plurality of ring-shaped structures 502 with optoelectronic components 104 are arranged one above another, for example, are stacked.

In other words: a plurality of optoelectronic components 104 can be arranged vertically one above another and horizontally alongside one another in the optoelectronic component device 100.

The plurality of optoelectronic components 104 arranged one above another can be arranged alongside one another on a common first substrate 106 before the process of forming 204 a ring-shaped arrangement 502 and/or ring-shaped structure 502 of optoelectronic components 104 of the first substrate 106.

Two or more folded first substrates 106 with optoelectronic components 104 can be arranged one above another, successively.

The plurality of ring-shaped structures can be arranged, for example, concentrically around a common reflector—illustrated in the view 3610.

The plurality of ring-shaped structures can be arranged alongside one another concentrically around the common reflector—illustrated in the view 3110. In other words: the plurality of ring-shaped structures can be arranged one above another.

By a plurality of ring-shaped structures one above another and/or changing the internal diameter of the ring-shaped structure of the optoelectronic component device, it is possible to adapt the field distribution of the electromagnetic radiation of the optoelectronic component device.

The views 3620, 3630, 3640 illustrate the field distribution of electromagnetic radiation of an optoelectronic component device in accordance with the configuration 3610.

The view 3620 illustrates the near field of the configuration of the optoelectronic component device in the view 3610.

The views 3630, 3640 illustrate the far field of the configuration of the optoelectronic component device in the views 3610.

The far field illustrated in the view 3630 has a width of approximately 6 m.

The distribution of the far field of the electromagnetic radiation as measured in view 3640 was determined at a distance of approximately 2 m from the optoelectronic component device.

Figure 37:
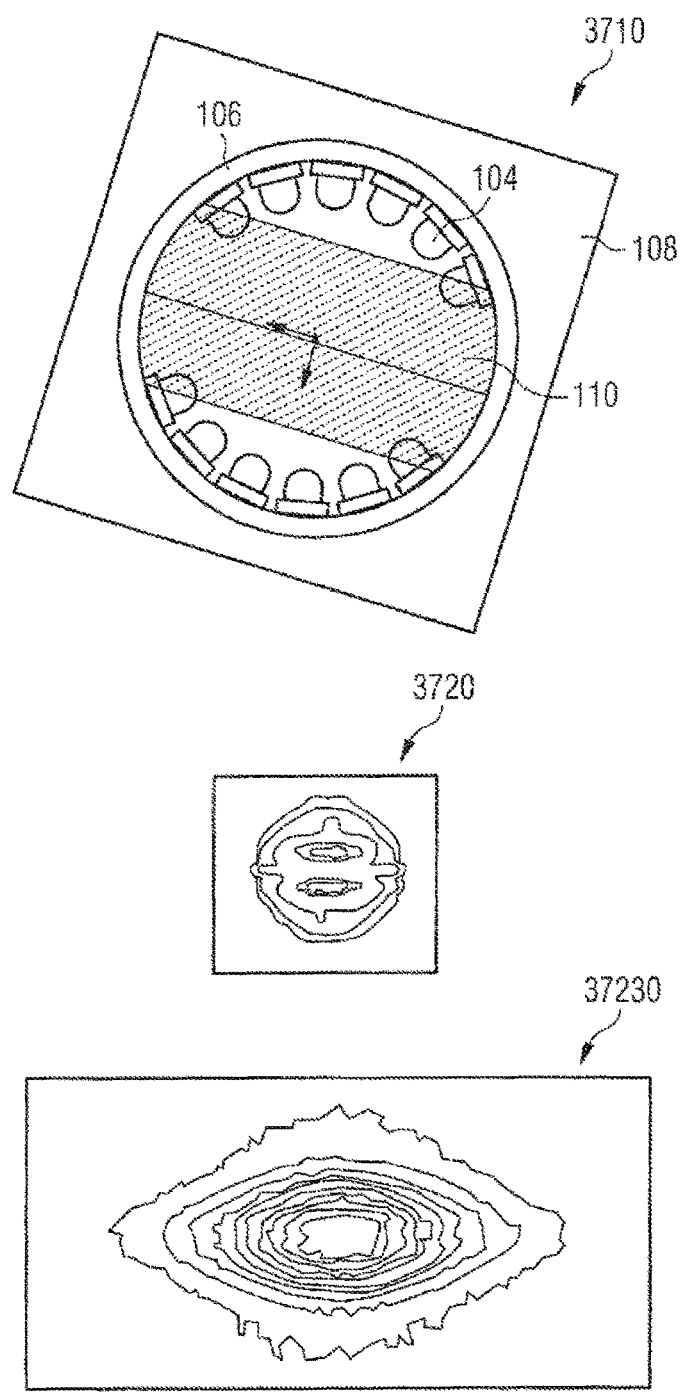
FIG. 37 shows an optoelectronic component device in accordance with various configurations.

FIG. 37 shows an optoelectronic component device in accordance with various configurations.

The view 3710 illustrates a schematic plan view of a concrete optoelectronic component device in accordance with one of the configurations from the description of FIGS. 1 to 36.

The view 3710 reveals 12 optoelectronic components, for example, OSLON LEDs which are arranged around a reflector 110 similar or identical to a prism.

The optoelectronic components can partly or wholly surround a reflector 110, for example, concentrically with respect to an axis 3004 of symmetry of the reflector 110.

Illustrated in view 3710, the optoelectronic component device can be formed such that a reflector 110 is only partly surrounded by optoelectronic components 104, for example, only in individual segments of the ring-shaped structure 502. The reflector 110 can be formed, for example, such that a linear or elliptical illumination cone, or a linear or elliptical emission characteristic or a linear or elliptical illumination pattern, is formed. For this purpose, the reflector 110 can have, for example, an asymmetrical or mirror-symmetrical shape, that is to say can have no rotational symmetry.

The near field 3720 of the electromagnetic radiation—provided by the optoelectronic component device—of the configuration of the optoelectronic component device in the view 3710 is illustrated in the view 3720.

The far field 3730 of the electromagnetic radiation—provided by the optoelectronic component device—of the configuration of the optoelectronic component device in the view 3710 is illustrated in the view 3730.

The illustrated view has a width of approximately 10 m and was measured at a distance of approximately 2 m from the optoelectronic component device.

The near field 3720 and/or the far field 3730 of the electromagnetic radiation provided by the optoelectronic component device, for example, can have a linear and/or elliptical illumination cone—illustrated in the views 3720, 3730.

A linear and/or elliptical illumination can be used, for example, for a planar illumination of a space, for street lighting, for T5/T8 retrofit lighting systems and/or as a headlight, for example, as a low beam, for example, in motor vehicles, for example, automobiles.

FIG. 38 shows an optoelectronic component device in accordance with various configurations.

The view 3810 illustrates a schematic plan view of a concrete optoelectronic component device in accordance with one of the configurations from the description of FIGS. 1 to 37.

The view 3810 reveals 16 optoelectronic components, for example, OSLON 80° LEDs which are arranged around a reflector 110 similar or identical to a prism.

In other words: the optoelectronic component device can be formed such that the optoelectronic components completely surround an asymmetrical or mirror-symmetrical reflector 110. It is thereby possible to form a rectangular illumination cone which can be used for various applications, for example, in general lighting, for example, for a planar illumination of a space, street lighting, high beam of an automobile.

The diameter of the ring-shaped structure 502 can have a value having an absolute value of approximately 19 mm.

The optoelectronic components 104 can partly or wholly surround a reflector 110, for example, concentrically with respect to an axis 3004 of symmetry of the reflector 110.

The near field 3820 of the electromagnetic radiation—provided by the optoelectronic component device 3810—of the configuration of the optoelectronic component device in the view 3810 is illustrated in the view 3820.

The far field 3830 of the electromagnetic radiation—provided by the optoelectronic component device—of the configuration of the optoelectronic component device in the view 3710 is illustrated in the view 3730. The illustrated view has a side of approximately 10 m and was measured at a distance of approximately 2 m from the optoelectronic component device.

The near field 3820 and/or the far field 3830 of the electromagnetic radiation provided by the optoelectronic component device, for example, can have a rectangular and/or elliptical illumination cone—illustrated in the views 3820, 3830.

A rectangular and/or elliptical illumination can be used, for example, for a planar illumination of a space, for street lighting, for T5/T8 retrofit lighting systems and/or as a headlight, for example, as a high beam, for example, in motor vehicles, for example, automobiles.

The concrete configuration of near field 2820 and far field 2830 can be set by the shape of the reflector 110 and the number and arrangement of the optoelectronic components 104.

Figure 39:
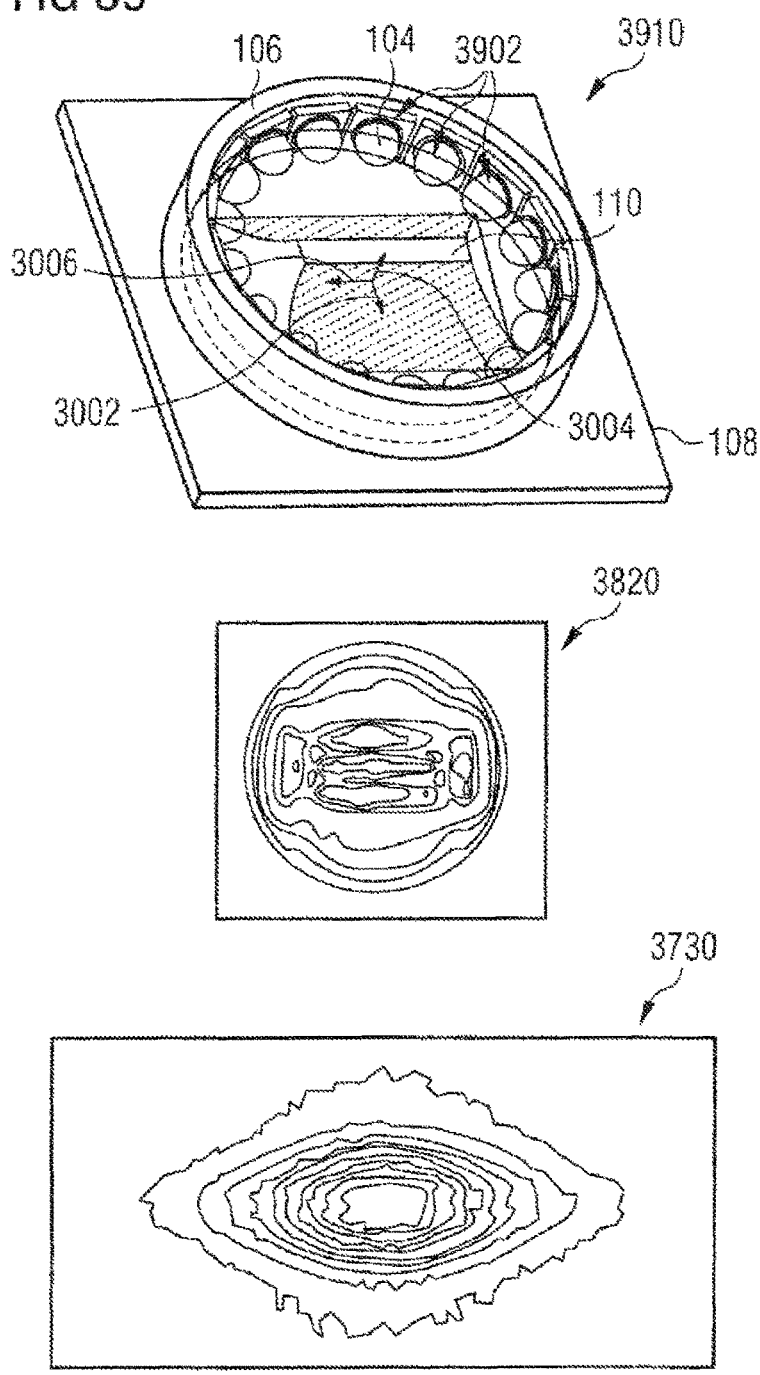
FIG. 39 shows an illustration of operating an optoelectronic component in accordance with various configurations.

FIG. 39 shows an illustration for operating an optoelectronic component in accordance with various configurations.

Optoelectronic components having a variable, i.e. settable, radiation field are illustrated in various configurations from the descriptions of FIGS. 1 to 38.

The view 3910, without restricting generality, illustrates an optoelectronic component device in which individual optoelectronic components 104 can be driven differently, indicated by the arrows 3902.

Individual regions of the optoelectronic component device can be driven singularly, for example, individually in groups, for example, clusters, pixels, and/or in a manner correlated with one another.

As a result, it is possible to set the field distribution of the electromagnetic radiation, for example, the beam profile and/or the intensity of the electromagnetic radiation, of the optoelectronic components during the operation of the optoelectronic component device.

Individual regions can, for example, be driven separately and/or switched on and switched off separately.

The individual regions of the ring-shaped structure 502 can be designed with optoelectronic components which comprise, for example, optoelectronic components of different designs, for example, having different optoelectronic properties, for example, having different color valences.

The optoelectronic components can, for example, be driven individually in a pulsed manner, can, for example, be insulated can, for example, be dimmed by phase gating and/or phase chopping.

The driving of individual regions of the optoelectronic component device can be designed, for example, to switch between different operating modes of the optoelectronic component device, for example, off, daytime running light, low beam or high beam. By way of example, by the driving of individual regions of the optoelectronic component device, it is possible to switch between the illumination cones of the configurations from the description of FIGS. 37 and 38.

The optoelectronic components can, for example, be driven individually in a pulsed manner as a result of which the beam profile and thus the illumination pattern can be set individually and/or continuously variably. Arbitrary intermediate states of the illumination cone and further deviating, for example, asymmetrical illumination cones can also be realized as a result in various configurations.

It is possible to set up the switching between the individual operating modes by a diaphragm in the beam path of the electromagnetic radiation of the optoelectronic components.

By switching between different operating modes of the optoelectronic component device, the far field of the electromagnetic radiation provided by the optoelectronic component device can be altered, for example, —illustrated by the different far fields of an optoelectronic component device in the views 3820, 3730.

Switching between different operating modes of the optoelectronic component device can, for example, by changing the number of optoelectronic components that provide radiation actively.

Figure 40:
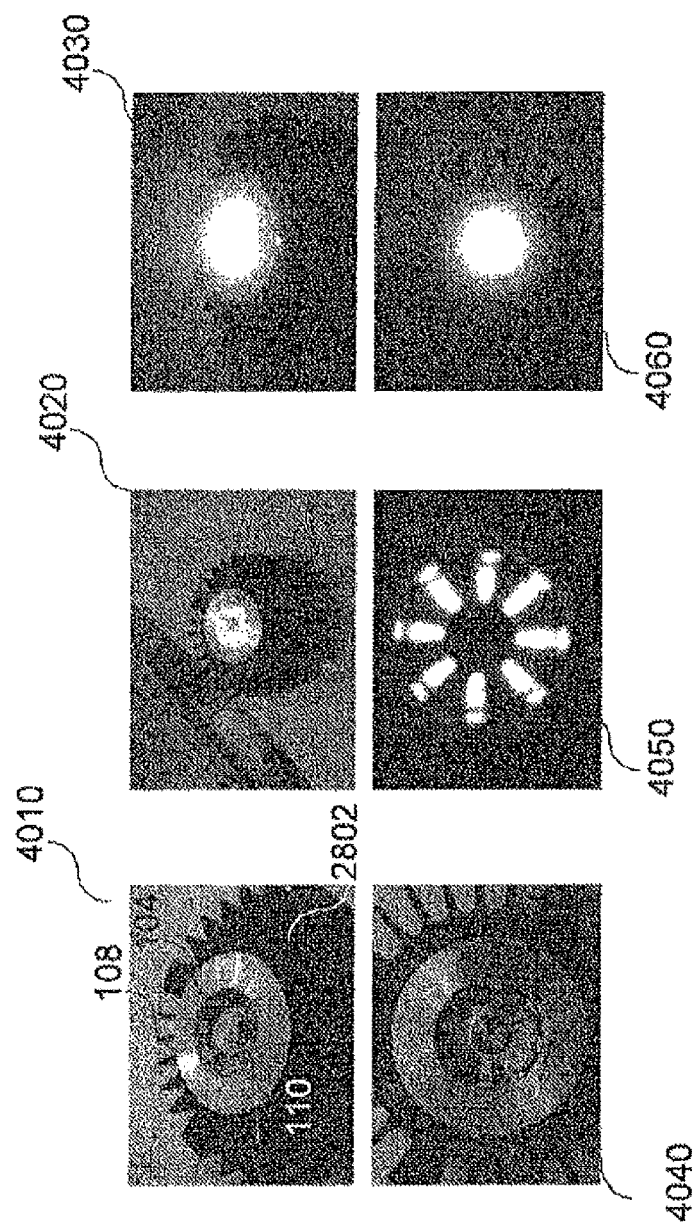
FIG. 40 shows photographic illustrations of a configuration of an optoelectronic component device.

FIG. 40 shows photographic illustrations of a configuration of an optoelectronic component device.

Photographs 4010, 4020, 4030, 4040, 4050, 4060 illustrate views 4010, 4020, 4030, 4040, 4050, 4060 of a configuration of an optoelectronic component device from the perspective of a close plan view for 4010, 4020, 4030 and of a more distant lateral perspective 4040, 4050, 4060.

The configuration reveals a heat sink 2802 arranged laterally with respect to the emission direction and OSLON LEDs 104, which are arranged concentrically around an aluminum reflector 110, wherein the reflector 110 is formed as a part of the housing 108.

The views 4010, 4040 reveal the optoelectronic component device in the switched-off state.

The views 4020, 4050 reveal the optoelectronic component device in a very low operating current of the LEDs.

The views 4030, 4060 reveal the optoelectronic component device under regular operating conditions.

A projection 4002 of the optoelectronic components 104 on the reflector can furthermore be discerned in the switched-off state 4010, 4040 of the optoelectronic component device.

In very low current, the light 102 provided directly by the optoelectronic components and the light 114 deflected by the reflector can be discerned in the lateral perspective 4040.

Under regular operating conditions of the optoelectronic component devices, an illuminated area with homogeneous intensity and homogeneous color valence can be observed in the near field of the provided electromagnetic radiation.

Figure 41:
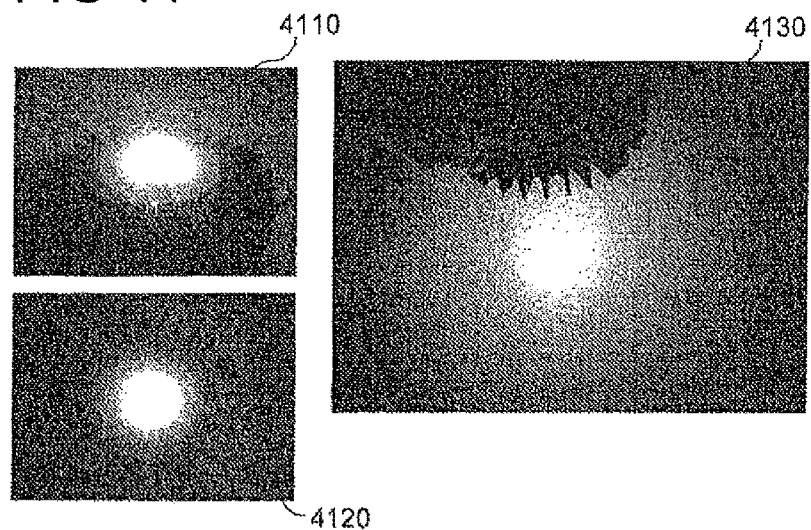
FIG. 41 shows photographic illustrations of a configuration of an optoelectronic component device.

FIG. 41 shows photographic illustrations of a configuration of an optoelectronic component device.

The illustration shows the radiation fields 4110, 4120, 4130 of a configuration of an optoelectronic component device, for example, in accordance with one of the configurations from the description of FIGS. 1 to 40, for example, the configuration in FIG. 40.

The views 4110, 4120 reveal in different perspectives the near field of the electromagnetic radiation provided by the optoelectronic component device.

The view 4130 reveals the far field of the electromagnetic radiation provided by the optoelectronic component device.

The views 4110, 4120, 4130 reveal a very homogeneous light color and an emission characteristic of the provided electromagnetic radiation approximating a Lambertian emitter.

FIG. 42 shows optoelectronic component devices in accordance with various configurations.

The illustration shows different configurations of optoelectronic component devices 4210, 4220, 4230, 4240 comprising differently configured diaphragms 4204, 4204 in the light path of the optoelectronic components 104.

The optoelectronic component device can be designed similarly or identically to one of the configurations from the description of FIGS. 1 to 41. By way of example, the optoelectronic component device comprising diaphragm 4202 in the light path of the optoelectronic components 104 can have differently configured reflectors—illustrated in the views 4210, 4220 for a circular diaphragm 4202 and a rotationally symmetrical reflector 110 (view 4210) and a mirror-symmetrical reflector 110 (illustrated) or asymmetrical reflector 110, for example, similar or identical to a prism (view 4220).

The diaphragm 4202 can have a concentric opening with respect to the ring-shaped structure 502, for example, similar or identical to a pinhole diaphragm and/or a circular diaphragm.

The diaphragm 4202 can have an asymmetrical opening.

The diaphragm 4202 can be arranged only on or above parts of the ring-shaped structure 502 in the light path of at least some of the optoelectronic components.

However, the diaphragm in the light path of the optoelectronic components can, for example, also be designed as a slit diaphragm 4204—illustrated in the views 4230, 4240.

In a non-rotationally symmetrical reflector, the diaphragm 4204 can have an orientation with respect to the reflector 110, i.e. can be non-rotationally invariant.

Orientation of the diaphragm 4204 with respect to the reflector 110 can be used, for example, to change the operating mode of the optoelectronic component device, for example, to change between the operating mode high beam and the operating mode low beam in an optoelectronic component device as lighting in a motor vehicle.

The diaphragm 4202, 4204 in the light path of the optoelectronic components 104 of the optoelectronic component device in accordance with various configurations, on the side facing the reflector 110 (not visible) can, for example, be produced from a highly reflective substance or comprise a highly reflective surface, for example, a totally reflective surface.

The diaphragm, on the side facing the reflector, can have an arbitrarily curved surface of second and/or higher order, for example, to deflect the electromagnetic radiation incident on the diaphragm onto the reflector.

The diaphragms can be used, for example, to reduce the glare effect of the electromagnetic radiation directly provided by the optoelectronic components 104 into the image plane 122.

By masking out or recycling the electromagnetic radiation, that is to say by deflecting the electromagnetic radiation, that is provided and/or absorbed by the optoelectronic components at a large angle, that is to say directly provided electromagnetic radiation, it is possible to improve the color homogeneity of the provided electromagnetic radiation in the image plane 122 of the optoelectronic component device. Furthermore, as a result, it is possible to produce a sharp transition, that is to say, for example, a discontinuous transition between illuminated and non-illuminated areas, for example, a sharp bright/dark boundary in the image plane 122, for example, for low beam in motor vehicles.

Optoelectronic component devices, a method of producing optoelectronic component devices and a method of operating an optoelectronic component device are provided, wherein, in the optoelectronic component device, the optoelectronic components are arranged in a ring-shaped manner such that all the optoelectronic components can provide or absorb electromagnetic radiation laterally toward the center of the ring-shaped structure, for example, in a chip-on-board module as optoelectronic component device comprising LED chips as optoelectronic components which emit light into the center of the ring-shaped structure.

By a reflector in the beam path of the electromagnetic radiation of the optoelectronic components, the reflector being situated in the center of the optoelectronic component device, for example, the provided electromagnetic radiation, for example, light can be reflected once, perpendicularly to the plane of the ring-shaped structure and at the same time can be directed and mixed.

The main emission direction of the optoelectronic component device, for example, of the LED module can therefore be oriented non-perpendicularly to the radiation-providing surface of the optoelectronic component and/or surface of the optoelectronic component that absorbs radiation, for example, the light emitting surface of the LED chips and non-perpendicularly to the fixing surface of the optoelectronic components for example, of the LED chips.

With appropriate configuration of the reflector, for example, with regard to the dielectric properties of the reflector, the optoelectronic component device can be suitable and applicable for the entire wavelength range of the electromagnetic radiation, for example, including that part of the wavelength spectrum of the electromagnetic radiation which is not visible to the human eye, for example, for infrared and/or ultraviolet radiation, for example, by an infrared light emitting diode or an infrared laser.

The use of electromagnetic radiation in the infrared wavelength range can be realized, for example, for applications of the optoelectronic component device in the field of safety technology and/or monitoring technology, for example, to illuminate the surroundings of a camera or of a sensor.

Electromagnetic radiation which is visible and also invisible to the human eye can be mixed by the reflector. That part of the electromagnetic radiation which is not visible to the human eye can be used, for example, for infrared cameras and/or infrared sensors, for example, to illuminate the surroundings.

By the ring-shaped arrangement of the optoelectronic components in conjunction with the reflector, good radiation intermixing, for example, good light intermixing (intensity mixing and color mixing) can be achieved, with at most only little loss of efficiency, with the optoelectronic component device. This can be achieved by the single reflection of the light by the reflector and avoidance of backscattering of the electromagnetic radiation onto the optoelectronic components, for example, LED chips on account of the absence of diffusor material in the beam path of the electromagnetic radiation of the optoelectronic components in the optoelectronic component device.

Since the optoelectronic components, for example, LED chips and the optical unit, for example, the reflector can be packed more densely in lateral and vertical directions of the optoelectronic component device, the optoelectronic component device, with respect to conventional optoelectronic component devices can feature a more compact design given the same radiance, for example, light power and a higher optical power density given the same lateral dimensions of the optoelectronic component device.

In addition, by use of a semipermeable reflector, the base of the ring-shaped structure of the optoelectronic component device can be used for further optoelectronic components, for example, LED chips. It is thereby possible to realize an electromagnetic radiation source, for example, a lighting with high efficiency in conjunction with a compact design.

Beam shaping, optical elements can be dispensed with in the optoelectronic component device.

In association with the material-saving, compact design of the optoelectronic component device, it is possible to form a cost-effective LED light source, for example. The optoelectronic component device, for example, an LED can be scaled in a simple manner, for example, by the diameter of the ring-shaped structure and thus the maximum number of optoelectronic components and/or the number of ring-shaped structures with optoelectronic components arranged one above another.

Furthermore, the ring-shaped design of the optoelectronic component device can afford advantages in heat dissipation, for example, in dissipating waste heat from the optoelectronic components, for example, in arranging a heat sink in the optoelectronic component device. The thermal loading of the optical unit can be reduced by the separation of heat source and optical unit. With the use of a wavelength-converting element, for example, a luminophore layer on or above the reflector, the reflector can be used as an additional heat sink. As a result, the wavelength-converting structure, for example, a luminophore layer, for example, a phosphor layer can be cooled better.

By the separation of radiation source and optical unit (reflector), it is possible to form different emission characteristics of the radiation field, for example, of the light field.

The ring-shaped arrangement of the optoelectronic components, for example, the ring-shaped structure with optoelectronic components can free, for example, open up, the base of the ring-shaped structure of the optoelectronic component device. By the freed base of the optoelectronic component device, electronic components that drive the optoelectronic components can be applied or fitted on the base, for example, the front side and/or rear side of the base. A more compact design of the optoelectronic component device can be realized as a result.

By a back-to-back arrangement of two optoelectronic component device, it is possible to realize an optoelectronic component device having an omnidirectional emission characteristic in a compact design.

The invention claimed is:

1. An optoelectronic component device comprising:
   a plurality of optoelectronic components that provide and/or absorb electromagnetic radiation;
   a reflector arranged in a beam path of the electromagnetic radiation of the plurality of optoelectronic components and which has a surface that is at least partly reflective with respect to the provided electromagnetic radiation;
   wherein the plurality of optoelectronic components at least partly surround the reflector or are at least partly surrounded by the reflector;
   the reflector reflects a provided electromagnetic radiation such that a predefined field distribution of the reflected electromagnetic radiation is formed in the image plane of the optoelectronic component device;
   the optoelectronic component device has an emission characteristic that is a field distribution;
   a configuration of the reflector sets the emission characteristic of the electromagnetic radiation in the image plane of the optoelectronic device, and
   the optoelectronic components provide the electromagnetic radiation and are chip-on-board light emitting diodes.

2. The optoelectronic component device as claimed in claim 1, wherein the optoelectronic components comprise a semiconductor chip or are designed as a semiconductor chip, wherein the semiconductor chip absorbs and/or provides electromagnetic radiation.

3. The optoelectronic component device as claimed in claim 2, wherein the optoelectronic component comprises a light emitting diode or is designed as a light emitting diode.

4. The optoelectronic component device as claimed in claim 1, wherein the plurality of optoelectronic components differ in at least one optoelectronic property selected from color valence and/or intensity of the provided and/or absorbed electromagnetic radiation.

5. The optoelectronic component device as claimed in claim 1, wherein the predefined field distribution comprises homogenizing, changing the color valence and/or forming a predefined shape of the field distribution of the provided electromagnetic radiation in the image plane of the optoelectronic component device.

6. The optoelectronic component device as claimed in claim 1, wherein the optoelectronic component device physically connects to a further optoelectronic component device.

7. The optoelectronic component device as claimed in claim 1, furthermore comprising a housing which at least partly surrounds the plurality of optoelectronic components and the reflector, wherein the reflector is applied on the base of the housing and/or the base of the housing is designed as a reflector.

8. The optoelectronic component device as claimed in claim 6, wherein further optoelectronic components are applied on or above the base of the housing.

9. The optoelectronic component device as claimed in claim 1, wherein the reflector has a cavity with electronic components arranged in the cavity, and the electronic components control the field distribution of the electromagnetic radiation in the image plane of the optoelectronic component device.

10. The optoelectronic component device as claimed in claim 1, wherein one optoelectronic component or a plurality of optoelectronic components comprise a wavelength-converting structure in the beam path of the provided electromagnetic radiation, the wavelength-converting structure being designed as remote phosphor.

11. An optoelectronic component device comprising:
at least one optoelectronic component that provides and/or takes up electromagnetic radiation;
a reflector arranged in a beam path of the electromagnetic radiation of the at least one optoelectronic component and has a surface that is at least partly reflective with respect to the provided electromagnetic radiation;
wherein the reflector has a reflective surface formed in a locally variable fashion;
the optoelectronic component device has an emission characteristic that is a field distribution;
a configuration of the reflector sets the emission characteristic of the electromagnetic radiation in the image plane of the optoelectronic device, and
the optoelectronic components provide the electromagnetic radiation and are chip-on-board light emitting diodes.

12. The optoelectronic component device as claimed in claim 11, further configured to alter the local shape of the reflective surface of the reflector with:
a device that moves the reflector by lifting, lowering and/or rotating the reflector;
a device that alters local angles of incidence which is piezo-operated and/or microelectromechanical, facet-like reflective surface segments; and/or
a reflector composed of an elastic substance and a device that elastically changes the shape of the reflector which is a mechanical spring and/or a device that changes the tensile force and/or the compressive force on a reflector and/or a device that changes pressure in the reflector.

13. A method of producing an optoelectronic component device comprising:
forming an arrangement comprising a plurality of optoelectronic components and a reflector such that the optoelectronic components at least partly surround the reflector;
wherein the plurality of optoelectronic components provide and/or take up electromagnetic radiation;
the reflector is arranged in the beam path of the electromagnetic radiation of the optoelectronic components,
the reflector has a surface at least partly reflective with respect to the provided electromagnetic radiation;
the reflector and/or the optoelectronic components are/is arranged for indirect illumination of the image plane of the optoelectronic component device;
the optoelectronic component device has an emission characteristic that is a field distribution;
a configuration of the reflector sets the emission characteristic of the electromagnetic radiation in the image plane of the optoelectronic device, and
the optoelectronic components provide the electromagnetic radiation and are chip-on-board light emitting diodes.

14. The method as claimed in claim 13, wherein an optoelectronic component comprises a semiconductor chip or is formed as a semiconductor chip, and the semiconductor chip absorbs and/or provides electromagnetic radiation.

15. The method as claimed in claim 13, wherein forming an arrangement comprises applying or forming a plurality of optoelectronic components on or above a substrate, and the substrate is mechanically flexible, wherein forming an arrangement comprises at least one process with respect to the substrate selected from: bending; folding; rolling; curving; setting up; and erecting.

16. A method of operating an optoelectronic component device comprising:
providing a field distribution of electromagnetic radiation in an image plane of an optoelectronic component device, wherein the field distribution of electromagnetic radiation is provided and/or absorbed by a plurality of optoelectronic components of the optoelectronic component device, and
changing the field distribution of the electromagnetic radiation in the image plane of the optoelectronic component device,
wherein 1) a reflector having a variable shape is formed in the component device in the beam path of the electromagnetic radiation of the optoelectronic component,
2) the step of changing the field distribution comprises altering an angle of incidence of the electromagnetic radiation relative to the reflective surface of the reflector,
3) the step of changing the angle of incidence is formed by changing the shape of the reflective surface of the reflector,
4) the optoelectronic component device has an emission characteristic that is a field distribution;
5) a configuration of the reflector sets the emission characteristic of the electromagnetic radiation in the image plane of the optoelectronic device, and
6) the optoelectronic components provide the electromagnetic radiation and are chip-on-board light emitting diodes.

17. The method as claimed in claim 16, further comprising a step of changing optoelectronic properties of the electromagnetic radiation in the image plane of the optoelectronic component device is formed by differently driving the plurality of, different, optoelectronic components.

* * * * *